(12) United States Patent
Tanaka et al.

(10) Patent No.: US 7,310,270 B2
(45) Date of Patent: Dec. 18, 2007

(54) NONVOLATILE SEMICONDUCTOR MEMORY DEVICE

(75) Inventors: Tomoharu Tanaka, Yokohama (JP); Hiroshi Nakamura, Kawasaki (JP); Ken Takeuchi, Tokyo (JP); Riichiro Shirota, Fujisawa (JP); Fumitaka Arai, Kawasaki (JP); Susumu Fujimura, Kawasaki (JP)

(73) Assignee: Kabushiki Kaisha Toshiba, Kawasaki-shi (JP)

( * ) Notice: Subject to any disclaimer, the term of this patent is extended or adjusted under 35 U.S.C. 154(b) by 0 days.

(21) Appl. No.: 11/737,154

(22) Filed: Apr. 19, 2007

(65) Prior Publication Data

US 2007/0189070 A1    Aug. 16, 2007

Related U.S. Application Data

(60) Continuation of application No. 11/194,799, filed on Aug. 2, 2005, now Pat. No. 7,224,612, which is a continuation of application No. 10/920,161, filed on Aug. 18, 2004, now Pat. No. 6,940,752, which is a continuation of application No. 10/377,674, filed on Mar. 4, 2003, now Pat. No. 6,798,698, which is a continuation of application No. 10/187,285, filed on Jul. 2, 2002, now Pat. No. 6,549,464, which is a continuation of application No. 09/767,152, filed on Jan. 23, 2001, now Pat. No. 6,434,055, which is a division of application No. 09/599,397, filed on Jun. 22, 2000, now Pat. No. 6,208,560, which is a division of application No. 09/078,137, filed on May 14, 1998, now Pat. No. 6,134,140.

(30) Foreign Application Priority Data

| May 14, 1997 | (JP) | 09-124493 |
| Aug. 21, 1997 | (JP) | 09-224922 |
| Dec. 11, 1997 | (JP) | 09-340971 |
| Apr. 15, 1998 | (JP) | 10-104652 |

(51) Int. Cl.
*G11C 16/04*    (2006.01)

(52) U.S. Cl. .............................. 365/185.17; 365/185.29
(58) Field of Classification Search .......... 365/185.17, 365/185.22, 185.29, 149, 205
See application file for complete search history.

(56) References Cited

U.S. PATENT DOCUMENTS 5,172,338 A    12/1992    Mehrotra et al.

(Continued)

FOREIGN PATENT DOCUMENTS

JP    60-182162 A    9/1985

(Continued)

OTHER PUBLICATIONS

JP Office Action mailed Jan. 9, 2007, JP Appln. 2003-178556.

(Continued)

*Primary Examiner*—Vu A. Le
(74) *Attorney, Agent, or Firm*—Banner & Witcoff, Ltd.

(57) ABSTRACT

A NAND cell unit includes memory cells which are connected in series. An erase operation is effected on all memory cells. Then, a soft-program voltage, which is opposite in polarity to the erase voltage applied in an erase operation, is applied to all memory cells, thereby setting all memory cells out of an over-erased state. Thereafter, a program voltage of 20V is applied to the control gate of a selected memory cell, 0V is applied to the control gates of the two memory cells provided adjacent to the selected memory cell, and 11V is applied to the control gates of the remaining memory cells. Data is thereby programmed into the selected memory cell. The time for which the program voltage is applied to the selected memory cell is adjusted in accordance with the data to be programmed into the selected memory cell. Hence, data "0" can be correctly programmed into the selected memory cell, multi-value data can be read from any selected memory cell at high speed.

10 Claims, 55 Drawing Sheets

U.S. PATENT DOCUMENTS

| | | | |
|---|---|---|---|
| 5,570,315 A | 10/1996 | Tanaka et al. | |
| 5,576,992 A | 11/1996 | Mehrad | |
| 5,627,784 A | 5/1997 | Roohparvar | |
| 5,652,719 A | 7/1997 | Tanaka et al. | |
| 5,673,223 A | 9/1997 | Park | |
| 5,805,501 A | 9/1998 | Shiau et al. | |
| 5,818,764 A * | 10/1998 | Yiu et al. | 365/185.11 |
| 5,870,334 A | 2/1999 | Hemink et al. | |
| 5,909,392 A | 6/1999 | Chang et al. | |
| 5,917,767 A | 6/1999 | Ohta | |

FOREIGN PATENT DOCUMENTS

| | | |
|---|---|---|
| JP | 03-130995 | 6/1991 |
| JP | 05-182482 A | 7/1993 |
| JP | 05-314783 A | 11/1993 |
| JP | 05-334885 A | 12/1993 |
| JP | 06-028875 A | 2/1994 |
| JP | 06-124595 | 5/1994 |
| JP | 06-290591 | 10/1994 |
| JP | 6-291332 A | 10/1994 |
| JP | 07-169286 A | 7/1995 |
| JP | 7-282593 A | 10/1995 |
| JP | 08-007584 | 1/1996 |
| JP | 08-045284 A | 2/1996 |
| JP | 08-063982 | 3/1996 |
| JP | 08-102198 A | 4/1996 |
| JP | 08-106793 A | 4/1996 |
| JP | 08-273382 A | 10/1996 |
| JP | 9-007383 A | 1/1997 |
| JP | 10-241386 A | 9/1998 |

OTHER PUBLICATIONS

JP Office Action mailed Jun. 27, 2006, JP Appln. 2003-178556.

Tae-Sung et al., "A 3.3V 128 Mb Mlti-Level NAND Flash Memory for Mass Storage Applications"; IISSC Digest of Technical Papers; Feb. 1996; pp. 32-33.

Tae-Sung Jung et al., "A 117-mm2 3.3-V Only 128-Mb Multilevel NAND Flash Memory for Mass Storage Applications," IEEE J. Solid-State Circuits, vol. 31, No. 11, Nov. 1996, pp. 1575-1583.

U.S. Appl. No. 08/527,725 (now abandoned), filed Sep. 13, 1995.

\* cited by examiner

Vread=4.5V, Vcgr1=0.0V, Vcgr2=1.1V, Vcgr3=2.3V

Vpgm=16V~20V, Vpass=11V

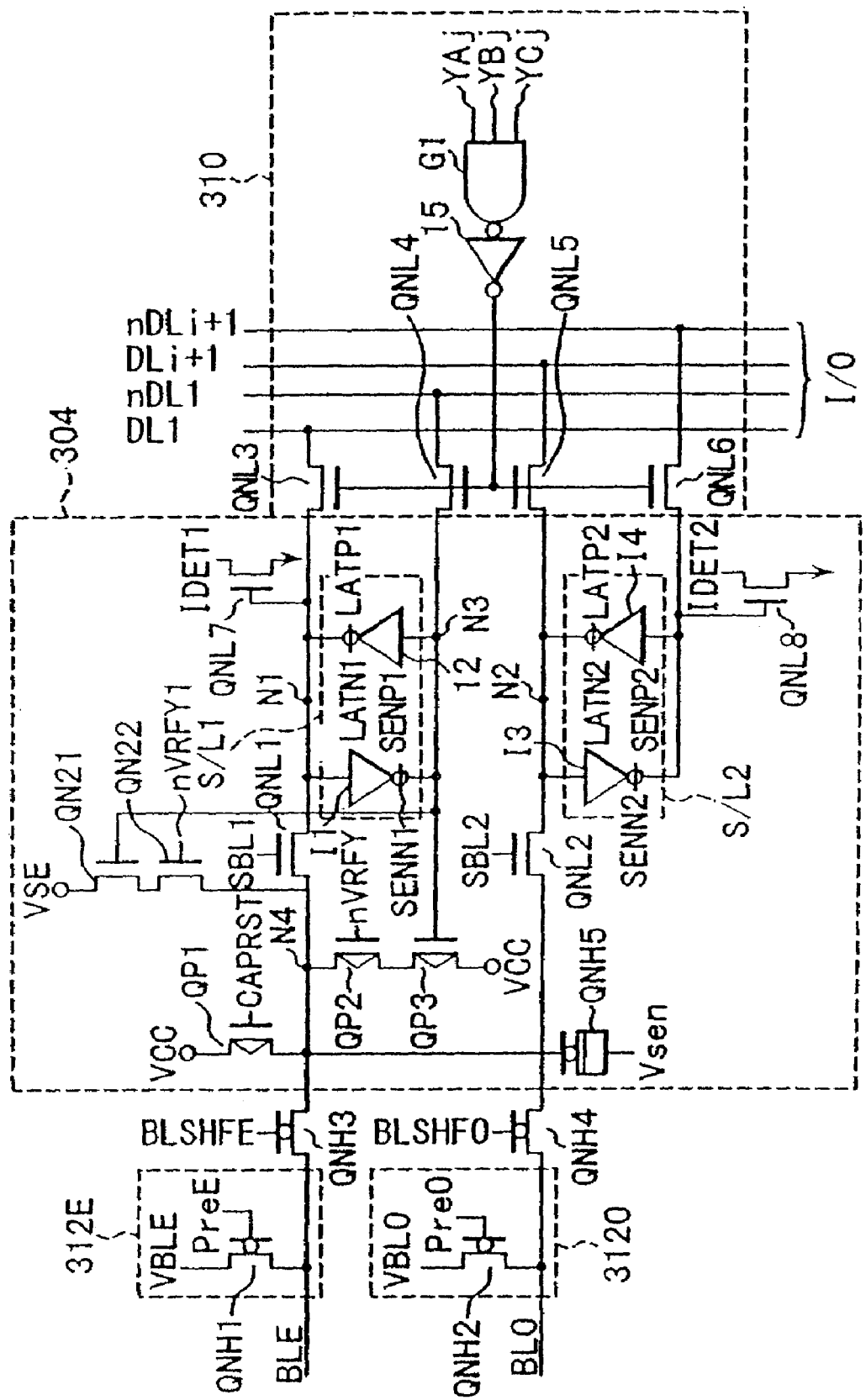
F I G. 58

NONVOLATILE SEMICONDUCTOR MEMORY DEVICE

CROSS REFERENCE TO RELATED APPLICATIONS

This application is a continuation of prior application Ser. No. 11/194,799, filed Aug. 2, 2005, now U.S. Pat. No. 7,224,612 which is a continuation of prior application Ser. No. 10/920,161, filed Aug. 18, 2004 (now U.S. Pat. No. 6,940,752), which is a continuation of prior application Ser. No. 10/377,674, filed Mar. 4, 2003 (now U.S. Pat. No. 6,798,698), which is a continuation of prior application Ser. No. 10/187,285, filed Jul. 2, 2002 (now U.S. Pat. No. 6,549,464), which is a continuation of prior application Ser. No. 09/767,152, filed Jan. 23, 2001 (now U.S. Pat. No. 6,434,055), which is a divisional of prior application Ser. No. 09/599,397, filed Jun. 22, 2000 (now U.S. Pat. No. 6,208,560), which is a divisional of prior application Ser. No. 09/078,137, filed May 14, 1998 (now U.S. Pat. No. 6,134,140), which is based on and claims priority to Japanese Patent Application No. 9-124493, filed May 14, 1997, Japanese Patent Application No. 9-224922, filed Aug. 21, 1997, Japanese Patent Application No. 9-340971, filed Dec. 11, 1997, and Japanese Patent Application No. 10-104652, filed Apr. 15, 1998, the contents of which are incorporated herein by reference.

BACKGROUND OF THE INVENTION

The present invention relates to a nonvolatile semiconductor memory device, more particularly to an EEPROM (Electrically Erasable and Programmable Read-Only Memory).

As an example of a memory cell of EEPROM known as a flash memory, there is a memory cell having an MOSFET structure, which comprises a floating gate and a control gate. The floating gate (i.e., charge storage layer) is provided on a semiconductor substrate, and the control gate is provided on the charge storage layer. The memory cell stores a 1-bit data which is either "0" or "1", depending on the amount of electric charge accumulated in the floating gate.

Another type of a memory cell is known, which is designed for use in a flash memory having a large storage capacity. This memory cell can store multi-bit data. A four-value memory cell, for example, can store "0", "1", "2" and "3" by accumulating, respectively, four different amounts of charge in the floating gate.

How a four-value memory cell stores multi-bit data will be explained below.

A four-value memory cell assumes a neutral state when its floating gate accumulates no electric charge. A condition in which a more positive charge is accumulated than the neutral state is an erased state, storing data "0". More specifically, a high voltage of about 20V is applied to the substrate, setting the control gate at 0V, whereby erasing the data, i.e., storing data "0". The threshold voltage of the four-value memory cell may differ from the design value. If so, the voltage applied to the substrate may be too high, and the floating gate may accumulate an excessively large positive charge and the memory cell is, so to speak, "over-erased." In the four-value memory cell which has been over-erased, the charge accumulated in the floating gate would not change to a predetermined negative level even if an ordinary programming pulse voltage is applied to the memory cell. In this case, data, particularly "0" cannot be programmed into the four-value memory cell.

The four-value memory cell stores data "1" when the floating gate accumulates a first negative charge. The memory cell stores data "2" when the floating gate accumulates a second negative charge greater than the first. The memory cell stores data "3" when the floating gate accumulates a third negative charge greater than the second negative charge.

To program data into the four-value memory cell, the program operation, the substrate, source and drain are set at 0V and a high voltage (about 20V) is applied to the control gate. When the floating gate accumulates the first negative charge, data "1" is programmed into the memory cell. When the floating gate accumulates the second negative charge, data "2" is programmed into the memory cell. When the floating gate accumulates the third negative charge, data "3" is programmed into the memory cell. When the substrate, the source, drain and channel are set at a positive potential and the control gate is applied with the high voltage (about 20V), while the substrate remains at 0V, the floating gate holds the accumulated charge. In this case, data "0" is programmed into the memory cell.

The four-value memory cell can thus store four values "0", "1", "2" and "3".

A NAND-type memory cell unit is known, which is designed to increase the storage capacity of a flash memory. The NAND-type memory cell unit comprises a plurality of memory cells and two selection transistors. The memory cells are connected in series, forming a series circuit. The first selection transistor connects one end of the series circuit to a bit line. The second selection transistor connects the other end of the series circuit to the common source line of the memory cells.

To program "0" into a selected one of the memory cells of the NAND-type memory cell unit, the bit line and the gate of the first selection transistor are set at the power-supply voltage VCC (e.g., 3V), the control gate of the selected memory cell is set at 20V, the control gates of the two memory cells adjacent to the selected memory cell are set at 0V, and the control gate of any other memory cells is set at 11V.

In this case, the voltage applied from the bit line via the first selection transistor to the channel of the memory cell at one end of the series circuit is equal to or lower than the power-supply voltage VCC. Once the first selection transistor is turned off, however, the channel voltage rises due to the electrostatic capacitive coupling between the control gate and channel of the memory cell.

The two memory cells adjacent to the selected memory cell are thereby turned off, too. If the coupling ratio is 50%, the channel potential of the selected memory cell will be 10V, as is obtained by simple calculation. The channel potential of any memory cell not selected will be 5.5V.

When the channel potential of any memory cell not selected is 5.5V, the two memory cells adjacent to the selected memory cell will be turned off if their threshold voltage is equal to or higher than −5.5V. In other words, these memory cells must have a threshold voltage equal to or higher than −5.5V in order to program "0" into the selected memory cell.

To program "1", "2" or "3" into any selected memory cell of the NAND-type memory cell unit, the bit line is set at 0V. Program verification is performed on the selected memory cell. If a memory cell is found into which the data is not completely programmed, the program operation is effected again on that memory cell.

The threshold voltage of any memory cell is thereby controlled with high precision. The program operation on the NAND-type memory cell unit ends when all the memory cells are verified. Time periods of one cycle for programming "1", "2" and "3" are set to the same period. Therefore, data "2" and "3" are programmed by controlling the number of cycles for programming. That is, the program operation is effected once to program data "1", twice to program data "2", and thrice to program data "3".

Hence, data "1" is programmed into a memory cell that should store "1" when the program operation is carried out for the first time. Then, data "2" is programmed into a memory cell that should store "2", and thereafter data "3" is programmed into a memory cell that should store "3."

There is known another method of programming data into flash memories. In this method, the bit line voltage is changed in accordance with the value of the data to be programmed, whereby "1", "2" and "3" are written at the same speed, or within the same time period.

The method cannot be used to program data into a NAND-type memory cell unit of the type described above. If the method is so used, however, a voltage higher than 0V of the bit line voltage cannot be transferred to the selected memory cell, if the control gate of the selected memory cell is set at 0V. This is because both memory cells adjacent to the selected memory cell have a threshold voltage which is almost 0V.

The floating gate of a multi-value memory cell must accumulate a larger electric charge to program data into the memory cell than the amount of charge the floating gate of a binary memory cell needs to accumulate to program data. The greater the charge the floating gate accumulates, the higher the rate at which the floating gate is discharged due to a self electromagnetic field. Hence, multi-value memory cells can hold data, but for a shorter time than binary memory cell.

In the conventional nonvolatile memory device having multi-value memory cells, the channel voltage of the selected memory cell at the time of "0" programming rises sufficiently since the channel potential is isolated from the channel voltage any other memory cells. However, when the selected memory cell is over-erased, its threshold voltage decreases excessively and both memory cells adjacent to the selected memory cell cannot be turned off. Consequently, the channel potential of the selected memory cell fails to increase sufficiently, making it impossible to program data "0" into the selected memory cell. It should be noted that the memory cell is over-erased if the erase operation has been performed many times or if an excessively high data-erasing voltage is applied.

Further, the pulse width of a programming pulse which indicates a time period of one cycle of program operation is constant irrespective of the program operations for "1", "2" and "3". Therefore, the programming speed for programming "1", "2" and "3" cannot be made equal. Stated another way, time periods of one cycle for programming "1", "2" and "3" are set to the same period and data "2" and "3" are written by controlling the number of cycles for programming. Therefore, the programming pulse must be applied at short intervals, and much time is required to rewrite data in the memory.

Further, each multi-value memory cell can hold data, but for a shorter time than a binary memory cell.

BRIEF SUMMARY OF THE INVENTION

Accordingly, it is an object of the present invention to provide a nonvolatile semiconductor memory device in which the voltage applied to a selected memory cell is low enough to program data "0" reliably into the selected memory cell even if the selected memory cell has been over-erased.

Another object of the invention is to provide a nonvolatile semiconductor memory device in which multi-value data can be programmed into the memory cells at high speed.

Still another object of this invention is to provide a nonvolatile semiconductor memory system in which each memory cell can hold multi-value data for a long time and which can achieve reliable storage of multi-value data.

(1) According to a first aspect of the present invention, there is provided a nonvolatile semiconductor memory device comprising a NAND cell unit comprising a plurality of memory cells connected in series; an erase circuit for applying an erase voltage to all memory cells of the NAND cell unit, thereby to erase data from all memory cells of the NAND cell unit; a soft-programming circuit for applying a soft-program voltage to all memory cells of the NAND cell unit, the soft-program voltage being of a polarity opposite to the polarity of the erase voltage; and a programming circuit for applying a program voltage to any selected one of the memory cells, applying a first voltage to at least one of two memory cells adjacent to the any selected one of the memory cells, and applying a second voltage to the remaining memory cells of the NAND cell unit, thereby to program data into the any selected one of the memory cells.

(2) According to a second aspect of the present invention, there is provided a memory device according to the first aspect, in which the programming circuit for applying the first voltage to both of the two memory cells adjacent to the any selected one of the memory cells.

(3) According to a third aspect of the present invention, there is provided a memory device according to the first aspect, in which the soft-programming circuit applies the soft-program voltage to all the memory cells after the erasing circuit has erased data from all memory cells of the NAND cell unit, and the programming circuit programs the memory cells after the soft-programming circuit has applied the soft-program voltage to all the memory cells.

(4) According to a fourth aspect of the present invention, there is provided a memory device according to the first aspect, in which the soft-program voltage is lower than the program voltage.

(5) According to a fifth aspect of the present invention, there is provided a memory device according to the first aspect, which further comprises an erase-verification circuit for determining whether data has been erased from all the memory cells of the NAND cell unit and have threshold voltages controlled within a predetermined range after the soft-programming circuit has applied the soft-program voltage to all the memory cells, and in which the programming circuit programs data into the any selected one of the memory cells after the soft-programming circuit and the erase-verification circuit have performed a soft-program operation and an erase verification operation.

(6) According to a sixth aspect of the present invention, there is provided a memory device according to the fifth aspect, further comprising a control circuit for causing the soft-programming circuit and the erase-verification circuit to repeat the soft-program operation and the erase verification operation, and for causing the soft-programming circuit to terminate the soft-program operation when at least one of the memory cells of the NAND cell unit has a threshold voltage forced out of the predetermined range.

(7) According to a seventh aspect of the present invention, there is provided a memory device according to the sixth aspect, in which the control circuit causes the erasing circuit to erase data again from all memory cells of the NAND cell unit when the soft-program operation and the erase verification operation have not repeated a predetermined number of times and when at least one of the memory cells of the NAND cell unit is forced out of the predetermined range.

(8) According to an eighth aspect of the present invention, there is provided a memory device according to the first aspect, in which the program voltage is higher than the first and second voltages, and the second voltage is higher than the first voltage.

(9) According to a ninth aspect of the present invention, there is provided a memory device according to the eighth aspect, in which the first voltage is 0V.

(10) According to a tenth aspect of the present invention, there is provided a nonvolatile semiconductor memory device comprising a plurality of nonvolatile semiconductor memory cells, each capable of storing n-value data, where n is a natural number greater than 2; and a data-programming circuit for performing a program operation in which program pulses are applied to the plurality of nonvolatile semiconductor memory cells to program n-value data into the plurality of nonvolatile semiconductor memory cells, performing a program verification operation in which it is determined whether or not the n-value data has been programmed into the plurality of nonvolatile semiconductor memory cells and repeating the program operation and the program verification operation, wherein each of the program pulses has a predetermined pulse width in accordance with a value of the n-value data to be programmed into corresponding memory cell.

(11) According to an eleventh aspect of the present invention, there is provided a memory device according to the tenth aspect, in which each program pulse is removed from corresponding memory cell after the program verification operation in which it has been determined that n-value data has been programmed into the corresponding memory cell.

(12) According to a twelfth aspect of the present invention, there is provided a memory device according to the tenth aspect, in which the program operation is terminated when it is determined in the program verification operation that all of n-value data have been programmed into the plurality of nonvolatile semiconductor memory cells.

(13) According to a thirteenth aspect of the present invention, there is provided a memory device according to the tenth aspect, in which the program operation and the program verification operation are terminated after a limited number of cycles.

(14) According to a fourteenth aspect of the present invention, there is provided a memory device according to the tenth aspect, in which the plurality of nonvolatile semiconductor memory cells are connected to one word line.

(15) According to a fifteenth aspect of the present invention, there is provided a memory device according to the tenth aspect, in which the plurality of memory cells are respectively included in corresponding NAND cell units, each NAND cell unit comprising a predetermined number of nonvolatile semiconductor memory cells connected in series, and in the program operation, the data-programming circuit applies a first voltage to at least one of the two memory cells adjacent to the selected memory cells to be programmed and a second voltage to the remaining memory cells.

(16) According to a sixteenth aspect of the present invention, there is provided a memory device according to the fifteenth aspect, in which voltages of the program pulses are higher than the first and second voltages, and the second voltage is higher than the first voltage.

(17) According to a seventeenth aspect of the present invention, there is provided a memory device according to the sixteenth aspect, in which the first voltage is 0V.

(18) According to an eighteenth aspect of the present invention, there is provided a nonvolatile semiconductor memory device comprising a memory cell array comprising memory cells arranged in rows and columns, each having a control gate; a programming circuit for programming data into any selected one of the memory cells by applying a program voltage to the control gate of the selected memory cell; an erasing circuit for erasing data from the memory cells by applying an erase voltage opposite in polarity to the program voltage; a soft-programming circuit for applying a soft-program voltage to the memory cells, thereby setting the memory cells into a desirable erased state; a verification read circuit for determining whether the memory cells have been set into the desirable erased state; and an erased-state determining circuit for causing the soft-programming circuit to terminate the soft-program operation upon determining from an output of the verification read circuit that at least two of the memory cells have a threshold voltage which has reached a predetermined value.

(19) According to a nineteenth aspect of the present invention, there is provided a memory device according to the eighteenth aspect, in which the soft-programming circuit soft-programs the memory cells after the erasing circuit has erased data from the memory cells, and the verification read circuit performs a determination operation after the soft-programming circuit has soft-programmed the memory cells.

(20) According to a twentieth aspect of the present invention, there is provided a memory device according to the eighteenth aspect, in which the memory cell array includes a plurality of data input/output lines divided into m units (m≧2), and the erase-state determining circuit comprises circuits for detecting erased states of the memory cells based on the data input/output lines of each unit and causing the soft-programming circuit to terminate soft-program operation, upon determining that at least one of the memory cells connected to the data input/output lines of any unit has a threshold voltage which has reached the predetermined value.

(21) According to a twenty-first aspect of the present invention, there is provided a memory device according to the eighteenth aspect, in which the memory cell array includes a plurality of word lines divided into m units (m≧2), and the erase-state determining circuit comprises circuits for detecting erased states of the memory cells based on the word lines of each unit and causing the soft-programming circuit to terminate soft-program operation, upon determining that at least one of the memory cells connected to the word lines of any unit has a threshold voltage which has reached the predetermined value.

(22) According to a twenty-second aspect of the present invention, there is provided a memory device according to the eighteenth aspect, in which the nonvolatile semiconductor memory cells of the memory cell array form NAND cell units, each comprising a plurality of memory cells connected in series, and the programming circuit applies a first voltage lower than the program voltage to the control gate of at least one of two memory cells adjacent to any selected one of the memory cells of each NAND cell unit, and applies a second voltage between the program voltage and the first voltage, to the remaining memory cells of each NAND cell unit, thereby to program data into the any selected one of the memory cells.

(23) According to a twenty-third aspect of the present invention, there is provided a memory device according to the twenty-second aspect, which further comprises a memory circuit for storing data output from the verification read circuit, and in which the erased-state determining circuit comprises a scan-detection circuit for monitoring the data stored in the memory circuit and counting the memory cells which have a threshold voltage which has reached the predetermined value.

(24) According to a twenty-fourth aspect of the present invention, there is provided a memory device according to the twenty-third aspect, further comprising a control circuit for repeatedly causing the soft-programming circuit to perform a soft-program operation, the verification read circuit to perform a verification read operation and the scan-detection circuit to perform a memory-cell counting operation, and for causing the soft-programming circuit to terminate the soft-program operation, the verification read operation and the memory-cell counting operation when the scan-detection circuit counts at least two memory cells having a threshold voltage which has reached the predetermined value.

(25) According to a twenty-fifth aspect of the present invention, there is provided a memory device according to the twenty-fourth aspect, in which the control circuit causes the verification read circuit to perform the verification read operation by applying a margin voltage to the word line of each NAND cell unit after the soft-programming circuit has finished performing the soft-program operation, causes the scan-detection circuit to perform the memory-cell counting operation, and causes the soft-programming circuit to terminate the soft-program operation, the verification read operation and the memory-cell counting operation, when the scan-detection circuit detects that all memory cells of each NAND cell unit have a threshold voltage equal to or lower than a predetermined threshold voltage, the predetermined threshold voltage being higher than the predetermined value.

(26) According to a twenty-sixth aspect of the present invention, there is provided a nonvolatile semiconductor memory device comprising a memory cell section including at least one memory cell and having first and second ends; a first signal line connected to the first end of the memory cell section; a second signal line connected to the second end of the memory cell section; a reading circuit connected to the first signal line, for reading the memory cell; an erasing circuit for erasing data stored in the memory cell; and an over-erase detecting circuit for detecting whether the memory cell is over-erased, wherein the over-erase detecting circuit applies a first reference potential to the second signal line, thereby outputting a first read potential to the first signal line, and the reading circuit detects the first read potential.

(27) According to a twenty-seventh aspect of the present invention, there is provided a memory device according to the twenty-sixth aspect, further comprising a soft-programming circuit for performing soft-program operation on the memory cell when the over-erase detecting circuit detects that the memory cell has been over-erased.

(28) According to a twenty-eighth aspect of the present invention, there is provided a nonvolatile semiconductor memory device comprising a first memory cell section including at least one memory cell; a second memory cell section including at least one memory cell; a first signal line connected to a first end of the first memory cell section; a second signal line connected to a second end of the first memory cell section; a third signal line connected to a first end of the second memory cell section; a fourth signal line connected to a second end of the second memory cell section; a reading circuit connected to the first signal line, for reading the memory cell; an erasing circuit for erasing data stored in the memory cell; and an over-erase detecting circuit for detecting whether the memory cell is over-erased, wherein the over-erase detecting circuit applies a first reference potential to the second signal line, thereby outputting a first read potential to the first signal line and applying a second reference potential to the third signal line, and the reading circuit detects the first read potential.

(29) According to a twenty-ninth aspect of the present invention, there is provided a nonvolatile semiconductor memory device comprising a first memory cell section including at least one memory cell; a second memory cell section including at least one memory cell; a first signal line connected to a first end of the first memory cell section; a second signal line connected to a second end of the first memory cell section; a third signal line connected to a first end of the second memory cell section; a fourth signal line connected to a second end of the second memory cell section; a reading circuit connected to the first signal line, for reading the memory cell; an erasing circuit for erasing data stored in the memory cell; an over-erase detecting circuit for detecting whether the memory cell is over-erased; and a soft-programming circuit for performing a soft-program operation on the memory cell when the over-erase detecting circuit detects that the memory cell has been over-erased, wherein the over-erase detecting circuit applies a first reference potential to the second signal line, thereby outputting a first read potential to the first signal line and applying a second reference potential to the third signal line, and the reading circuit detects the first read potential.

(30) According to a thirtieth aspect of the present invention, there is provided a memory device according to the twenty-sixth aspect, in which the reading circuit includes a first switch for connecting the first signal line to a first node, a sense amplifier for detecting a potential of the first node, and a capacitor connected at one end to the first node and at the other end to the second node, and the potential applied to the second node is changed when the sense amplifier detects the potential of the first node.

(31) According to a thirty-first aspect of the present invention, there is provided a memory device according to the twenty-sixth aspect, in which the reading circuit includes a first switch for connecting the first signal line to a first node, a sense amplifier for detecting a potential of the first node, and a capacitor connected at one end to the first node and at the other end to the second node, the potential applied to the second node is changed when the sense amplifier detects the potential of the first node, the over-erase detecting circuit applies the first reference potential to the second signal line to detect whether the memory cell has been over-erased, the first read potential output to the first signal line is transferred through the first switch to the first node as a second read potential, and the potential of the first node is changed to a third read potential different from the second read potential, by changing potential of the second node.

(32) According to a thirty-second aspect of the present invention, there is provided a memory device according to the twenty-ninth aspect, in which the first and third lines are bit lines.

(33) According to a thirty-third aspect of the present invention, there is provided a memory device according to the twenty-ninth aspect, in which the first line is a bit line, and the third line is a bit line adjacent to the first line.

(34) According to a thirty-fourth aspect of the present invention, there is provided a memory device according to the twenty-ninth aspect, in which the second and fourth lines are source lines.

(35) According to a thirty-fifth aspect of the present invention, there is provided a memory device according to the twenty-ninth aspect, in which the first and second reference potentials are of approximately the same value.

(36) According to a thirty-sixth aspect of the present invention, there is provided a memory device according to the twenty-sixth aspect, in which the first reference potential is a power-supply voltage.

(37) According to a thirty-seventh aspect of the present invention, there is provided a memory device according to the twenty-sixth aspect, in which the memory cell section includes a NAND cell unit comprising a plurality of memory cells connected in series.

(38) According to a thirty-eighth aspect of the present invention, there is provided a memory device according to the twenty-sixth aspect, in which when the over-erase detecting circuit applies the first reference potential to the second signal line, a first over-erase detection word-line potential is applied to the gate of any selected memory cell and a second over-erase detection word-line potential is applied to the gates of the memory cells connected in series to the any selected memory cell, thereby the first read potential is output to the first signal line.

(39) According to a thirty-ninth aspect of the present invention, there is provided a memory device according to the thirty-eighth aspect, in which the first and second over-erase detection word-line potentials are of approximately the same value.

(40) According to a fortieth aspect of the present invention, there is provided a memory device according to the thirty-eight aspect, in which the first and second over-erase detection word-line potentials are of different values.

(41) According to a forty-first aspect of the present invention, there is provided a memory device according to the thirty-eighth aspect, in which the first over-erase detection word-line potential is 0V.

(42) According to a forty-second aspect of the present invention, there is provided a memory device according to the thirty-eighth aspect, in which the second over-erase detection word-line potential is a power-supply voltage.

(43) According to a forty-third aspect of the present invention, there is provided a nonvolatile semiconductor memory device comprising a memory cell section including a NAND cell unit comprising a plurality of memory cells connected in series; an erasing circuit for erasing data stored in the memory cells; and an over-erase detecting circuit for detecting whether the memory cells are over-erased.

(44) According to a forty-fourth aspect of the present invention, there is provided a memory device according to the forty-third aspect, further comprising a soft-programming circuit for performing a soft-program operation on any one of the memory cells that has been over-erased.

(45) According to a forty-fifth aspect of the present invention, there is provided a memory device according to the forty-third aspect, which further comprises a first signal line connected to one end of the NAND cell unit, a second signal line connected to the other end of the NAND cell unit, and a reading circuit connected to the first signal line, for reading the memory cells, and in which the reading circuit includes a first switch for connecting the first signal line to a first node, a sense amplifier for detecting a potential of the first node and a capacitor connected at one end to the first node and at the other end to the second node, and the second node is changed, when the sense amplifier detects the potential of the first node.

(46) According to a forty-sixth aspect of the present invention, there is provided a memory device according to the forty-fifth aspect, further comprising a transistor which includes a gate connected to an output terminal of the sense amplifier and which detects that the second sense amplifier stores the data that has been erased from one of the memory cells.

(47) According to a forty-seventh aspect of the present invention, there is provided a memory device comprising a first signal line connected to one end of a unit of memory cells; a second signal line connected to the other end of the unit of memory cells; and a reading circuit connected to the first signal line, for reading the memory cells, and wherein the reading circuit includes a first switch for connecting the first signal line to a first node, a sense amplifier for detecting a potential of the first node and a capacitor connected at one end to the first node and at the other end to the second node, and the second node is changed, when the sense amplifier detects the potential of the first node.

(48) According to a forty-eighth aspect of the present invention, there is provided a memory device according to the forty-seventh aspect, in which a potential of the second signal line is set to a potential higher than a potential of the first signal line during a reading operation.

(49) According to a forty-ninth aspect of the present invention, there is provided a nonvolatile semiconductor memory system comprising an electrically programmable nonvolatile semiconductor memory device; and a controller for controlling the nonvolatile semiconductor memory device, and wherein the controller determines whether a predetermined time has elapsed after data was programmed into the nonvolatile semiconductor memory device.

(50) According to a fiftieth aspect of the present invention, there is provided a memory system according to the forty-ninth aspect, in which the nonvolatile semiconductor memory device comprises a multi-value memory device.

(51) According to a fifty-first aspect of the present invention, there is provided a memory system according to the forty-ninth aspect, in which the controller refreshes data upon determining that the predetermined time has elapsed after data was programmed into the nonvolatile semiconductor memory device.

(52) According to a fifty-second aspect of the present invention, there is provided a memory system comprising an electrically programmable nonvolatile semiconductor memory device; a controller for controlling the nonvolatile semiconductor memory; a battery for supplying power to the controller when external power supplies are unavailable; and a terminal for receiving and supplying signals and power from and to an external device, and wherein the controller determines whether a predetermined time has elapsed after data was programmed into the nonvolatile semiconductor memory device.

(53) According to a fifty-third aspect of the present invention, there is provided a memory system comprising an electrically programmable nonvolatile semiconductor memory device; a controller for controlling the nonvolatile semiconductor memory device; a battery for supplying power to the controller when external power supplies are unavailable; a timer for storing data representing a time when data is programmed into the nonvolatile semiconductor memory; a terminal for receiving and supplying signals and power from and to an external device, and wherein the controller determines whether a predetermined time has elapsed after data was programmed into the nonvolatile semiconductor memory device.

(54) According to a fifty-fourth aspect of the present invention, there is provided a memory system according to the fifty-second or fifty-third aspect, in which the nonvolatile semiconductor memory device comprises a multi-value memory device.

(55) According to a fifty-fifth aspect of the present invention, there is provided a memory system according to the fifty-second or fifty-third aspect, in which the controller refreshes data upon determining that the predetermined time has elapsed after data was programmed into the nonvolatile semiconductor memory device.

(56) According to a fifty-sixth aspect of the present invention, there is provided a memory system according to the fifty-second or fifty-third aspect, further comprising an indicator for indicating that the predetermined time has elapsed after data was programmed into the nonvolatile semiconductor memory device, when the controller determines that the predetermined time has elapsed.

(57) According to a fifty-seventh aspect of the present invention, there is provided a memory system according to the fifty-second or fifty-third aspect, in which the battery is a chargeable one and is charged while power is supplied from an external power supply.

(58) According to a fifty-eighth aspect of the present invention, there is provided a memory system according to the fifty-second or fifty-third aspect, in which the controller stops supply of power to the nonvolatile semiconductor memory device while no power is being supplied from an external power supply.

(59) According to a fifty-ninth aspect of the present invention, there is provided a memory system according to the fifty-second or fifty-third aspect, in which the controller refreshes data upon determining that the predetermined time has elapsed after data was programmed into the nonvolatile semiconductor memory device, and stops supply of power to the nonvolatile semiconductor memory device while no power is being supplied from an external power supply and while the controller is not refreshing the data.

Additional objects and advantages of the present invention will be set forth in the description which follows, and in part will be obvious from the description, or may be learned by practice of the present invention.

The objects and advantages of the present invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 58 is a circuit diagram of the sense amplifier/latch circuit in the ninth embodiment;

DETAILED DESCRIPTION OF THE INVENTION

A preferred embodiment of a nonvolatile semiconductor memory device according to the present invention will now be described with reference to the accompanying drawings.

First Embodiment

Figure 1:
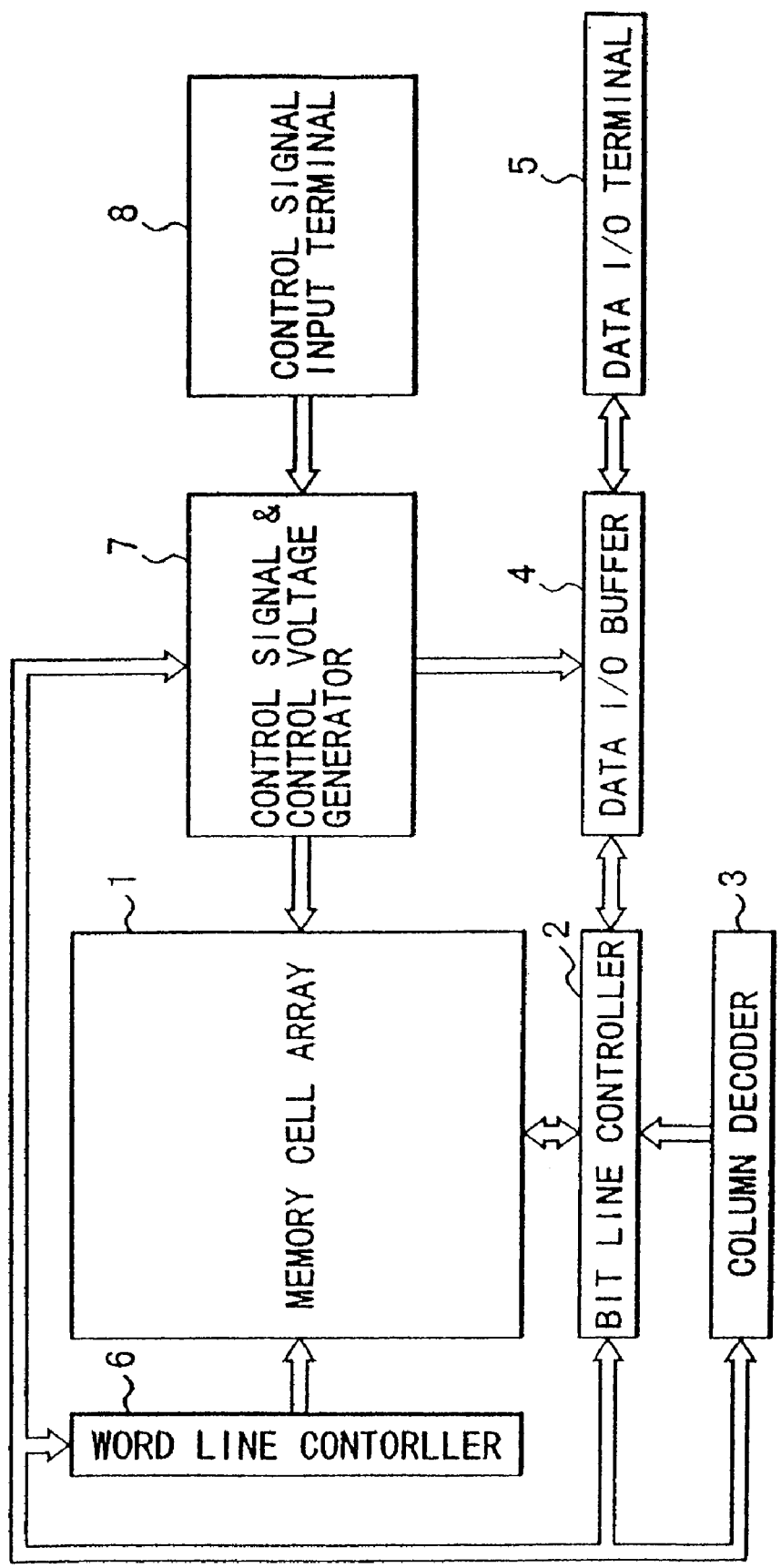
FIG. 1 is a block diagram of a nonvolatile semiconductor memory device according to a first embodiment of the present invention.

FIG. 1 shows a nonvolatile semiconductor memory device according to the first embodiment of the invention, which is a four-value NAND flash memory.

The four-value NAND flash memory comprises a memory cell array 1. The array 1 comprises a plurality of bit lines, a plurality of word lines, a common source line, and a plurality of electrically programmable memory cells. The memory cells are arranged in rows and columns, at intersections of the bit lines and word lines. The flash memory further comprises a bit line controller 2, a column decoder 3, data input/output buffer 4, a data input/output terminal 5, a word line controller 6, a control signal and control voltage generator 7, and a control signal input terminal 8. The bit line controller 2 controls the bit lines. The word line controller 6 controls the word lines.

The bit line controller 2 performs various functions. It reads data from the memory cells of the array 1 through the bit lines. It detects the states of the memory cells, through the bit lines. It applies a program-control voltage to the memory cells through the bit lines, in order to program data into the memory cells.

The bit line controller 2 includes a plurality of data memories. The data read from the memory cell is stored into the data memory selected by the column decoder 3. Then, the data read from the data memory is output from the data input/output terminal 5 to an external device through the data input/output buffer 4. The program data input to the data input/output terminal 5 from an external device is stored in the input/output buffer 4. The data read from the input/output buffer 4 is input to the data memory selected by the column decoder 3 as initial control data.

The word line controller 6 selects one of the word lines in the memory cell array 1. It applies a voltage to the selected word line, for reading data from, programming data into, or erasing data in the memory cells connected to the selected word line.

The control signal and control voltage generator 7 controls the memory cell array 1, bit line controller 2, column decoder 3, data input/output buffer 4 and word line controller 6. The control signal and control voltage generator 7 is, in turn, controlled by a control signal input to the control signal input terminal 8 from an external device.

Figure 2:
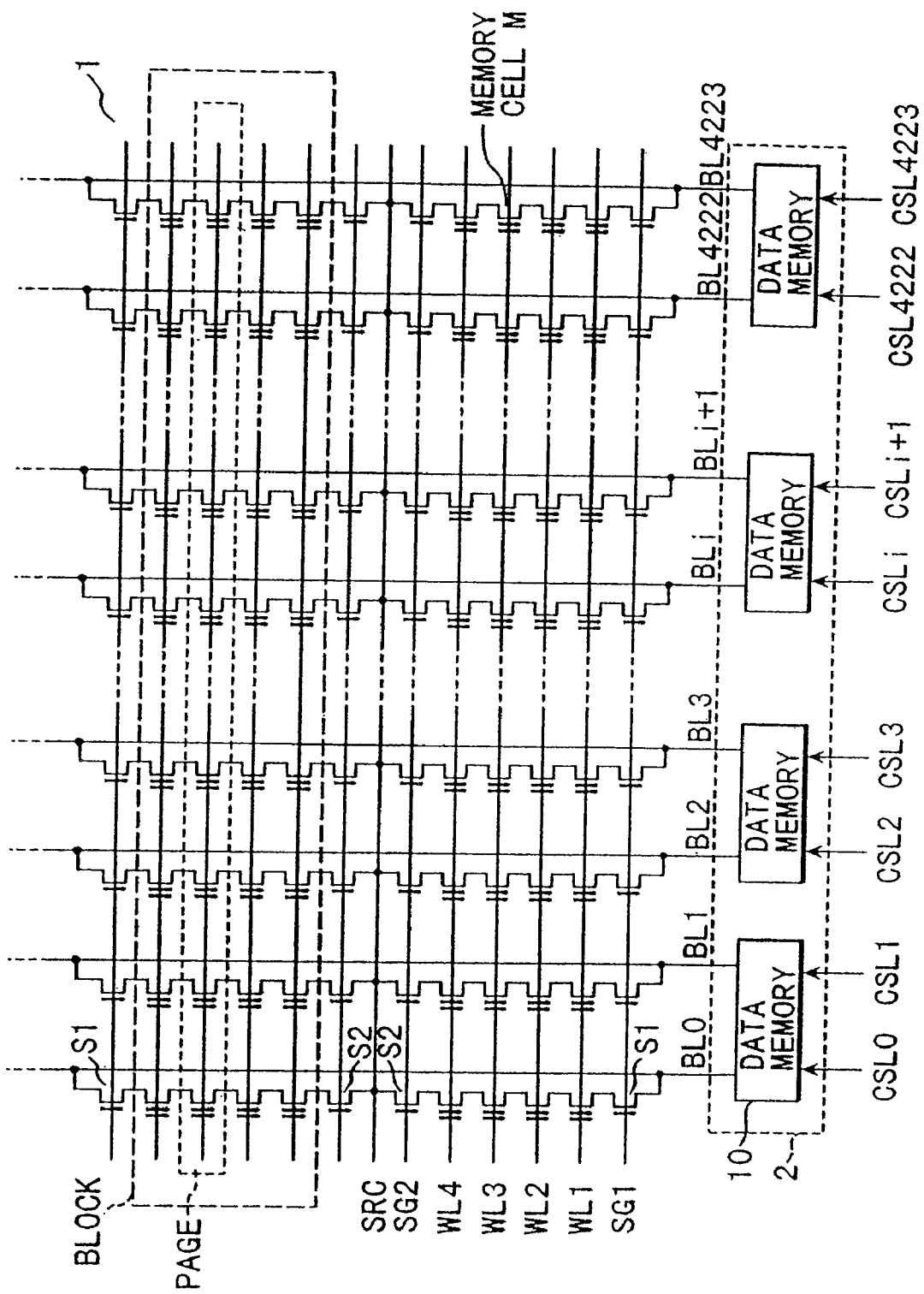
FIG. 2 is a diagram showing the memory cell array and data memories according to the first embodiment.

FIG. 2 shows the memory cell array 1 and the bit line controller 2.

As shown in FIG. 2, the memory cell array 1 includes a plurality of NAND-type cell units, each comprising four memory cells M connected in series. Each NAND-type cell unit includes one end connected via a selection transistor S1 to a bit line BL, and the other end connected via a selection transistor S2 to the common source line SRC. The control gate electrodes of the four memory cells M of each NAND-type memory cell unit are connected to four word lines WL, respectively. The control gate electrodes of the two selection transistors S are connected to selection gate lines SG1 and SG2, respectively.

The memory cells M accessed at the same time, that is, the memory cells M connected to one word line WL, constitute a unit of storage area, called a "page." The memory cells M of four pages, that is, the memory cells M connected to four adjacent word lines, form a larger unit of storage area, which is called a "block." Only the memory cells constituting two blocks are illustrated in FIG. 2. Nonetheless, the four-value NAND flash memory of FIG. 1 may have an arbitrary number of blocks, for example, 1,024 blocks. Although 4,224 bit lines BL0 to BL4223 are shown in FIG. 2, the four-value NAND flash memory can have any other number of bit lines. For example, it may have 2,112 bit lines.

The bit line controller 2 includes a plurality of data memories 10. Each data memory 10 is connected to two bit lines BL. Nonetheless, each data memory 10 may be connected to one, four, six or nine bit lines.

The column decoder 3 generates column-selecting signals CSL. Of these column-selecting signals, the signals CSL0 and CSL1 select the data memory 10 connected to the bit lines BL0 and BL1. The data read from the memory cells is output to the data input/output buffer 4.

The signals CSL2 and CSL3 select the data memory 10 connected to the bit lines BL2 and BL3. The control data output from the data input/output buffer 4 is initially transferred to the data memory 10 that is connected to the bit lines BL2 and BL3.

In a read operation, each data memory 10 reads data from the memory cell connected to one of the two bit lines which are connected to the data memory 10. In a program operation, each data memory 10 applies a program-control voltage to the memory cell connected one of the two bit lines, in accordance with control data.

In a program verification operation, each data memory 10 detects the data-storage state of the memory cell connected to one of the two bit lines.

Figures 3A, 3B:
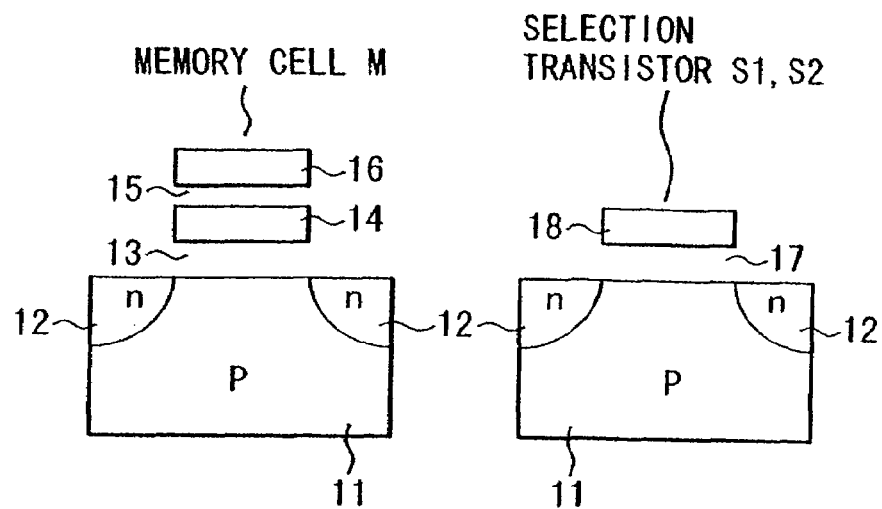
FIGS. 3A and 3B are diagrams showing a memory cell and a selection transistor according to the first embodiment.

FIG. 3A illustrates one of the memory cells M shown in FIG. 2. FIG. 3B illustrates one of the selection transistors S1 and S2 shown in FIG. 2. In FIGS. 3A and 3B, the insulating films of the memory cell M and selection transistor S1 or S2 are not illustrated for the sake of simplicity.

The memory cell M and the selection transistor S1 or S2 have two n-type diffusion layers 12 each, which are in the surface of a p-type semiconductor substrate 11 (or a p-type well region). The two n-type diffusion layers 12 are a drain and a source.

As shown in FIG. 3A, the memory cell M includes a floating gate 14 and a control gate 16. The floating gate 14 is formed on an insulating film 13 provided on the semiconductor substrate 11 (or the p-type well). The control gate 16 is formed on an insulating film 15, which is provided on the floating gate 14. The control gate 16 functions as a word line WL.

As shown in FIG. 3B, the selection transistor S1 or S2 includes a selection gate 18 formed on an insulating film 17 which is provided on the semiconductor substrate 11 (or the p-type well). The selection gate 18 functions as a selection gate line SG.

When a voltage higher than the threshold voltage of the memory cell M is applied to the control gate of the memory cell M, a channel is formed beneath the floating gate 14 of the memory cell M.

Assume that the capacitance between the control gate 16 and the floating gate 14 is 1 fF, that the capacitance between the floating gate 14 and the channel is 1 fF, that the capacitance between the channel and the substrate 11 is 0.25 fF and that the capacitance between the n-type diffusion layer 12 and the substrate 11 is 0.25 fF. Then, the ratio of the capacitive coupling of the control gate 16 to that of the channel (or the n-type diffusion layer 12) is 50%. Hence, if the voltage at the control gate 16 rises by 1V while the channel and n-type diffusion layer 12 are in a floating state, the voltage at the channel or the n-type diffusion layer 12 will increase by 0.5V.

Figure 4:
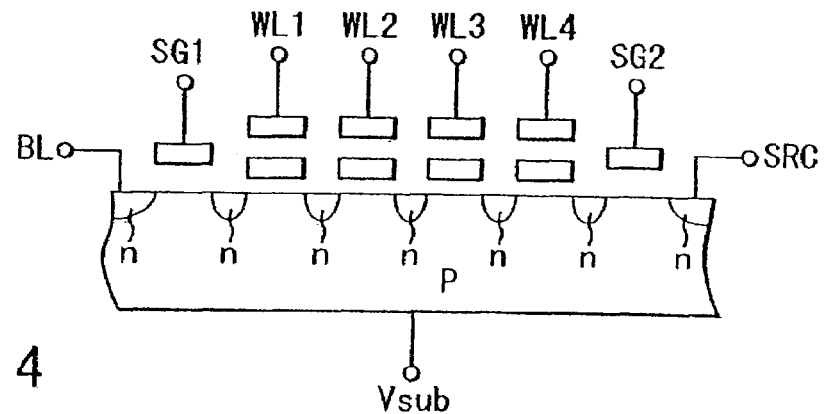
FIG. 4 is a sectional view illustrating a NAND-type cell unit according to the first embodiment.

FIG. 4 shows the NAND-type cell unit and the two selection transistors connected to the ends of the cell unit, illustrated in FIG. 2.

As FIG. 4 shows, the NAND-type cell unit comprises four memory cells M connected in series. One end of the NAND-type cell unit is connected to the common source line SRC via the first selection transistor S1. The other end of the NAND-type cell unit is connected to a bit line BL via the second selection transistor S2.

To erase data in the memory cells M of the NAND-type cell unit, the voltage Vsub of the substrate 11 is set at 20V, i.e., an erase voltage, and the selection gate lines SG1 and SG2, common source line SRC and bit line BL are set at 20V, too. When the word lines WL1 to WL4 of one block from which data is to be erased are set at 0V, charges move from the floating gates of the memory cells into the substrate 11. As a result, the memory cells gain a negative threshold voltage (that is, they store data "0") When the word lines WL1 to WL4 connected to the memory cells of said block are set at 20V, charges do not move from the floating gates of these memory cells into the substrate 11.

Let us assume that the selected word line of the selected block is WL2. In the program operation, a program voltage of 20V is applied to the selected word line WL2. At this time, a voltage of 0V is applied to the nonselected word lines WL1 and WL3 adjacent to the selected word line WL2, and a voltage of 11V is applied to the remaining nonselected word line WL4.

Further, the power-supply voltage VCC is applied to the selection gate line SG1, while the selection gate line SG2 is set at 0V. All word lines WL and all selection gate lines SG of the nonselected block are set at 0V. The memory cells into which data is to be programmed are selected, one after another, first those connected to the word line WL4, then those connected to the word line WL3, next those connected to the word line WL2, and finally those connected to the word line WL1.

The NAND-type cell unit shown in FIG. 4 comprises four memory cells. Instead, each NAND-type cell unit may comprise eight memory cells or 16 memory cells. Assume each NAND-type cell unit comprises 16 memory cells. Then, when the fourth memory cell counted from the bit-line side is selected in the program operation, the program voltage of 20V is applied to the word line to which the control gate of the fourth memory cell is connected.

A voltage of 0V is applied to the two word lines to which the control gates of the third and fifth memory cells, which are adjacent to the fourth memory cell. And, a voltage of 11V is applied to the remaining 13 word lines to which the control gates of the remaining 13 memory cells are connected.

When the second memory cell counted from the bit-line side is selected in the program operation, the program voltage of 20V is applied to the word line to which the control gate of the second memory cell is connected. A voltage of 0V is applied to the two word lines to which the control gates of the first and third memory cells are connected, which are adjacent to the fourth memory cell. And, a voltage of 11V is applied to the remaining 13 word lines to which the control gates of the remaining 13 memory cells are connected.

When the first memory cell counted from the bit-line side is selected in the program operation, the program voltage of 20V is applied to the word line to which the control gate of the first memory cell is connected. A voltage of 0V is applied to the word line to which the control gate of the second memory cell counted from the bit-line side is connected. And, a voltage of 11V is applied to the remaining 14 word lines to which the control gates of the remaining 14 memory cells are connected.

Before programming of data into any selected block of the memory cell array 1, data is erased at a time from all memory cells constituting the selected block, whereby these memory cells store data "0." Then, data is programmed into the selected block, in the units of, for example, pages.

In the four-value NAND-type memory cell unit illustrated in FIG. 4, a bit line BL is set at the program-control voltage of 0V in order to program "1", "2" or "3" into any memory cell connected to the bit line BL. The memory cells are sequentially selected, first the one connected to the word line WL4, next the one connected to the word line WL3, then the one connected to the word line LW2, and finally the one connected to the word line WL1. Hence, any memory cell located closer to the bit line than the selected memory cell stays in erased state.

Therefore, the program-control voltage (0V) applied to the bit line can be transferred to the selected memory cell even if the word line to which the memory cell closer to the bit line than the selected memory cell is set at a voltage of 0V.

In the selected memory cell, charges moves from the substrate to the floating gate, whereby the threshold voltage changes to a positive one.

In order to program data "0" into one memory cell, the bit line BL is set at the program-control voltage which is the power-supply voltage VCC. Since the selection gate line SG1 is set at the power-supply voltage VCC, the selection transistor S1 connected to the bit line BL are turned off during the program operation. The channel and n-type diffusion layers 12 of each memory cell are set to a floating state.

As a result, the channel potential of the selected memory cell whose corresponding word line is applied with the program voltage of 20V and the channel potential of the nonselected memory cell whose corresponding word line is applied with 11V rise. The two memory cells adjacent to the selected memory cell are turned off when their channel potential changes to a predetermined value, since 0V is applied to the corresponding word line.

If the above-defined ratio of the capacitive coupling of the selected memory cell is 50%, the channel potential of the selected memory cell rises to about 10V by virtue of the program voltage of 20V. In this case, the potential difference between the control gate and channel of the selected memory cell is so small that no charges are injected into the floating gate of the selected memory cell. Data "0" can thereby be programmed into the selected memory cell.

However, the two memory cells adjacent to the selected memory cell are not turned off even when 0V is applied to their control gates in the program operation, if they have excessively large negative threshold voltages. To turn off these memory cells reliably, a so-called soft-program operation is carried out, controlling the threshold voltages of the memory cells after data is erased at a time from all memory cells (of the selected block).

As mentioned above, a bit line BL is set at the program-control voltage of 0V to program "1," "2" or "3" into the memory cell connected to the bit line BL. The time for which the voltage of 0V is applied to the bit line BL is adjusted in accordance with the data to be programmed into the memory cell, as will be described later in detail.

For example, the program-control voltage of 0V is applied to the bit line BL to program data "1" into the memory cell, for a shorter time than to program data "2" or data "3" into the memory cell. This is because it is sufficient to inject fewer charges into the floating gate of the memory cell to program data "1" than to program data "2" or data "3" into the memory cell.

Further, the program-control voltage of 0V may be applied to the bit line BL for three different periods to program "1", "2" and "3", respectively, into one memory cell. More specifically, 0V may be applied to the bit line BL for 1 μsec to program "1", for 5 μsec to program "2", and for 25 μsec to program "3."

In the four-value NAND-type memory cell unit illustrated in FIG. 4, each memory cell must have a threshold voltage lower than 0V to program data "0", a threshold voltage ranging from 0.3V to 0.7V to program data "1", a threshold voltage ranging from 1.5V to 1.9V to program data "2", and a threshold voltage ranging from 2.7V to 3.1V to program data "3."

Assume that the memory cells connected to, for example, the word line WL2 are selected. The word line WL2 is a selected one of the word lines of one block and is at a voltage Vcg. The nonselected word lines WL1, WL3 and WL4 are set at a voltage Vread of 4.5V. The selection gate lines SG1 and SG2 of the selected block are set at the voltage Vread of 4.5V, too. All word lines WL and selection gate line SG1 of any nonselected block are set at 0V. The common source line SRC is set at 0V or connected to the ground by a parasitic resistance.

Unless the potential of the common source line SRC rises due to the parasitic resistance, the following will occur:

(1) The voltage of the bit line charged to 1V and set in floating state will remain at the value of 1V if Vcg is 0V and the selected memory cell stores "1", "2" or "3." If the selected memory cell stores data "0," the voltage of the bit line charged to 1V and set in floating state will falls to 0.5V.

(2) The voltage of the bit line charged to 1V and set in floating state will remain at the value of 1V if Vcg is 1.1V and the selected memory cell stores "2" or "3." If the selected memory cell stores data "0" or data "1," the voltage of the bit line charged to 1V and set in floating state will fall to 0.5V.

(3) The voltage of the bit line charged to 1V and set in floating state will remain at the value of 1V if Vcg is 2.3V and the selected memory cell stores "3." If the selected memory cell stores data "0," "1" or "2," the voltage of the bit line charged to 1V and set in floating state will fall to 0.5V.

Due to the phenomena described in paragraphs (1) to (3), the data stored in any selected memory cell M can be identified.

Figure 5:
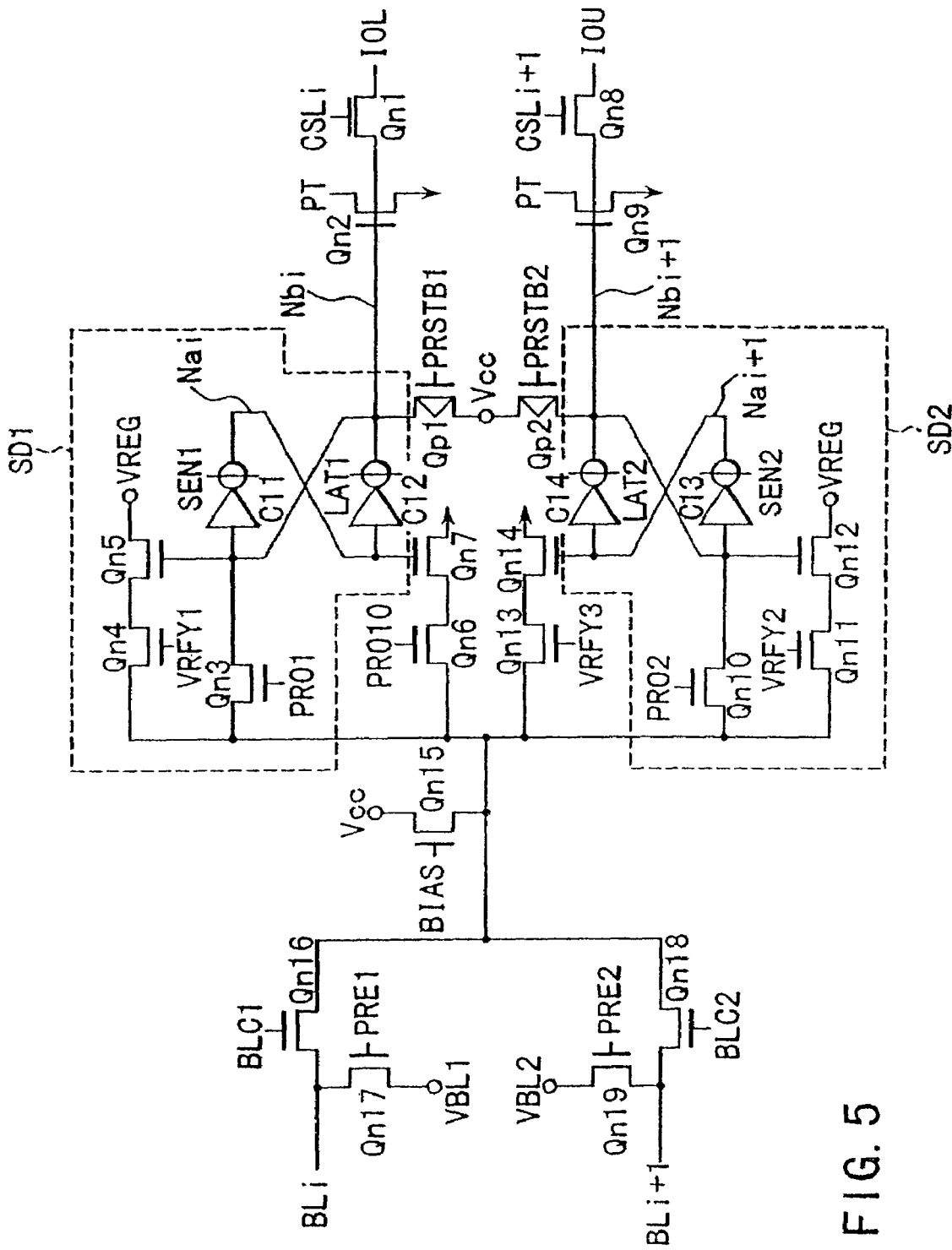
FIG. 5 is a circuit diagram of the data memory shown in FIG. 2.

FIG. 5 shows one of the data memories 10 (FIG. 2) which are identical.

As shown in FIG. 5, the data memory 10 comprises two sub-data circuits SD1 and SD2. The first sub-data circuit SD1 comprises clocked inverters C11 and C12 and n-channel MOS transistors Qn3, Qn4 and Qn5. The second sub-data circuit SD2 comprises clocked inverters C13 and C14 and n-channel MOS transistors Qn10, Qn11 and Qn12.

In the program operation, the first sub-data circuit SD1 and the second sub-data circuit SD2 store first sub-data and second sub-data, respectively. In the read operation, they store first sub-data and second sub-data, respectively.

When the node Nai in the first sub-data circuit SD1 is at "H" level, the circuit SD1 stores either first read sub-data of "1" or first sub-data of "1." When the node $Na_{i+1}$ in the second sub-data circuit SD2 is at "H" level, the circuit SD2 stores either second read sub-data of "1" or second sub-data of "1."

When the node Nai in the first sub-data circuit SD1 is at "L" level, the circuit SD1 stores either first read sub-data of "0" or first sub-data of "0." When the node $Na_{i+1}$ in the second sub-data circuit SD2 is at "L" level, the circuit SD2 stores either second read sub-data of "0" or second sub-data of "0."

The data memory 10 further comprises p-channel MOS transistors Qp1 and Qp2 and n-channel MOS transistors Qn1, Qn2, Qn8, Qn9, Qn6, Qn7, and Qn13 to Qn19.

The p-channel MOS transistors Qp1 and Qp2 receive signals PRSB1 and PRSB2, respectively. When the signals PRSB1 and PRSB2 fall to "L" level, the transistor Qp1 and Qp2 set sub-data of "0" in the first sub-data circuit SD1 and the first sub-data circuit SD2, respectively.

The n-channel MOS transistors Qn1 and Qn8 electrically connect the first sub-data circuit SD1 and the second sub-data circuit SD2 to the data input/output lines IOL and IOU, respectively. The gate electrode of the transistor Qn1 is connected to receive the output CSLi from the column decoder 3. The gate electrode of the transistor Qn8 is connected to receive the output $CSL_{i+1}$ from the column decoder 3.

When the output CSLi rises to "H" level, the first sub-data circuit SD1 of the data memory 10 connected to the bit lines BLi and $BL_{i+1}$ is electrically connected to the data input/output line IOL. The data input/output lines IOL and IOU are connected to the data input/output buffer 4. The lines IOL and IOU can therefore set sub-data items in the first sub-data circuit SD1 and the second sub-data circuit SD2 and output sub-data items read from the first sub-data circuit SD1 to the data input/output buffer 4.

The n-channel MOS transistors Qn2 and Qn9 detect whether the sub-data items stored in the sub-data circuits SD1 and SD2 are all "0" or not. The four-value NAND flash memory of FIG. 1 includes 2,112 data memories 10. Thus, when 2,112 first sub-data items and 2,112 second sub-data items are all "0," the common signal line PT and the ground line are electrically disconnected. This is why the n-channel MOS transistors Qn2 and Qn9 can detect whether the sub-data items stored in the sub-data circuits SD1 and SD2 are all "0" or not.

The n-channel MOS transistors Qn6 and Qn7 lower the voltage of the bit lines BL in accordance with the sub-data item stored in the first sub-data circuit SD1. The n-channel MOS transistors Qn13 and Qn14 lower the voltage of the bit lines BL in accordance with the sub-data item stored in the second sub-data circuit SD2. The n-channel MOS transistor Qn15 charges the bit lines BL.

The n-channel MOS transistors Qn16 and Qn18 control the electrical connection between the sub-data circuits SD1 and SD2, on the one hand, and the bit lines BLi and $BL_{i+1}$. They electrically connect the sub-data circuits SD1 and SD2 to the bit line BLi when signals BLC1 and BLC2 are at "H" level and "L" level, respectively.

When the signals BLC1 and BLC2 are at "L" level and "H" level, the first and second sub-data circuits SD1 and SD2 are connected to the bit line $BL_{i+1}$. The n-channel MOS transistors Qn17 and Qn19 control the electrical connection between the bit lines BLi and the source of voltage VBL1 and the electrical connection between the bit line $BL_{i+1}$ and the source of voltage VBL2.

When signal PRE1 is at "H" level, the bit line BLi is connected to the source of voltage VBL1. When signal PRE2 is at "H" level, the bit line $BL_{i+1}$ is connected to the source of voltage VBL2.

The data stored in the memory cell M or the signal indicating the data-storage state of the memory cell M is transferred through the bit line $BL_{i+1}$ or the bit line BL. In the first sub-data circuit SD1, the clocked inverter C11 functions as a sense amplifier for detecting the logic level of the signal on the bit line BL. In the second sub-data circuit SD2, the clocked inverter C13 functions as a sense amplifier for detecting the logic level of the signal on the bit line BL.

The clocked inverters C11 and C13 are identical in structure. One of them, or an inverter C1, will be described with reference to FIG. 6.

Figure 6:
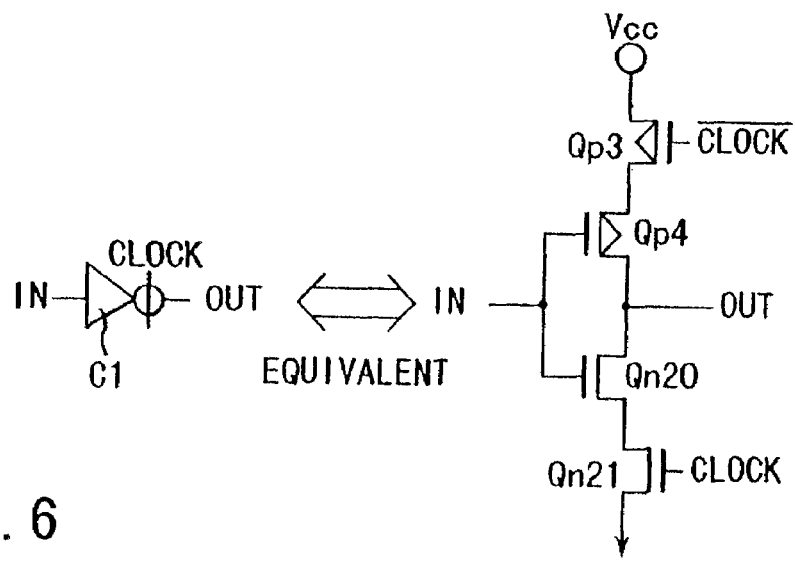
FIG. 6 is a circuit diagram of the clocked inverter shown in FIG. 5.

As shown in FIG. 6, the clocked inverter C1 comprises an n-channel MOS transistor Qn20, and a p-channel MOS transistor Qp4. The inverter circuit includes an input terminal IN and an output terminal OUT. The n-channel MOS transistor Qn21 and p-channel MOS transistor Qp3 are provided to activate or deactivate the inverter formed of Qp4 and Qn20 in accordance with signals CLOCK and /CLOCK supplied to them, respectively. (The signal /CLOCK has been obtained by inverting the signal CLOCK.) More precisely, the inverter is activated when the signals CLOCK and /CLOCK are respectively at "H" level and "L" level, and is deactivated when the signals CLOCK and /CLOCK are respectively at "L" level and "H" level.

The control signal and control voltage generator 7 shown in FIG. 1 generates various signals SEN1, LAT1, SEN2, LAT2, PRO1, PRO2, BLC1, BLC2, PRE1, PRE2, VRFY1, VRFY2, VRFY3, PRO10, PRSTB1, PRSTB2, BIAS, VBL1, VBL2 and VREG. These signals are used, in common, in all data memories 10 (FIG. 2). A signal PT is input to the control signal and control voltage generator 7. The power-supply voltage VCC is, for example, 3V.

The first sub-data circuit SD1 and the second sub-data circuit SD2 store either sub-data "0" or sub-data "1." Each sub-data circuit is designed to change sub-data "1" to sub-data "0" and hold sub-data "0" thus obtained.

The operation of the sub-data circuit 10 shown in FIG. 5 will be explained below.

First, the n-channel MOS transistors Qn4 and Qn5 or the n-channel MOS transistors Qn11 or Qn12 adjust the voltage of the bit line BL in accordance with the first sub-data or the second sub-data. Then, the clocked inverter C11 or C13 detects the voltage of the bit line BL when the signal PRO1 or PRO2 rises to "H" level.

Only when the first sub-data or the second sub-data is "0," the voltage of the bit line BL rises to "H" level. When the signal PRO1 or PRO2 rises to "H" level, the voltage of "H" level on the bit line BL is applied to the input terminal of the clocked inverter C11 or C13. As a result, the node Nai or the node $Na_{i+1}$ is set at "L" level.

The sub-data "0" is stored by means of the clocked inverters C12 or C14. This means that the sub-data "0" originally stored remains unchanged in the clocked inverters C12 or C14. The sub-data "1" originally stored in the clocked inverters C12 or C14 is changed to sub-data "0" when the voltage of the bit line BL is at "H" level. When the voltage of the bit line BL is at "L" level, the sub-data "1" originally stored in the clocked inverters C12 or C14 remains unchanged.

The data memories 10 are not limited to the type illustrated in FIG. 5. Rather, the data memories 10 may have any one of various other structures.

Figure 7:
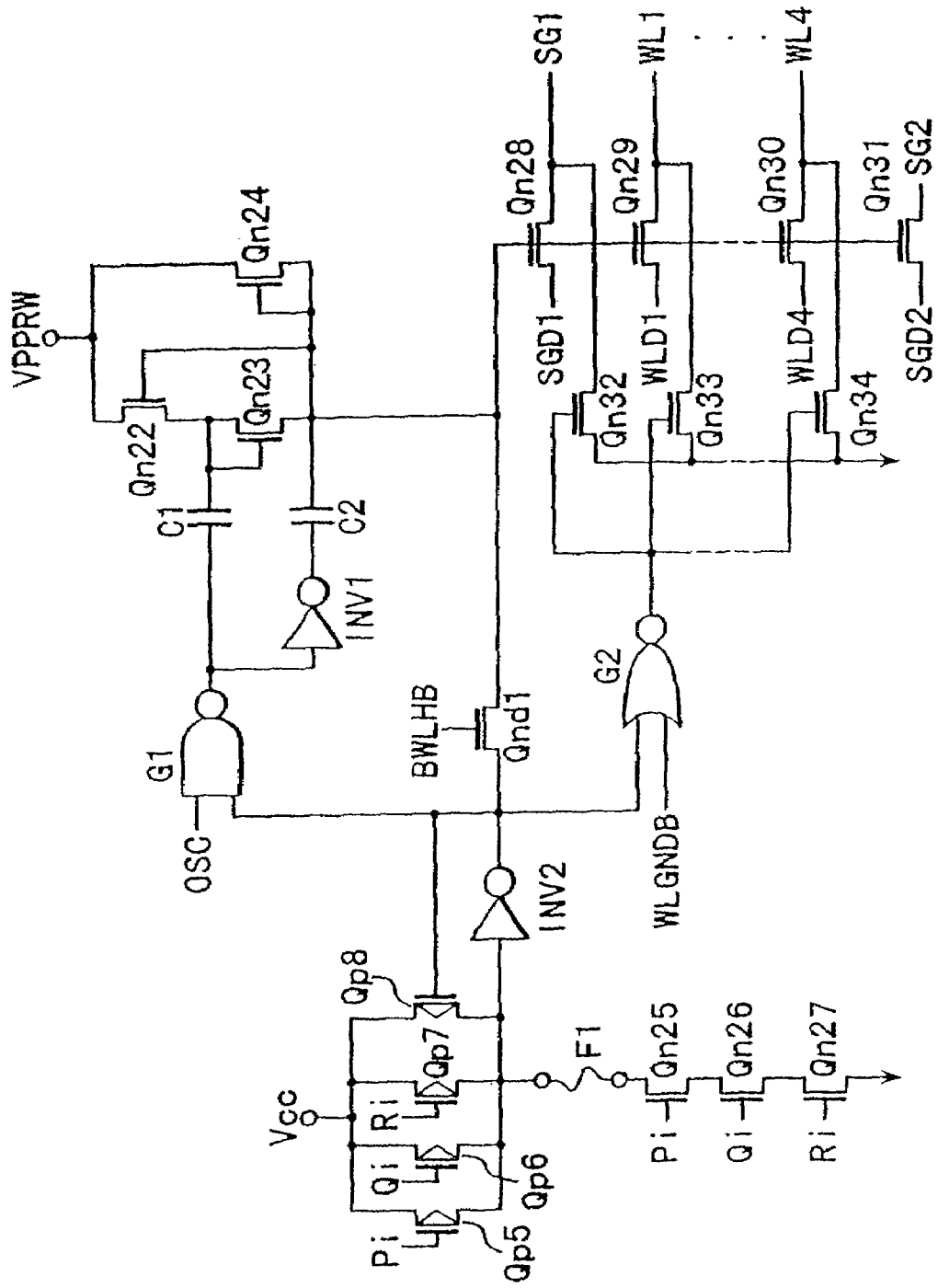
FIG. 7 is a circuit diagram of the word line controller shown in FIG. 1.

FIG. 7 shows the word line controller 6 in detail. Although FIG. 1 shows only one controller 6, the four-value NAND flash memory of FIG. 1 includes a plurality of word line controllers, each provided for one block of the memory cell array 1.

As shown in FIG. 7, three block-address signals Pi (i=0 to Np), Qi (i=0 to Nq) and Ri (i=0 to Nr) are input to each word line controller 6. Only a selected one of the signals Pi is at VCC. Similarly, only a selected one of the signals Qi is at VCC, and only a selected one of the signals Ri is at VCC. Np=7, Nq=7, and Nr=15. Hence, the block-address signals Pi, Qi and Ri can designate 1,024 blocks (=Np×Nq×Nr).

When the signals Pi, Qi and Ri are all at "H" level, the block they designate is selected. The signal Pi is input to an n-channel MOS transistor Qn25 and a p-channel MOS transistor Qp5. The signal Qi is input to an n-channel MOS transistor Qn26 and a p-channel MOS transistor Qp6.

The signal Ri is input to an n-channel MOS transistor Qn27 and a p-channel MOS transistor Qp7. When the signals Pi, Qi and Ri are all at "H" level, the input to an inverter INV2 is at "L" level, whereby the block designated by the signals Pi, Qi and Ri is selected. If the block thus selected is a defective one, a fuse F1 will be cut. Once the fuse F1 is cut, the input to the inverter INV2 remains at "H" level even if the signals Pi, Qi and Ri are all at "H" level. The inverter INV2 cooperates with a p-channel MOS transistor Qp8, fixing the input to the inverter INV2 at "H" level.

When this block is selected, the gates of p-channel MOS transistors Qn28 to Qn31 are set at "H" level by using a depletion-type n-channel MOS transistor Qnd1. Further, signal SGD1 is supplied to the selection gate line SG1, signals WLD1 to WLD4 are supplied to the word lines WL1 to WL4, and a signal SGD2 is supplied to the selection gate line SG2.

If the block has not been selected, the output of the NOR logic circuit G2 will rise to "H" level when a signal WLGNDB is at "L" level. N-channel MOS transistors Qn32 to Qn34 are therefore turned on. As a result, the selection gate line SG1 and the word lines WL1 to WL4 are connected to the ground.

N-channel MOS transistors Qn22 to Qn24, capacitors C1 and C2, an inverter INV1, and a NAND logic circuit G1 constitute a circuit for applying a voltage VPPRW to the gates of the n-channel MOS transistors Qn28 to Qn31 of a selected block. The voltage VPPRW is higher than the power-supply voltage VCC.

A signal OSC has its level changed between "L" and "H" levels at regular intervals. A signal BWLHB is set at 0V in order to transfer the voltage VPPRW. This is because, in a depletion-type n-channel MOS transistor Qnd1, the power-supply voltage VCC can be transferred from the drain to the source when the gate is at the power-source voltage VCC and cannot be so transferred when the gate is at 0V.

Signals OSC, BWLHB, WLGNDB, SGD1, WLD1 to WLD4, SGD2 and VPPRW are control signals output from the control signal and control voltage generator 7. They are used in common in all blocks of the memory cell array 1.

Figure 8:
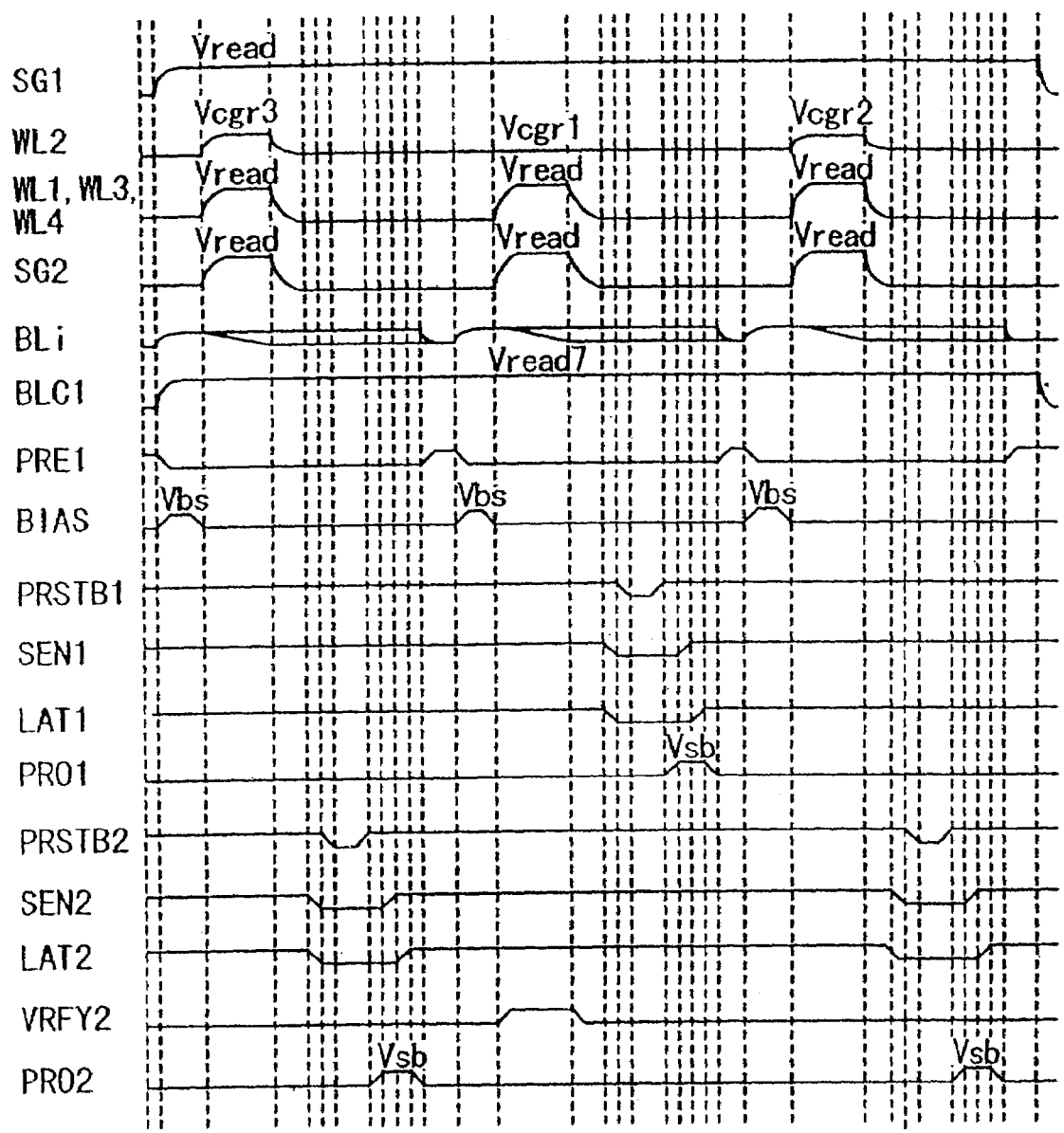
FIG. 8 is a timing chart explaining the read operation in the first embodiment.

FIG. 8 is a timing chart explaining how the four-value data is read from any selected memory cell.

Assume that the bit lines BL0, BL2, . . . , BLi, . . . , BL4222 are selected (only the bit line BLi is shown in FIG. 8) and that the word line WL2 is selected. The signals VBL1 and VBL2 remain at 0V, the signal BLC2 at 0V, and the signal PRE2 at VCC. The voltage of the bit line $BL_{i+1}$, the signals VRFY1 and VRFY3, the signal PRO10, the signals CSLi and $CSL_{i+1}$ and the signal VREG remain at 0V. Therefore, the signals VBL1, VBL2, BLC2, PRE2, the voltage of the bit line $BL_{i+1}$, the signals VRFY1, VRFY3, PRO10, CSLi and $CSL_{i+1}$ and VREG are not illustrated in FIG. 8.

First, the gate selection line SG1 of the selected block is set at 4.5V. At the same time, the signal PRE1 changes from VCC to 0V and the signal BLC1 changes from 0V to 7V, selecting the bit line BLi. The signal BIAS changes from 0V to 1.8V, charging the bit line BLi to 0.8V.

It is assumed that the threshold voltage of the n-channel MOS transistors Qn is 1V, unless otherwise specified. When the signal BIAS changes to 0V, the charging of the bit line BLi completes. Then, the selection gate line SG2 and nonselected word lines WL1, WL3 and WL4 of the selected block, which have been at 0V, are set at 4.5V, and the selection word line WL2, which has been at 0V, is set at 2.3V.

Table 1 presented below shows the relationship between the data items stored in the memory cells and the threshold voltages of the memory cells.

TABLE 1

| Memory Cell Data | Threshold Voltage |
| --- | --- |
| 0 | lower than 0 V |
| 1 | 0.3 V to 0.7 V |
| 2 | 1.5 V to 1.9 V |
| 3 | 2.7 V to 3.1 V |

Even after the selected word line WL2 is set at 2.3V, the bit line BLi remains at 0.8V as long as the memory cell stores data "3." If the memory cell stores any other data, the bit line BLi is set lower than 0.5V. Upon lapse of a predetermined time, the selection gate line SG2 and the nonselected word lines WL1, WL3 and WL4 are set at 0.0V.

After the selection gate line SG2 is reset at 0V, the signals SEN2 and LAT2 are set to 0V from VCC. When the signal PRSTB2 is set to 0V from VCC, the node $Nb_{i+1}$ is set at VCC. After the signal PRSTB2 is reset at VCC, the signal PRO2 is set to 1.6V from 0V.

As long as the memory cell stores data "3," the bit line BLi remains at 0.8V. Hence, the n-channel MOS transistor Qn10 is off, and the node Nbi+1 remains at VCC."

When the memory cell stores data other than "3," the bit line BLi is lower than 0.5V, n-channel MOS transistor Qn10 is turned on, and the potential of the node $Nb_{i+1}$ falls from the power-supply voltage VCC.

Assume that each bit line BL includes a capacitance of 5 pF and that the node $Nb_{i+1}$ includes a parasitic capacitance of 0.1 pF. Then, the potential of the node $Nb_{i+1}$ will fall to 0.55V or lower when the power-supply voltage VCC is 3V.

The signal SEN2 is reset to VCC, activating the clocked inverter C13. The voltage of the node $Nb_{i+1}$ is thereby sensed. The signal LAT2 is reset to VCC, activating the clocked inverter C14. The logic level of the signal detected is latched by the second sub-data circuit SD2.

The signal PRO2 is set at 0V again, electrically disconnecting the bit line BLi from the node $Nb_{i+1}$. Then, the signal PRE1 is reset at VCC, and so is the bit line $BL_{i+1}$. It is thus determined whether or not the memory cell M has a threshold voltage of 1.3V or higher.

The sub-data read from the second sub-data circuit SD2 is "0" only if the memory cell stores data "3." If the memory cell stores any other data, the sub-data read from the circuit SD2 is "1."

Next, it is sensed whether or not the memory cell M has a threshold voltage of 0.0V or higher. The signal PRE1 is set to 0V from VCC, and the signal BIAS is set to 1.8V from 0V. The bit line BLi is thereby charged to 0.8V. The signal BIAS is then set at 0V, and the bit line BLi is charged no more.

The selection gage line SG2 and nonselected word lines WL1, WL3 and WL4 of the selected block are set to 4.5V from 0V. At the same time, the signal VRFY2 is set to VCC from 0V. If the sub-data read from the second sub-data circuit SD2 is "0" (that is, if the memory cell M stores data "3"), the n-channel MOS transistor Qn12 is turned on, whereby the potential of the bit line BLi falls to 0V.

The word line WL2 selected remains at 0.0V. Hence, the bit line BLi remains at 0.8V if the memory cell stores either "1" or "2." If the memory cell stores either "0" or "3," the bit line BLi is set at 0.5V or lower.

Upon lapse of a predetermined time, the selection gate line SG2 and the nonselected word lines WL1, WL3 and WL4 are set at 0V. The signal VRFY2 is also reset at 0V.

After the selection gate line SG2 is reset at 0V, the signals SEN1 and LAT1 are set to 0V from VCC. When the signal PRSTB1 is set to 0V from VCC, the node Nbi is set at VCC. After the signal PRSTB1 is reset at VCC, the signal PRO1 is set to 1.6V from 0V.

If the memory cell stores either "1" or "2," the bit line BLi remains at 0.8V. The n-channel MOS transistor Qn3 is therefore off, and the node $Nb_{i+1}$ remains at VCC.

If the memory cell stores either "0" or "3," the bit line BLi is at 0.5V or lower. The n-channel MOS transistor Qn3 is therefore turned on, and the potential of the node Nbi falls from the power-supply voltage VCC.

Assume that each bit line BL includes a capacitance of 5 pF and that the node Nbi includes a parasitic capacitance of 0.1 pF. Then, the potential of the node Nbi falls to about 0.55V or lower.

The signal SEN1 is reset to VCC, activating the clocked inverter C11. The voltage of the node Nbi is thereby sensed. The signal LAT1 is reset to VCC, activating the clocked inverter C12. The logic level of the signal sensed is latched by the first sub-data circuit SD1.

The signal PRO1 is set at 0V again, electrically disconnecting the bit line BLi from the node Nbi. Then, the signal PRE1 is reset at VCC, and the bit line BLi is reset at 0V. It is thus sensed whether or not the memory cell M has a threshold voltage of 0.0V or higher.

The sub-data read from the first sub-data circuit SD1 is "0" if the memory cell stores either "1" or "2." If the memory cell stores either "0" or "3," the sub-data read from the first sub-data circuit SD1 is "1."

Next, it is determined whether or not the memory cell M has a threshold voltage of 1.1V or higher. The signal PRE1 is set to 0V from VCC, and the signal BIAS is set to 1.8V from 0V. The bit line BLi is thereby charged to 0.8V. The signal BIAS is then set at 0V, and the bit line BLi is charged no more.

The selection gage line SG2 and nonselected word lines WL1, WL3 and WL4 of the selected block are set to 4.5V from 0V, and the selected word line WL2 is set to 1.1V from 0V.

Once the selected word line WL2 is set at 1.1V, the bit line BLi remains at 0.8V if the memory cell stores either "2" or "3." If the memory cell stores either "0" or "1," the bit line BLi is set at 0.5V or lower. Upon lapse of a predetermined time, the selection gate line SG2 and nonselected word lines WL1, WL3 and WL4 are set at 0.0V.

After the selection gate line SG2 is reset at 0V, the signals SEN2 and LAT2 are set to 0V from VCC, and the signal PRSTB2 is set to 0V from VCC. Then, the node $Nb_{i+1}$ is set at VCC. After the signal PRSTB2 is reset at VCC, the signal PRO2 is set to 1.6V from 0V.

If the memory cell stores either "2" or "3," the bit line BLi remains at 0.8V. The n-channel MOS transistor Qn10 is therefore off, and the node $Nb_{i+1}$ remains at VCC.

If the memory cell stores either "0" or "1," the bit line BLi is at 0.5V or lower. The n-channel MOS transistor Qn10 is therefore on, and the potential of the node $Nb_{i+1}$ falls from the power-supply voltage VCC to about 0.55V or lower. The signal SEN2 is reset at VCC, activating the lock synchronous inverter C13. The potential of the node $Nb_{i+1}$ is thereby sensed.

The signal LAT2 is reset to VCC, activating the clocked inverter C14. The logic level of the signal detected is latched by the second sub-data circuit SD2. The signal PRO2 is set at 0V again, electrically disconnecting the bit line BLi from the node $Nb_{i+1}$. Then, the signal PRE1 is reset at VCC, and the bit line BLi is reset at 0V. It is thus determined whether or not the memory cell M has a threshold voltage of 1.1V or higher.

If the memory cell stores either "2" or "3," the sub-data read from the second sub-data circuit SD2 is "0." If the memory cell stores either "0" or "1," the sub-data read from the second sub-data circuit SD2 is "1." Finally, the selection gate line SG1 is reset at 0V, and the signal BLC1 is reset at 0V. The read operation is thereby completed.

As shown in FIG. 8, the data read from the memory cell M is stored into the data memory 10. When the signals CSLi and $CSL_{i+1}$ are set to VCC from 0V, the sub-data read from the first sub-data circuit SD1 is supplied to the data input/output line IOL, and the sub-data read from the second sub-data circuit SD2 is supplied to the data input/output line IOU. These data items thus supplied are supplied to the data input/output buffer 4 and output from the data input/output terminal 5.

Table 2 presented below shows the relationship between the data items stored in the memory cells, the sub-data items read from the first sub-data circuit SD1, and the sub-data items read from the second sub-data circuit SD2.

TABLE 2

| Memory Cell Data | First Sub-Data | Second Sub-Data |
|---|---|---|
| 0 | 1 | 1 |
| 1 | 0 | 1 |
| 2 | 0 | 0 |
| 3 | 1 | 0 |

Figure 9:
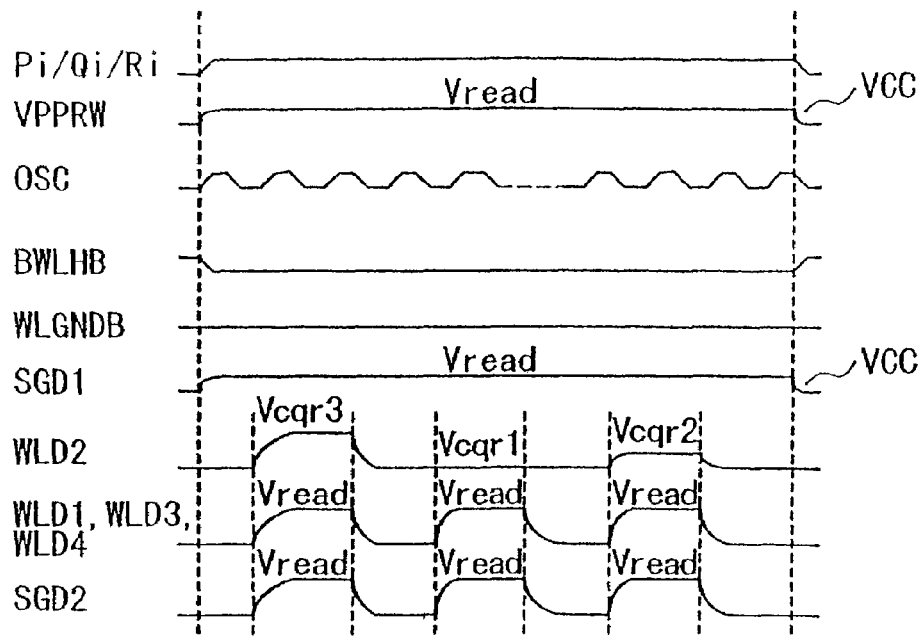
FIG. 9 is a timing chart explaining how the word line controller operates during the read operation in the first embodiment.

FIG. 9 is a timing chart explaining how the word line controller 6 operates during the read operation which has been described with reference to FIG. 8.

The address signals Pi, Qi and Ri of the selected block are set to VCC from 0V, the signal BWLHB is set to 0V from VCC, and the signal VPPRW is set to 4.5V from VCC. The signal OSC starts fluctuating between 0V and VCC. Then, the gates of the n-channel MOS transistors Qn28 to Qn31 of the selected block are set at 5.5V.

The gate voltage of the n-channel MOS transistors Qn28 to Qn31 is the sum of the signal VPPRW and the threshold voltage of the n-channel MOS transistor Qn24. Since the signal WLGNDB remains at 0V, the gates of the n-channel MOS transistors Qn32 to Qn34 of the selected block are at 0V. Hence, the n-channel MOS transistors Qn32 to Qn34 are nonconductive.

Conversely, the gates of the n-channel MOS transistors Qn28 to Qn31 of any nonselected block are at the voltage of 0V, and these transistors are nonconductive. The gates of the n-channel MOS transistors Qn32 to Qn34 of the any nonselected block are at VCC, and these transistors are conductive.

The signal-selection gate signal SGD1 is set to 4.5V from VCC, the signal-selection gate signal WLD2 is set to 2.3V from 0V, and the signal-selection gate signals WLD1, WLD3 and WLD4 are set to 4.5V from 0V. The selection gate line SG1 of the selected block is set to 4.5V from 0V. The selected word line WL2 is set to 2.3V from 0V, and the word lines WL1, WL3 and WL4 are set to 4.5V from 0V. The selection gate line SG2 is set to 4.5V from 0V.

Upon lapse of a predetermined time, the signal WLD2 is reset to 0V from 2.3V, the signals WLD1, WLD3 and WLD4 are reset to 0V from 4.5V, and the signal-selection gate signal SGD2 is reset to 0V from 4.5V. The word line WL2 of the selected block is reset to 0V from 2.3V, and the word lines WL1, WL3 and WL4 are reset to 0V from 4.5V.

Similarly, the signals WLD1, WLD3 and WLD4 are set to 4.5V from 0V, and the selection gate SDG2 is set to 4.5V from 0V. The word lines WL1, WL3 and WL4 of the selected block are set to 4.5V from 0V. The selection gate line SD2 is set to 4.5V from 0V.

Upon lapse of a predetermined time, the signals WLD1, WLD3 and WLD4 are reset to 0V from 4.5V, the word lines WL1, WL3 and WL4 are reset to 0V from 4.5V, and the selection gate line SG2 is reset to 0V from 4.5V.

The signal WLD2 is set again to 1.1V from 0V, the signals WLD1, WLD3 and WLD4 are set again to 4.5V from 0V, and the signal-selection gate signal SGD2 is set again to 4.5V from 0V. Also, the selected word line WL2 of the block is set again to 1.1V from 0V, the word lines WL1, WL3 and WL4 are set again to 4.5V from 0V, and the selection gate line SG2 is set again to 4.5V from 0V.

Upon lapse of a predetermined time, the signal WLD2 is set to 0V from 1.1V, the signals WLD1, WLD3 and WLD4 are set to 0V from 4.5V, and the signal-selection gate signal SGD2 is set to 0V from 4.5V. The selected word line WL2 of the block is reset to 0V from 1.1V, the word lines WL1, WL3 and WL4 are reset to 0V from 4.5V, and the selection gate line SG2 is reset to 0V from 4.5V.

The selection gate line SG1 and word lines WL1 to WL4 of the nonselected block are set at 0V by the n-channel MOS transistors Qn32 to Qn34. The address signals Pi, Qi and Ri of the selected block are set to 0V from VCC. The signal BWLHB is set to VCC from 0V, the signal VPPRW is set to VCC from 4.5V, and the signal OSC is set to 0V. The gates of the n-channel MOS transistors Qn28 to Qn31 of the selected block are reset to 0V.

The gates of the n-channel MOS transistors Qn32 to Qn34 of the selected block are reset to VCC, and these transistors are turned on. The block is, therefore, no longer selected. The selection gate line SG1 is reset to 0V.

Figure 10:
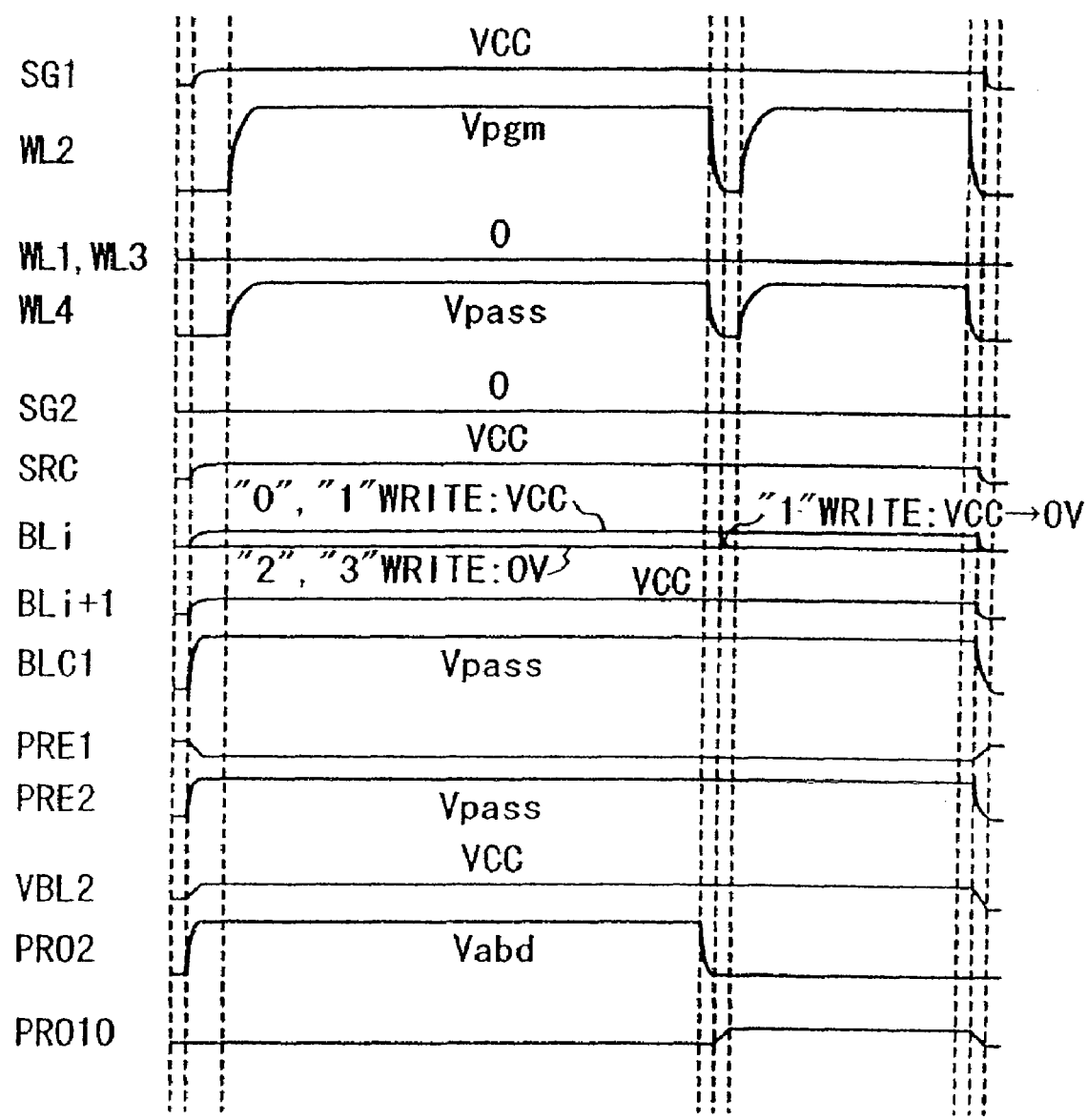
FIG. 10 is a timing chart explaining the program operation in the first embodiment.

FIG. 10 is a timing chart explaining the program operation (page-programming) in the first embodiment.

Assume that the bit lines BL0, BL2, . . . , BLi, . . . and BL4222 (only the bit line BLi is shown in FIG. 10), and that the word line WL2 is selected.

Prior to a program operation, control data is initially set in the data memory 10 connected to the bit line BLi, as will be explained below.

The initial sub-data to be stored into the first sub-data circuit SD1 is supplied to the input/output line IOL, and the initial sub-data to be stored into the second sub-data circuit SD2 is supplied to the input/output line IOU. The signals CSLi and $CSL_{i+1}$ are thereby set to VCC from 0V, and the initial sub-data items are stored into the sub-data circuits SD1 and SD2, respectively. Initial control data items can be set in any desired number of data memories 10 by setting the corresponding signals CSL to VCC from 0V.

The initial control data items and the initial sub-data items have the relationship shown in Table 3 presented below:

TABLE 3

| Initial Control Data | Initial Sub-Data of SD1 | Initial Sub-Data of SD2 |
| --- | --- | --- |
| 0 | 0 | 0 |
| 1 | 1 | 0 |
| 2 | 1 | 1 |
| 3 | 0 | 1 |

It is desired that the signals PRSTB1 and PRSTB2 be set to 0V from VCC and set back to VCC before all initial control data items are set, thereby to reset the control data items to "0" in all data memories 10.

As will be descried later, the data-storage state of the memory cell M is not changed by the control data "0." Hence, it suffices to set the initial control data from an external device in only desired ones of the 2,112 data memories 10. Needless to say, the initial control data may be set in all 2,112 data memories 10 from that external device.

The signals BLC2, BIAS, VRFY1 TO VRFY3 and PRO1 remain at 0V, the signals SEN1, LAT1, SEN2, LAT2, PRSTB1 and PRSTB2 remain at VCC, and the signals CSLi, $CSL_{i+1}$, VBL1 AND VREG remain at 0V. This is why these signals are not shown in FIG. 10.

In the program operation, the selection gate line SG1 of the selected block is set at VCC. At the same time, the signal PRE1 is set to 0V from VCC and the signal BLC1 is set to 7V from 0V, selecting the bit line BLi. If the second sub-data is "0" after the signal PRO2 has been set at 7V, a program-control voltage of VCC is applied to the bit line BLi.

If the second sub-data is "1," the bit line BLi remains at 0V. In other words, a program-control voltage of 0V is applied to the bit line BLi. In this case, the signal PRE2 is set to 7V from VCC and the signal VBL2 is set to VCC from 0V. A program-control voltage of VCC is thereby applied to the bit line $BL_{i+1}$ which is not selected. The common source line SRC is set at VCC, too, in order to prevent punch-through of the selection gate line SG2 of the selected block.

Thereafter, a program voltage Vpgm (16V to 20V) is applied to the selected word line WL2 of the block. The word lines WL1 and WL3 provided on the sides of the word line WL2 are set at 0V. The remaining word line WL4 is set at 11V. The threshold voltage of the memory cells M connected to any data memory 10 that stores control data "2" or "3" therefore increases. The memory cells M connected to any data memory 10 that stores control data "0" or "1"

maintain their state. The memory cells M connected to the nonselected bit line $BL_{i+1}$ maintain their state.

Upon lapse of 8 μsec, for example, the word line WL2 is reset to 0V from Vpgm and the word line WL4 is reset to 0V from 11V. At the same time, the signal PRO2 is reset to 0V from 7V.

At this time, the program-control voltage on the bit lines does not change. The signal PRO10 is set to VCC from 0V, and the bit line BLi is set at the program-control voltage of 0V if the first sub-data circuit SD1 stores sub-data "1." At this time, the program-control voltage on the bit line BLi is VCC if the associated data memory 10 stores control data "0," or is 0V if the associated data memory 10 stores control data "1," "2" or "3."

The selected word line WL2 of the block is set at the program voltage Vpgm (16V to 20V) again. The word line WL4 is thereby set at 11V.

Upon lapse of 2 μsec, for example, the selected word line WL2 is reset to 0V from Vpgm again, and the word line WL4 is reset to 0V from 11V again. Thereafter, the signal PRO10 is reset to 0V from VCC, the signal PRE1 is reset to VCC from 0V, and the bit line BLi is reset to 0V.

The signal VBL2 is set to 0V from VCC, whereby the bit line $BL_{i+1}$ is reset to 0V, too. The signal PRE2 is reset to VCC from 7V, the common source line SRC is reset to 0V from VCC, and the selection gate line SG1 is reset to 0V from VCC. Thus, the program operation is completed.

After the program operation, a program verification operation is performed as will be described below, in order to determine whether or not data has been sufficiently programmed into the memory cells. The program operation and the program verification operation are repeated until it is determined that data has been sufficiently programmed in all memory cells selected.

As shown in FIG. 10, the period during which the program-control voltage of 0V is applied to the bit line to program data "1" is shorter than the period during which the program-control voltage of 0V is applied to the bit line to program either data "2" or data "3." Hence, the number of times the program operation is repeated to program, for example, data "1", into a memory cell is almost equal to the number of times the program operation is repeated to program data "2" into the memory cell. Namely, the charge injected into the floating gate of the memory cell in a single program operation cycle to program "1" is smaller than the charge injected in a single program operation cycle to program "2" and even smaller than the charge injected in a single program operation to program "3."

For example, a prescribed program voltage may be applied to the control gate of the memory cell, and the source and drain thereof may be fixed at 0V. If so, the change ΔVt in the threshold voltage of the memory cell is given as:

$$\Delta Vt \approx \log(tp)$$

where tp is the time for which one cycle of the program operation is performed. The difference DVt between the threshold voltage of the memory cell and that of a memory cell for which the program operation is conducted for • times as long is given as:

$$DVt \approx \log(•\times tp) - \log(tp) = \log(•)$$

Obviously, the difference DVt is always constant.

The number of times the program operation is repeated until the memory cell comes to program data "1" can be made equal to the number of times the program operation is repeated until the memory cell comes to program data "2" because the program operation is repeated to store "1," each time for a shorter time than each program operation for programming "2." If the program operation is repeated the same number of times to program "1" into a memory cell as to program "2" into another memory cell, the data "2" can be programmed completely at the very time the data "1" is programmed completely.

If the charge injected in a single program operation for programming "1" is equal to the charge injected in a single program operation for programming "2," neither the data "2" nor data "3" is completely programmed at the time the data "1" is completely programmed. Then, it would take a long time to program data in a plurality of NAND-type cell units if data items are programmed into the cell units at the same time.

Figure 11:
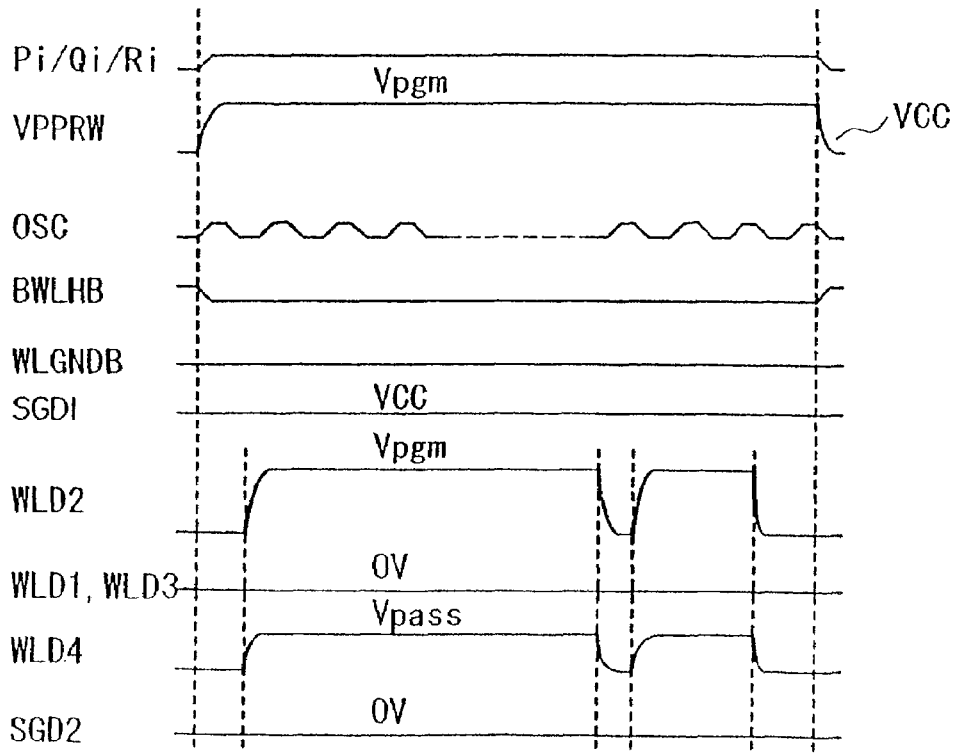
FIG. 11 is a timing chart explaining how the word line controller operates during the program operation in the first embodiment.

FIG. 11 is a timing chart explaining how the word line controller 6 operates during the program operation illustrated in FIG. 10.

The address signals Pi, Qi and Ri of the selected block are set to VCC from 0V, the signal BWLHB is set to 0V from VCC, and the signal VPPRW is set to Vpgm from VCC. The signal OSC then starts fluctuating between 0V and VCC. As a result, the gates of the n-channel MOS transistors Qn28 to Qn31 of the selected block are set at Vpgm+1V.

The gate voltage of the n-channel MOS transistors Qn28 to Qn31 is the sum of the signal VPPRW and the threshold voltage of the n-channel MOS transistor Qn24. Since the signal WLGNDB remains at 0V, the n-channel MOS transistors Qn32 to Qn34 of the selected block are nonconductive.

Therefore, the selection gate line SG1 of the block selected is set at VCC. Conversely, the n-channel MOS transistors Qn28 to Qn31 of any nonselected block have a gate voltage of 0V and are therefore off. The n-channel MOS transistors Qn32 to Qn34 of the nonselected block have a gate voltage of VCC and are therefore on.

The signal-selection gate signal WLD2 is set to Vpgm from 0V, and the signal-selection gate signal WLD4 is set to 11V from 0V. Hence, the word line WL2 of the selected block is thereby set to Vpgm from 0V, whereas the word line WL4 thereof is set to 11V from 0V.

Next, the signal WLD2 is set to 0V from Vpgm, and the signal WLD4 is set to 0V from 11V. As a result, the word line WL4 of the selected block is reset to 0V from Vpgm, and the word line WL4 thereof is reset to 0V from 11V.

The signal WLD2 is set again to Vpgm from 0V, and the signal WLD2 is set again to 11V from 0V. As a result, the word line WL2 of the selected block is set to Vpgm from 0V, while the word line WL4 thereof is set to 11V from 0V.

Then, the signal WLD2 is set to 0V from Vpgm, and the signal WLD4 is set to 0V from 11V. Thus, the word line WL2 of the selected block is reset to 0V from Vpgm, and the word line WL4 thereof is reset to 0V from 11V.

The selection gate line SG1 and word lines WL1 to WL4 of the nonselected block are set at 0V by virtue of the n-channel MOS transistors Qn32 to Qn34. The address signals Pi, Qi and Ri of the selected block are set to 0V from VCC. The signal BWLHB is set to VCC from 0V, the signal VPPRW is set to VCC from Vpgm, and the signal OSC is set at 0V. Hence, the n-channel MOS transistors Qn28 to Qn31 of the selected block have their gate voltage reset to VCC.

The n-channel MOS transistors Qn32 to Qn34 of the selected block have their gates set back to VCC and are therefore turned on. The block is therefore no longer selected, and its selection gate line SG1 is reset to 0V.

Figure 12:
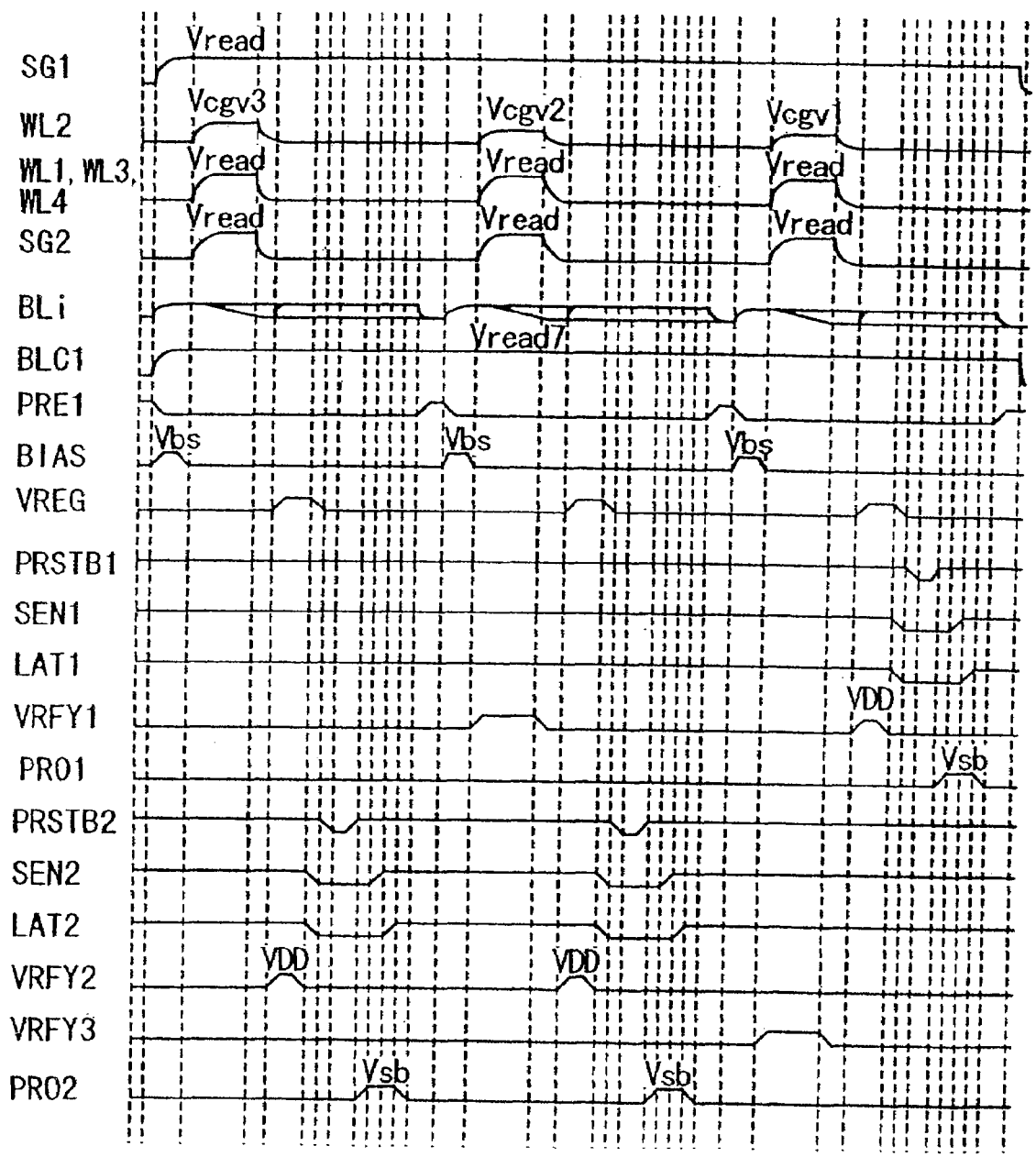
FIG. 12 is a timing chart explaining how program verification is achieved in the first embodiment.

FIG. 12 is a timing chart explaining how program verification is achieved on the memory cells into which data has been programmed by performing the program operation of FIG. 10 or the program operation of FIG. 11.

Assume that the bit lines BL0, BL2, ..., BLi, ... and BL4222 (only the bit line BLi is shown in FIG. 10), and that the word line WL2 is selected. The signals VBL1, VBL2, BLC2 and PRE2 and the voltage on the bit line $BL_{i+1}$ are not shown in FIG. 12, because the signals VBL1, VBL2 and BLC2 remain at 0V, the signal PRE2 remains at VCC, and the voltage on the bit line $BL_{i+1}$ remains at 0V. The signals PRO10, CSLi and $CSL_{i+1}$ are not depicted in FIG. 12, either, because they all remain at 0V.

First, the selection gate line SG1 of the selected block is set at 4.5V. At the same time, the signal PRE1 is set to 0V from VCC and the signal BLC1 is set to 7V from 0V, thereby selecting the bit line BLi. The signal BIAS is set to 1.8V from 0V, whereby the bit line BLi is charged to 0.8V. The signal BIAS is set at 0V, terminating the charging of the bit line BLi. The selection gate line SG2 of the selected block and the word lines WL1, WL3 and WL4 not selected are set to 4.5V from 0V, and the word lien WL2 selected is set to 2.7V from 0V.

When the selected word line WL2 is set at 2.7V, the bit line BLi remains at 0.8V if any memory cell connected to a data memory 10 which stores control data "3" has already stored data "3." If the memory cell has not been programmed data "3," the bit line BLi is set at 0.5V or lower. Since any memory cell connected to a data memory 10 which stores data "2" or data "1" has not stored data "3," the bit line BLi is set at 0.5V or lower.

Upon lapse of a predetermined time, the selection gate line SG2 and the nonselected word lines WL1, WL3 and WL4 are set at 0.0V. After the selection gate line SG2 is reset to 0V, the signal VREG is set to VCC from 0V and the signal VRFY2 is set to 2.5V from 0V. The bit line BLi is set at 1.5V if the second sub-data circuit SD2 stores second sub-data of "0." The signal VRFY2 is reset to 0V from 2.5V, and the signal VREG is reset to 0V.

The signals SEN2 and LAT2 are set to 0V from VCC. When the signal PRSTB2 is set to 0V from VCC, the node $Nb_{i+1}$ is set at VCC. After the signal PRSTB2 is reset to VCC, the signal PRO2 is set to 1.6V from 0V.

The bit line BLi remains at 0.8V if the memory cell connected to a data memory 10 which stores control data "3" has stored data "3." In this case, the n-channel MOS transistor Qn10 is off, and the node $Nb_{i+1}$ remains at VCC.

If the memory cell connected to the data memory 10 which stores control data "3" has not been programmed data "3," the bit line BLi is at 0.5V or lower. In this case, the n-channel MOS transistor Qn10 is turned on, and the potential of the node $Nb_{i+1}$ falls from VCC.

The bit line BLi remains at 0.5V or lower if the memory cell connected to a data memory 10 which stores control data "2" has not been programmed data "3." Thus, the n-channel MOS transistor Qn10 is turned on, and the potential of the node $Nb_{i+1}$ falls from VCC.

If the data memory 10 stores either control data "0" or control data "1," the second sub-data circuit SD2 stores the second sub-data of "0." The voltage of the bit line BLi is 1.5V. Hence, the n-channel MOS transistor Qn10 is off, and the node $Nb_{i+1}$ remains at VCC.

The signal SEN2 is reset to VCC, activating the clocked inverter C13. The voltage of the node $Nb_{i+1}$ is thereby sensed. When the signal LAT2 is reset to VCC, the clocked inverter C14 is activated, and the second sub-data circuit SD2 latches the logic level of the signal sensed. The signal PRO2 is set at 0V again, disconnecting the bit line BLi from the node $Nb_{i+1}$. Then, the signal PRE1 is set at VCC again, whereby the bit line BLi is reset to 0V.

Thus, it is determined whether or not data "3" has been programmed into the memory cell connected to the data memory 10 that stores control data "3." That is, verification read is completed for data "3."

At this time, the control data "3" is changed to "0" in the data memory 10 only if the memory cell connected to the data memory 10 has stored data "3." If the memory cell has not been programmed data "3," the control data remains unchanged in the data memory 10.

Next, it is determined whether or not data "2" has been programmed into the memory cell connected to the data memory 10 that store control data "2." In other words, verification read is started for data "2." The signal PRE1 is set to 0V from VCC and the signal BLC1 is set to 7V from 0V, selecting the bit line BLi. The signal BIAS is set to 1.8V from 0V, charging the bit line BLi to 0.8V. When the signal BIAS is set at 0V, the charging of the bit line BLi is completed.

Then, the selection gate line SG2 and the nonselected word lines WL1, WL3 and WL4 of the selected block are set to 4.5V from 0V, and the selected word line WL2 is set to 1.5V from 0V. At the same time, the signal VRFY1 is set to VCC from 0V. As a result, the n-channel MOS transistor Qn5 is turned on, lowering the potential of the bit line BLi to 0V if the first sub-data circuit SD1 stores first sub-data "0."

When the selected word line WL2 is set at 1.5V, the bit line BLi remains at 0.8V if data "2" has been programmed into the memory cell connected to the data memory 10 which stores control data "2." If data "2" has not been programmed into this memory cell, the bit line BLi is set at 0.5V or lower.

Since the memory cell connected to the data memory 10 storing control data "1" has not been programmed data "2," the bit line BLi is set to 0.5V or lower. The bit line BLi connected to any data memory storing control data "3" or "0" are set at 0V.

Upon lapse of a predetermined time, the selection gate line SG2 and the nonselected word lines WL1, WL3 and WL4 are set to 0.0V. The signal VRFY1 is reset at 0V, too. After the selection gate line SG2 is reset at 0V, the signal VREG is set to VCC from 0V, and the signal VRFY2 is set to 2.5V from 0V. If the second sub-data circuit SD2 stores the second sub-data of "0," the bit line BLi is set at 1.5V. The signal VRFY2 is reset to 0V from 2.5V. Then, the signal VREG is reset at 0V.

The signals SEN2 and LAT2 are set to 0V from VCC. When the signal PRSTB2 is set to 0V from VCC, the node $Nb_{i+1}$ is set at VCC. After the signal PRSTB2 is reset at VCC, the signal PRO2 is set to 1.6V from 0V. If the memory cell connected to the data memory 10 storing control data "2" has stored data "2," the bit line BLi remains at 0.8V. In this case, the n-channel MOS transistor Qn10 is off, and the node $Nb_{i+1}$ maintains a potential of VCC.

If the memory cell connected to the data memory 10 storing control data "2" has not been programmed data "2," the bit line BLi is at 0.5V or lower. In this case, the n-channel MOS transistor Qn10 is turned on, and the potential of the node $Nb_{i+1}$ falls from VCC.

The bit line BLi connected to the data memory 10 storing control data "3" is at 0.5V or lower. Hence, the n-channel MOS transistor Qn10 is turned on, and the potential of the node $Nb_{i+1}$ falls from VCC. If the data memory 10 stores either control data "0" or control data "1," the second sub-data circuit SD2 stores second sub-data of "0." In this case, the voltage of the bit line BLi is 1.5V. Therefore, the n-channel MOS transistor Qn10 is off, and the node $Nb_{i+1}$ maintains a potential of VCC.

The signal SEN2 is reset at VCC, activating the clocked inverter C13. The voltage of the node $Nb_{i+1}$ is thereby sensed. When the signal LAT2 is reset at VCC, the clocked inverter C14 is activated. As a result, the logic level of the signal detected is latched by the second sub-data circuit SD2.

The signal PRO2 is set at 0V again, electrically disconnecting the bit line BLi from the node $Nb_{i+1}$. Then, the signal PRE1 is reset at VCC, and the bit line BLi is reset at 0V. It is thus determined whether or not the memory cell connected to the data memory 10 storing control data "2" has stored data "2." That is, verification read is started for data "2."

If it is determined at this time that the memory cell connected to the data memory 10 storing control data "3" has already stored data "3," the control data is changed from "3" to "0" in the data memory 10. If it is determined that the memory cell connected to the data memory 10 storing control data "2" has stored data "2," the control data is changed from "2" to "1." In any other cases, the control data remains unchanged in the data memory 10.

Next it is determined whether the memory cell connecting to the data memory 10 storing control data "1" has stored data "1" or has not been programmed data "1." In other words, verification read of data "1" is started. First, the signal PRE1 is set to 0V from VCC, and the signal BLC1 is set to 7V from 0V. The bit line BLi is thereby selected. The signal BIAS is set to 1.8V from 0V, electrically charging the bit line BLi to 0.8V. The signal BIAS is then set at 0V, terminating the charging of the bit line BLi.

Next, the selection gate line SG2 of the selected block and the nonselected word lines WL1, WL3 and WL4 are set to 4.5V from 0V, and the selected word line WL2 is set to 0.3V from 0V. At the same time, the signal VRFY3 is set to VCC from 0V. The n-channel MOS transistor Qn13 is thereby turned on, lowering the potential of the bit line BLi to 0V, if the second sub-data circuit SD2 stores second sub-data "1." As a result, the potential of the bit line BLi falls to 0V.

When the selected word line WL2 is set at 0.3V, the bit line BLi remains at 0.8V if the memory cell connected to the data memory 10 storing control data "1" has already stored data "1." If this memory has not been programmed data "1," the bit line BLi is set at 0.5V or lower. The bit line BLi connected to any data memory storing control data "3" or "2" are set at 0V.

Upon lapse of a predetermined time, the selection gate line SG2 and the nonselected word lines WL1, WL3 and WL4 are set at 0.0V. The signal VRFY3 is reset at 0V, too. After the selection gate line SG2 is reset at 0V, the signal VREG is set to VCC from 0V, and the signal VRFY1 is set to 2.5V from 0V. If the first sub-data circuit SD2 stores the first sub-data of "0," the bit line BLi is set at 1.5V. The signal VRFY1 is reset to 0V from 2.5V. Then, the signal VREG is reset at 0V.

The signals SEN1 and LAT1 are set to 0V from VCC. When the signal PRSTB1 is set to 0V from VCC, the node $Nb_{i+1}$ is set at VCC. After the signal PRSTB1 is reset at VCC, the signal PRO1 is set to 1.6V from 0V. If the memory cell connected to the data memory 10 storing control data "1" has stored data "1," the bit line BLi remains at 0.8V. In this case, the n-channel MOS transistor Qn3 is off, and the node $Nb_{i+1}$ maintains a potential of VCC.

If the memory cell connected to the data memory 10 storing control data "2" has not been programmed data "1,"  the bit line BLi is at 0.5V or lower. In this case, the n-channel MOS transistor Qn3 is turned on, and the potential of the node $Nb_{i+1}$ falls from VCC. The bit line BLi connected to the data memory storing control data "2" is at 0.5V or lower. Hence, the n-channel MOS transistor Qn3 is turned on, and the potential of the node Nbi falls from VCC.

If the data memory 10 stores either control data "0" or control data "3," the first sub-data circuit SD1 stores the first sub-data of "0." The voltage of the bit line BLi is 1.5V. Hence, the n-channel MOS transistor Qn3 is off, and the node $Nb_{i+1}$ remains at VCC.

The signal SEN1 is reset to VCC, activating the clocked inverter C11. The voltage of the node Nbi is thereby sensed. When the signal LAT1 is reset to VCC, the lock synchronous inverter C12 is activated, and the first sub-data circuit SD1 latches the logic level of the signal detected.

The signal PRO1 is set at 0V again, disconnecting the bit line BLi from the node Nbi. Then, the signal PRE1 is set at VCC again, whereby the bit line BLi is reset to 0V. Thus, it is determined whether or not data "3" has been programmed into the memory cell connected to the data memory 10 that stores control data "1." That is, verification read is completed for data "1."

At this time, the control data "3" is changed to "0" in the data memory 10 only if the memory cell connected to the data memory 10 has stored data "3."

The control data "2" is changed to "0" in the data memory 10 only if the memory cell connected to the data memory 10 has stored data "2."

The control data "1" is changed to "0" in the data memory 10 only if the memory cell connected to the data memory 10 has stored data "1." In any other cases, the control data remains unchanged in the data memory 10.

Finally, the selection gate line SG1 is set at 0V, and the signal BLC1 is set at 0V again. The read operation is thereby completed.

Figure 13:
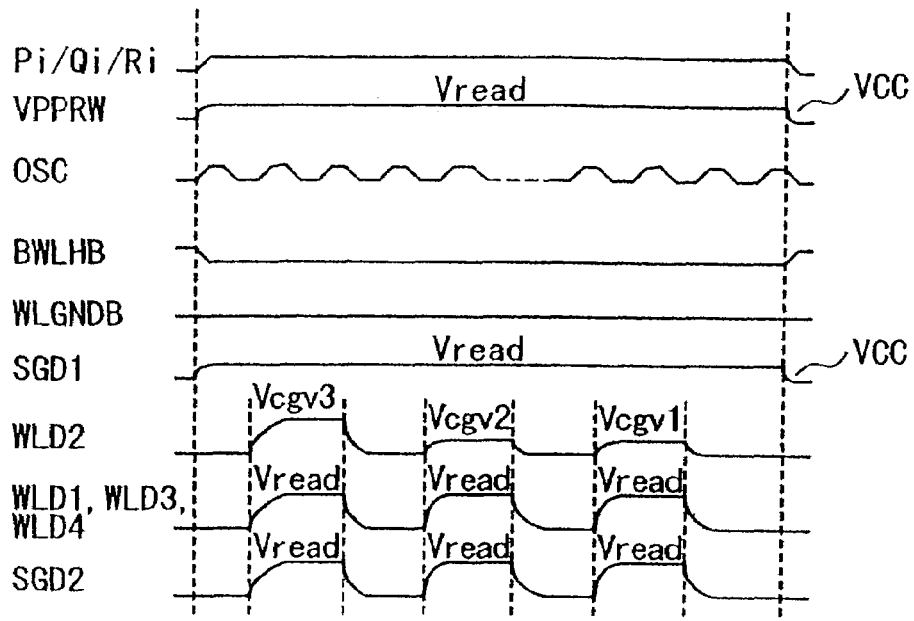
FIG. 13 is a timing chart explaining how the word line controller operates during the program verification operation in the first embodiment.

FIG. 13 is a timing chart explaining how the word line controller 6 operates during the program verification operation.

The address signals Pi, Qi and Ri of the selected block are set to VCC from 0V, the signal BWLHB is set to 0V from VCC, and the signal VPPRW is set to 4.5V from VCC. The signal OSC starts fluctuating between 0V and VCC. Then, the gates of the n-channel MOS transistors Qn28 to Qn31 of the selected block are set at 5.5V.

The gate voltage of the n-channel MOS transistors Qn28 to Qn31 is the sum of the signal VPPRW and the threshold voltage of the n-channel MOS transistor Qn24. Since the signal WLGNDB remains at 0V, the gates of the n-channel MOS transistors Qn32 to Qn34 of the selected block are at 0V. Hence, the n-channel MOS transistors Qn32 to Qn34 are nonconductive.

Conversely, the gates of the n-channel MOS transistors Qn28 to Qn31 of any nonselected block are at the voltage of 0V, and these transistors are nonconductive. The gates of the n-channel MOS transistors Qn32 to Qn34 of the any nonselected block are at VCC, and these transistors are conductive.

The signal-selection gate signal SGD1 is set to 4.5V from VCC, the signal WLD2 is set to 2.7V from 0V, and the signals WLD1, WLD3 and WLD4 are set to 4.5V from 0V. The selection gate line SG1 of the selected block is set to 4.5V from 0V. The selected word line WL2 is set to 2.7V from 0V, and the nonselected word lines WL1, WL3 and WL4 are set to 4.5V from 0V. The selection gate line SG2 is set to 4.5V from 0V.

Upon lapse of a predetermined time, the signal WLD2 is reset to 0V from 2.7V, the signals WLD1, WLD3 and WLD4 are reset to 0V from 4.5V, and the signal-selection gate signal SGD2 is reset to 0V from 4.5V. The selected word line WL2 of the selected block is reset to 0V from 2.7V, the word lines WL1, WL3 and WL4 are reset to 0V from 4.5V and the selection gate line SG2 is reset to 0V from 4.5V.

Similarly, the signal WLD2 is set to 1.5V from 0V, and the signals WLD1, WLD3 and WLD4 and the gate-selection signal SGD2 are set to 4.5V from 0V. The selected word line WL2 of the selected block is set to 1.5V from 0V, and the nonselected word lines WL1, WL3 and WL4 thereof are set to 4.5V from 0V. The signal SG2 is set to 4.5V from 0V.

Upon lapse of a predetermined time, the signal WLD2 is set to 0V from 1.5V, the signals WLD1, WLD3 and WLD4 are reset to 0V from 4.5V, and the and the signal-selection gate signal SGD2 is reset to 0V from 4.5V. The selected word line WL2 of the selected block is reset to 0V from 1.5V, the word lines WL1, WL3 and WL4 are reset to 0V from 4.5V and the signal SG2 is reset to 0V from 4.5V.

The signal WLD2 is set again to 0.3V from 0V, the signals WLD1, WLD3 and WLD4 are set again to 4.5V from 0V, and the signal-selection gate signal SGD2 is set again to 4.5V from 0V. Also, the selected word line WL2 of the selected block is set again to 3.3V from 0V, the word lines WL1, WL3 and WL4 are set again to 4.5V from 0V, and the selection gate line SG2 is set again to 4.5V from 0V.

Upon lapse of a predetermined time, the signal WLD2 is set to 0V from 0.3V, the signals WLD1, WLD3 and WLD4 are set to 0V from 4.5V, and the signal-selection gate signal SGD2 is set to 0V from 4.5V. The selected word line WL2 of the block is reset to 0V from 0.3V, the word lines WL1, WL3 and WL4 are reset to 0V from 4.5V, and the selection gate line SG2 is reset to 0V from 4.5V.

The selection gate line SG1 and word lines WL1 to WL4 of the nonselected block are set at 0V by the n-channel MOS transistors Qn32 to Qn34. The address signals Pi, Qi and Ri of the selected block are set to 0V from VCC. The signal BWLHB is set to VCC from 0V, the signal VPPRW is set to VCC from 4.5V, and the signal OSC is set to 0V. The gates of the n-channel MOS transistors Qn28 to Qn31 of the selected block are reset to 0V.

The gates of the n-channel MOS transistors Qn32 to Qn34 are set to VCC again, and these transistors are turned on. The block is, therefore, no longer selected. The selection gate line SG1 is set to 0V again.

The control data stored in the data memory 10 is changed in accordance with the programmed status of the memory cell, as is shown in Table 4 presented below:

TABLE 4

| Written status of Memory Cell | Control Data before Verify | Control Data after Verify |
|---|---|---|
| 0, 1, 2, or 3 | 0 | 0 |
| 1(uncompleted) | 1 | 1 |
| 1 | 1 | 0 |
| 2(uncompleted) | 2 | 2 |
| 2 | 2 | 0 |
| 3(uncompleted) | 3 | 3 |
| 3 | 3 | 0 |

The program operation shown in FIGS. 10 and 11 and the program verification shown in FIGS. 12 and 13 are repeated until control data "0" is set into all data memories 10. Then, data is programmed into the memory cells M.

Whether or not the control data "0" has been set into all data memories 10 can be determined by detecting whether or not the signal PT is set at the ground potential. The control signal and control voltage generator 7 controls the level of the signal PT. More specifically, the generator 7 sets the signal PT at "L" level if the signal PT is at the ground potential, and at "H" level if the signal PT is not at the ground level.

Figure 14:
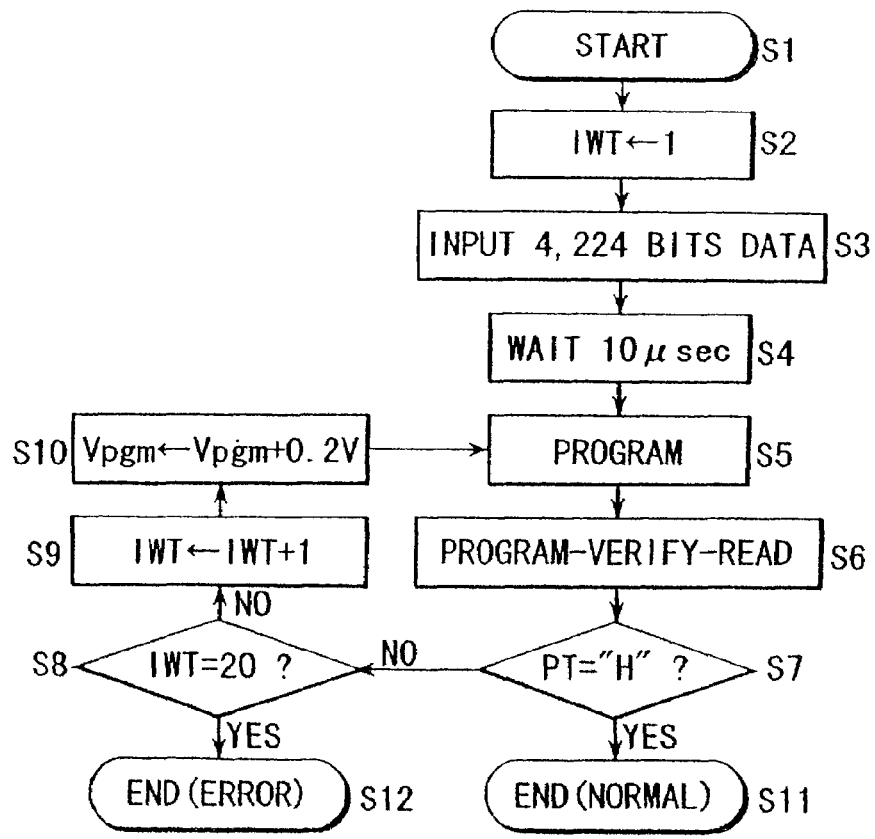
FIG. 14 is a flow chart representing the programming algorithm in the first embodiment.

FIG. 14 is a flow chart representing the programming algorithm devised to repeat the program operation and the program verification operation, thereby to program data into the memory cell M.

The algorithm is controlled by the control signal and control voltage generator 7. A program start command is input to the generator 7 (Step S1). In response to the program start command the generator 7 set a variable IWT to 1 (Step S2). Then, 4,224 bits of data are input (Step S3). The four-value NAND flash memory shown in FIG. 1 waits for 10 μsec, until the program voltage Vpgm is generated (Step S4).

As shown in FIGS. 10 and 11, the program operation is performed as has been explained with reference to FIGS. 10 and 11 (Step S5). Next, the program verification operation is carried out as has been described with reference to FIGS. 12 and 13 (Step S6). It is determined whether the signal PT is at "H" level or not (Step S7). If YES in Step S7, the program operation is normally terminated (Step S11). If NO in Step S7, it is determined whether the variable IWT is 20 or not (Step S8).

If the variable IWT is less than 20, it is incremented by one (Step S9). Further, the program voltage Vpgm is increased by 0.2V (Step S10). Then, the operation returns to Step 5, in which the program operation is performed again. The program operation and the program verification operation are repeated until the signal PT acquires "H" level.

If the variable IWT is 20, it is assumed that an error has been made in the program operation. In this case, the program operation is terminated (Step S12).

Figure 15:
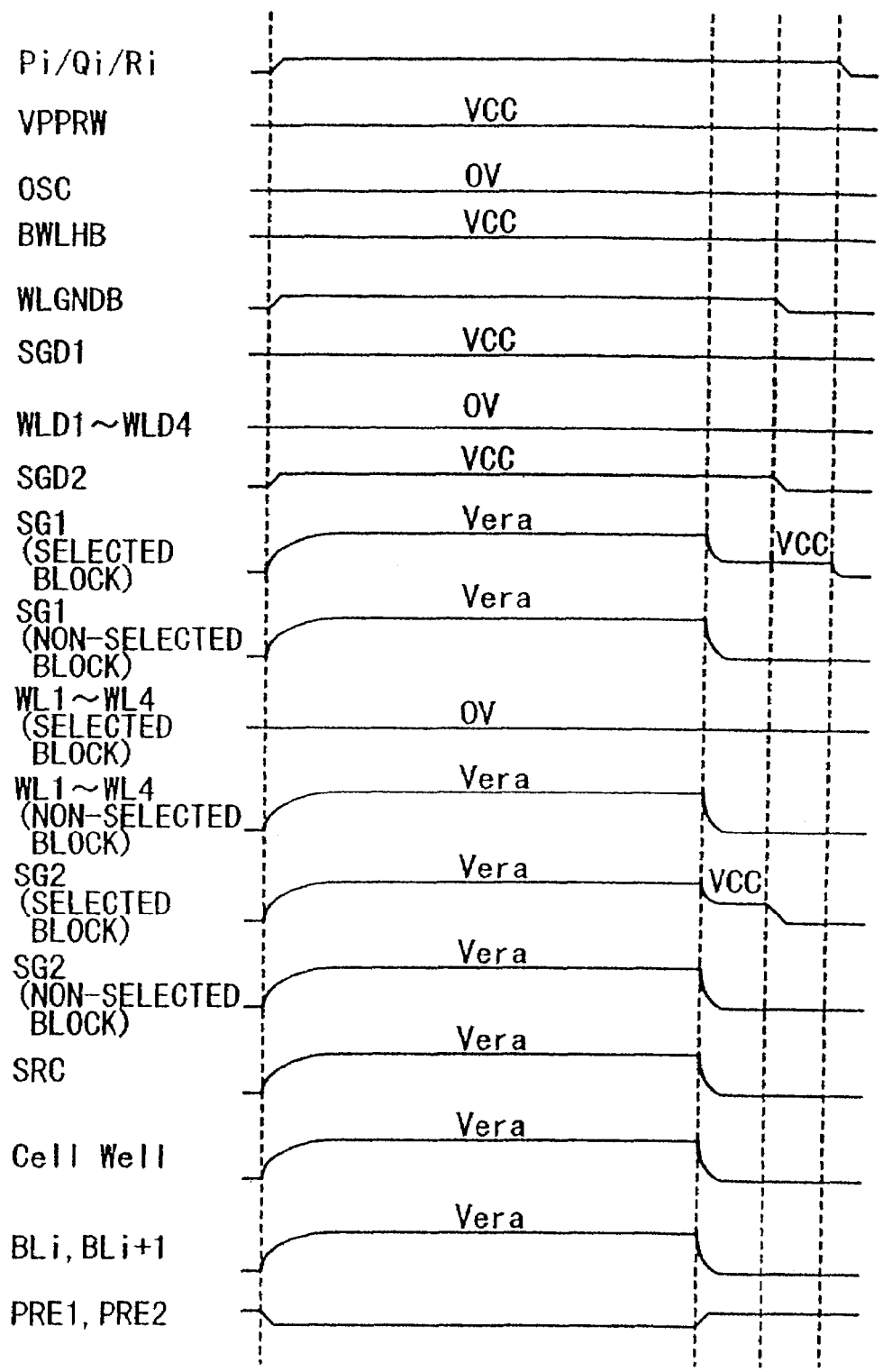
FIG. 15 is a timing chart explaining the erase operation in the first embodiment.

FIG. 15 is a timing chart explaining the erase operation in the four-value NAND flash memory shown in FIG. 1.

The erase operation is performed on all memory cells of the selected block at the same time. That is, one block of data is simultaneously erased. How the erase operation is effected will be explained below.

The signals BLC1 and BLC2 remain at 0V. So do the signals VBL1 AND VBL2. The address signals Pi, Qi an Ri of the selected block are set to VCC from 0V, and the signal WLGNDB is set to VCC from 0V. The signals BWLHB are VPPRW are set at VCC, whereas the signal OSC is at 0V. The n-channel MOS transistors Qn28 to Qn31 of the selected block have their gates set at VCC.

The n-channel MOS transistors Qn32 to Qn34 of the selected block have their gates set at V0 and are therefore off. The n-channel MOS transistors Qn28 to Qn31 of the nonselected block are set at 0V and are therefore off, too. Since the signal WLGNDB is at VCC, the n-channel MOS transistors Qn28 to Qn31 of the nonselected block have their gates set at V0 and are therefore off, too.

The signal-selection gate signal SGD1 is set at VCC, and the signal-selection gate signals WLD1 to WLD4 are set at 0V. The signal-selection gate signal SGD2 is set to VCC from 0V. The common source line SRC is set into a floating state. The signals PRE1 and PRE2 are set to 0V from VCC, setting all bit lines BL into floating state, too. In the present embodiment, the memory cell array 1 is formed in a p-type well 11. The potential of the p-type well 11, or the signal Cell Well is set to erase voltage Vera from 0V.

The potential of the common source line SRC and the potentials of the bit lines BL are set from 0V to a voltage substantially equal to the erase voltage Vera, while a forward current is flowing in the p-type well 11 and the n-type diffusion layers 12. All selection gate lines SG1 and SG2 of the memory cell array 1 are set at the erase voltage Vera due to the capacitive coupling between them and the p-type well 11.

The word lines WL1 to WL4 of the nonselected block are set at Vera, too, due to the capacitive coupling between them and the p-type well 11. On the other hand, the word lines WL1 to WL4 of the selected block remain at 0V.

Hence, in the selected memory cell, data is erased because of the erase voltage applied between the p-type well 11 and the control gate 16. In any nonselected memory cell, data is not erased since the erase voltage is applied to both the p-type well 11 and the control gate 16.

The common source line SRC is set at 0V and, thus released from the floating state. The signals PRE1 and PRE2 are set to VCC from 0V. The bit lines BL are set at 0V, and the signals Cell Well is set to 0V from the erase voltage Vera. As a result, all word lines WL are set at 0V again, and both selection gate lines SG1 and SG2 of the nonselected block are set at 0V again. Both selection gate lines SG1 and SG2 of the selected block are set at VCC. The signal WLGNDB is set to 0V from VCC again, and the signal-selection gate signal SGD2 is set to 0V from VCC again. The selection gate line SG2 of the selected block is thereby reset at 0V.

Finally, the address signals Pi, Qi and Ri of the selected block are set to 0V from VCC. The n-channel MOS transistors Qn28 to Qn31 of the selected block therefore have their gates reset at 0V. The n-channel MOS transistors Qn32 to Qn34 of the selected block therefore have their gates reset at VCC and are thus turned on. The block is therefore no longer selected. Thus, the selection gate line SG1 of the block is set at 0V again.

Figure 16:
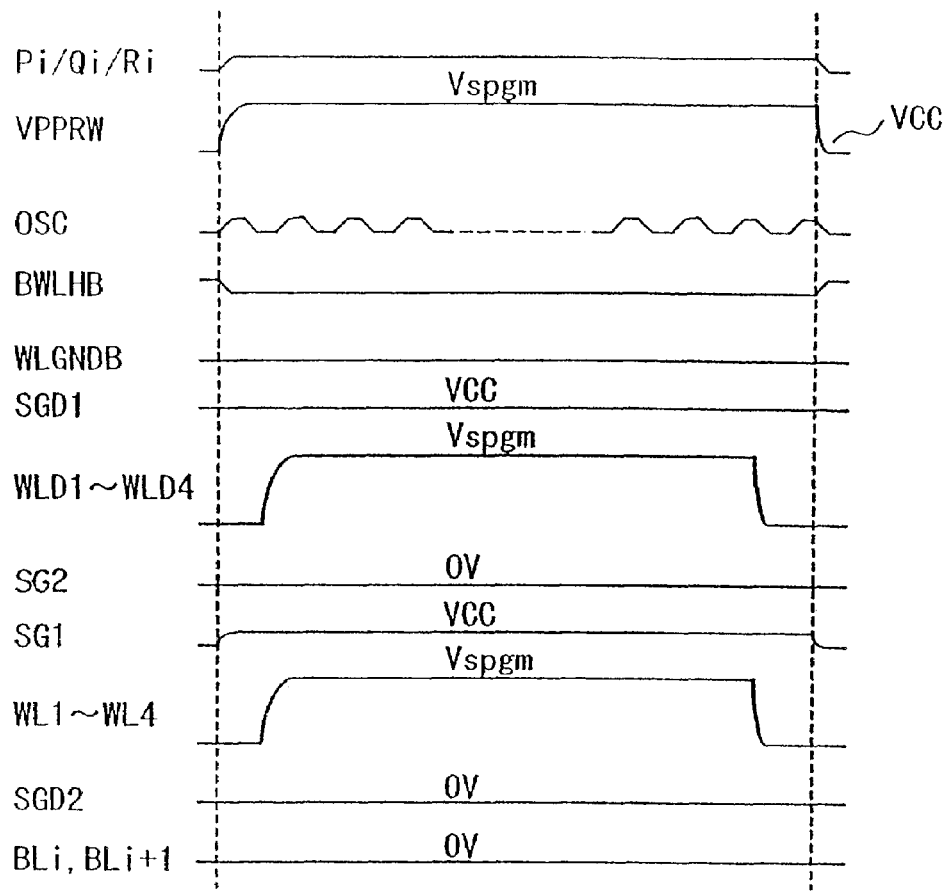
FIG. 16 is a timing chart explaining the soft-program operation in the first embodiment.

FIG. 16 is a timing chart explaining the soft-program operation carried out after the erase operation.

The soft-program operation is performed on all memory cells of the selected block at the same time, as will be described below.

The signals BLC1 and BLC2 and the signals VBL1 and VBL2 remain at 0V, and the signals PRE1 and PRE2 remain at VCC. Therefore, all bit lines BL remain at 0V. The address signals Pi, Qi and Ri of the selected block are set to VCC from 0V. The signal BWLHB is set to 0V from VCC, and the signal VPPRW is set from VCC to the soft-program voltage Vspgm. The signal OSC starts fluctuating between 0V and VCC. Then, the gates of the n-channel MOS transistors Qn28 to Qn31 of the selected block are set at Vspgm+1V.

The gate voltage of the n-channel MOS transistors Qn28 to Qn31 is the sum of the signal VPPRW and the threshold voltage of the n-channel MOS transistor Qn24. Since the signal WLGNDB remains at 0V, the n-channel MOS transistors Qn32 to Qn34 of the selected block have their gates set at 0V and are nonconductive. As a result, the selection gate line SG1 of the selected block is set at VCC.

Conversely, the n-channel MOS transistors Qn28 to Qn31 of any nonselected block have their gates set at the voltage of 0V, and are therefore are nonconductive. The n-channel MOS transistors Qn32 to Qn34 of the nonselected block are at VCC, and are thus on.

The signals WLD1 to WLD4 are set from 0V to the soft-program voltage Vspgm, whereby the word lines WL1 to WL4 of the selected block are set from 0V to the soft-program voltage Vspgm. Upon lapse of a predetermined time, the signals WLD1 to WLD4 are set from Vspgm to 0V again. The word lines WL1 to WL4 of the selected block are thereby reset to 0V from Vspgm.

The selection gate line SG1 and word lines WL1 to WL4 of the nonselected block are set at 0V by the n-channel MOS transistors Qn32 to Qn34. The address signals Pi, Qi and Ri of the selected block are set to 0V from VCC. The signal BWLHB is set to VCC from 0V, the signal VPPRW is set to VCC from Vpgm, and the signal OSC is set to 0V. The gates of the n-channel MOS transistors Qn28 to Qn31 of the selected block are reset to 0V.

The gates of the n-channel MOS transistors Qn32 to Qn34 are set to VCC again, and these transistors are turned on. The block is, therefore, no longer selected. The selection gate line SG1 is set to 0V again.

Figure 17:
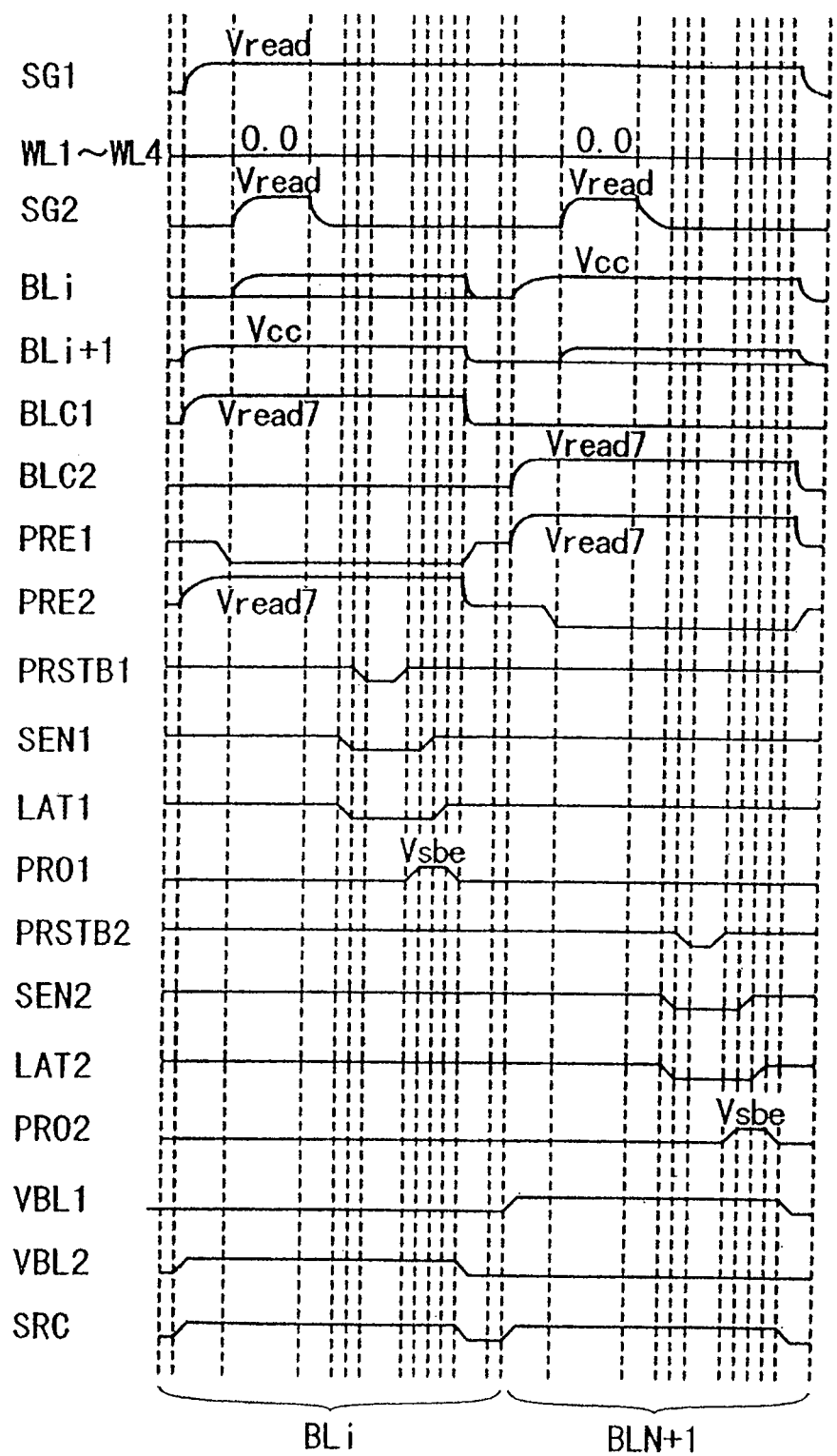
FIG. 17 is a timing chart explaining how erase verification is achieved in the first embodiment.

FIG. 17 is a timing chart explaining how erase verification is achieved after the soft-programming has been achieved as described above, in order to detect the erased state of the memory cells.

The signals VREG, VRFY1, VRFY2, VRFY3, PRO10 and BIAS all remain 0V. These signals are, therefore, not illustrated in FIG. 17. The signals OSLi and OSL$_{i+1}$ are not shown in FIG. 17, either, because they also remain at 0V.

At first, the selection gate line SG1 of the selected block is set at 4.5V. At the same time, the signal PRE2 is set to 7V from 0V, while the signal VBL2 is set to VCC from 0V. The bit line BL$_{i+1}$ is thereby charged to VCC. At this time, the common source line SRC is also set to VCC from 0V. The signal PRE1 is set to 0V from VCC, setting the bit line BLi into floating state. Then, the selection gate line SG2 of the selected block is set to 4.5V from 0V. The word lines WL1 to WL4 of the selected block remain at 0V.

When the selection gate line SG2 of the selected block is set to 4.5V, the bit line BLi is at 0.7V or lower if the threshold voltage of the memory cells is 0.7V or lower. Upon lapse of a predetermined time, the selection gate line SG2 is set to 0.0V. Thereafter, the signals SEN1 and LAT1 are set to 0V from VCC. The signal PRSTB1 is set to 0V from VCC, thereby setting the node Nbi at VCC.

After the signal PRSTB1 has been reset to VCC, the signal PRO1 is set to 1.8V from 0V. The bit line BLi is at 0.7V or lower, provided the memory cells have a threshold voltage of −0.7V or higher. Thus, the n-channel MOS transistor Qn3 is turned on, and the potential of the node Nbi falls from VCC. If the bit line BLi is at 0.8V or higher, the n-channel MOS transistor Qn3 is turned on, and the potential of the node Nbi is maintained at VCC. The signal SEN1 is set to VCC again, activating the clocked inverter C11. The voltage of the node Nbi is thereby sensed.

When the signal LAT1 is set to VCC again, the clocked inverter C12 is activated. The first sub-data circuit SD1 latches the logic level of the signal sensed. The signal PRO1 is set at 0V again, disconnecting the bit line BLi from the node Nbi. Then, the signal BLC1 is set to 0V from VCC, and the signal PRE1 is set to VCC again. The bit line BLi is thereby reset to 0V.

The signal PRE2 is set to VCC from 7V, and the signal VBL2 is set to 0V from VCC. The bit line BL$_{i+1}$ is thereby reset to 0V. The common source line SRC is set to 0V from VCC, too. If at least one of the four memory cells of the selected block, which are connected to the bit line BLi, has a threshold voltage of −0.7V or higher, read sub-data "1" is stored into the first sub-data circuit SD1.

Further, the signal PRE1 is set to 7V from VCC, and the signal VBL1 is set to VCC from 0V. The bit line BLi is thereby charged to VCC. At this time, the common source line SRC is also set to VCC from 0V. The signal PRE2 is set to 0V from VCC, setting the bit line BL$_{i+1}$ into floating state.

Then, the selection gate line SG2 of the selected block is set to 4.5V from 0.0V. On the other hand, the word lines WL1 to WL4 remain at 0V.

When the selection gate line SG2 is set to 4.5V, the bit line $BL_{i+1}$ is 0.7V or lower if the memory cell has a threshold voltage of −0.7V or higher. Upon lapse of a predetermined time, the selection gate line SD2 is set at 0.0V. After the line SG2 has been reset to 0V, the signals SEN2 and LAT2 are set to 0V from VCC.

When the signal PRSTB2 is set to 0V from VCC, the node $Nb_{i+1}$ is set at VCC. After the signal PRSTB2 is reset at VCC, the signal PRO2 is set to 1.8V from 0V. If the memory cell has a threshold voltage of −0.7V or higher, the bit line $BL_{i+1}$ is at 0.7V or lower. In this case, the n-channel MOS transistor Qn10 is turned on, and the potential of the node $Nb_{i+1}$ falls from VCC. If the bit line $BL_{i+1}$ is at 0.8V or higher, the transistor Qn10 is off, and the node $Nb_{i+1}$ remains at VCC.

The signal SEN2 is set at VCC again, activating the clocked inverter C13. The voltage of the node $Nb_{i+1}$ is thereby sensed. When the signal LAT2 is reset at VCC, the clocked inverter C14 is activated. As a result, the logic level of the signal detected is latched by the second sub-data circuit SD2.

The signal PRO2 is set at 0V again, electrically disconnecting the bit line $BL_{i+1}$ from the node $Nb_{i+1}$. Then, the signal BLC2 is set to 0V from VCC, and the signal PRE2 is set at VCC again. The bit line $BL_{i+1}$ is thereby reset at 0V. The signal PRE1 is set to VCC from 7V, and the signal VBL1 is set to 0V from VCC. The bit line BLi is therefore reset at 0V.

The common source line SRC is set again to 0V from VCC, too. Thus, read sub-data "1" is stored into the second sub-data circuit SD2 if at least one of the four memory cells of the selected block, which are connected to the bit line $BL_{i+1}$, has a threshold voltage of −0.7V or higher. The selection gate line SG1 is set again to 0V from 4.5V. The erase verification is thus terminated.

Figure 18:
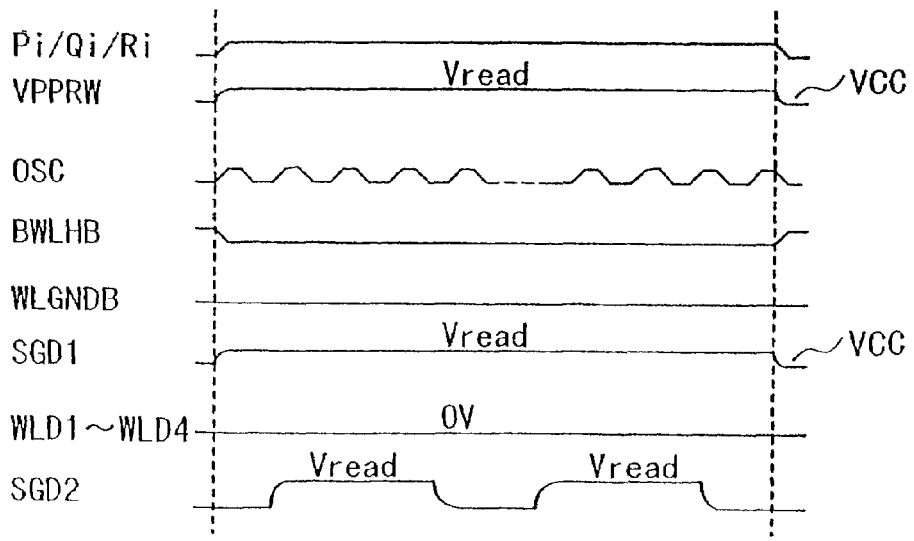
FIG. 18 is a timing chart explaining how the word line controller operates during the erase verification operation in the first embodiment.

FIG. 18 is a timing chart explaining how the word line controller 6 operates during the erase verification operation described with reference to FIG. 17.

The address signals Pi, Qi and Ri of the selected block are set to VCC from 0V. The signal BWLHB is set to 0V from VCC, the signal VPPRW is set to 4.5V from VCC. The signal OSC starts fluctuating between 0V and VCC. The gates of the n-channel MOS transistors Qn28 to Qn31 of the selected block are set to 5.5V.

The gate voltage of the n-channel MOS transistors Qn28 to Qn31 is the sum of the signal VPPRW and the threshold voltage of the n-channel MOS transistor Qn24. Since the signal WLGNDB remains at 0V, the n-channel MOS transistors Qn32 to Qn34 of the selected block have their gates set at 0V and are nonconductive. The n-channel MOS transistors Qn28 to Qn31 of the nonselected block have their gates set at 0V and are nonconductive. The n-channel MOS transistors Qn32 to Qn34 of the nonselected block have their gates set at VCC and are conductive.

The signal-selection gate signal SGD1 is set to 4.5V from VCC, the selection gate line SG1 is set to 4.5V from 0V. The signal-selection gate signal SGD2 is set to 4.5V from VCC, the selection gate line SG2 is again set to 0V from 4.5V. Upon lapse of a predetermined time, the signal-selection gate signal SGD2 is set again to 0V from 4.5V. The selection gate line SG2 is set again to 0V from 4.5V, too. The signal-selection gate signal SGD2 is set to 4.5V from 0V again. Upon lapse of a predetermined time, the signal-selection gate signal SGD2 is again set to 0V from 4.5V, and the selection gate line SG2 is set to 4.5V from 0V.

The word lines WL1 to WL4 of the nonselected block are set at 0V by the n-channel MOS transistors Qn32 to Qn34. The address signals Pi, Qi and Ri of the selected block are set to 0V from VCC. The signal BWLHB is set to VCC from 0V, the signal VPPRW is set to VCC from 4.5V, and the signal OSC is set to 0V. The gates of the n-channel MOS transistors Qn28 to Qn31 of the selected block are reset to 0V. The n-channel MOS transistors Qn28 to Qn31 of the selected block have their gates reset at 0V. The n-channel MOS transistors Qn32 to Qn34 of the selected block have their gates reset at VCC and are turned on. The block is therefore no longer selected. The selection gate line SG1 is set at 0V again.

Figure 19:
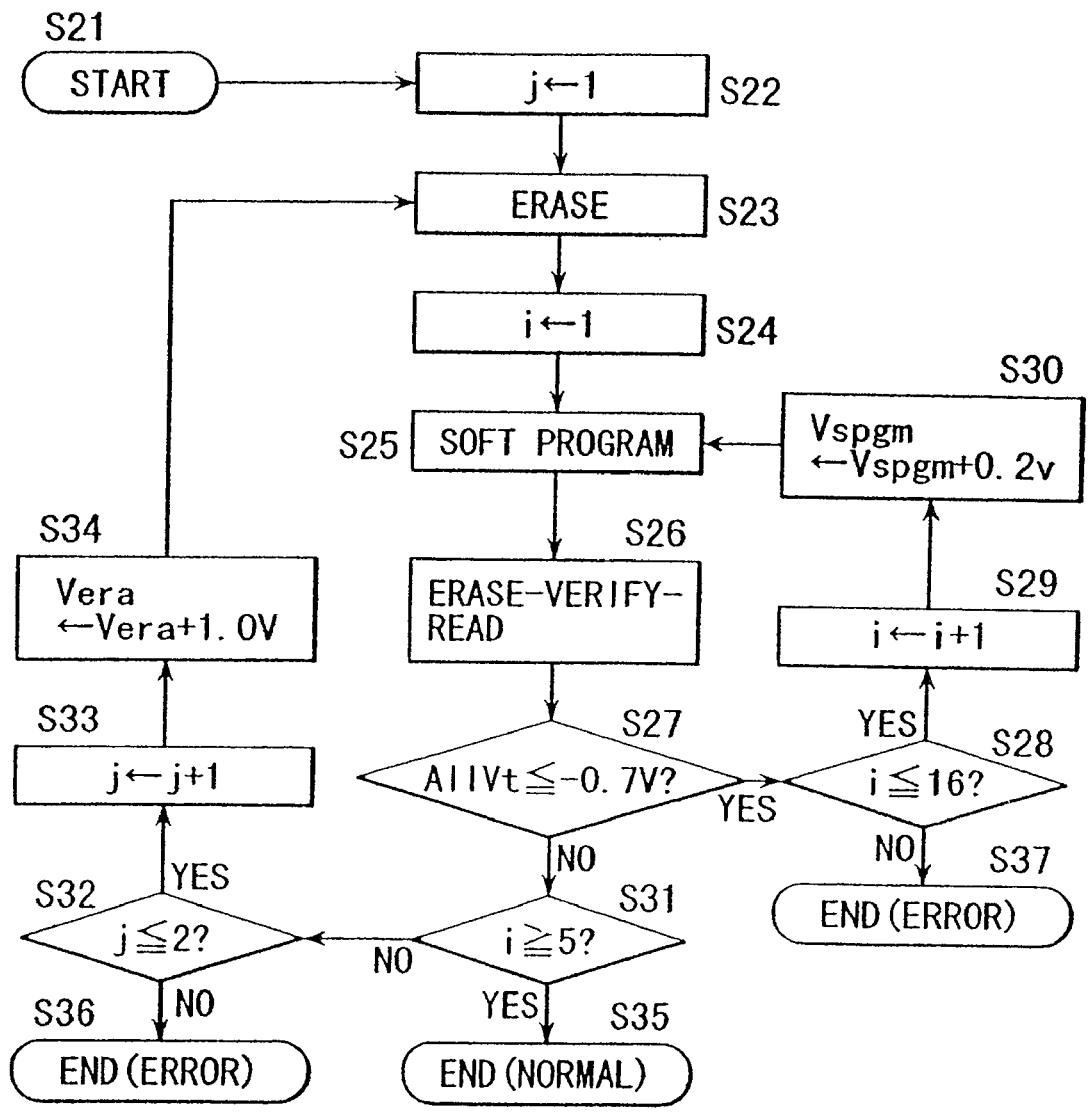
FIG. 19 is a flow chart representing the erase algorithm in the first embodiment.

FIG. 19 is a flow chart representing the erase algorithm of the erase operation which is accomplished by effecting the soft-programming shown in FIG. 16 and the erase verification shown in FIGS. 17 and 18.

This algorithm is controlled by the control signal and control voltage generator 7. An erase command is input to the generator 7 (Step S21). In response to the erase command the generator 7 sets a variable j to 1 (Step S22). The erase operation shown in FIG. 15 is performed (Step S23) Then, a variable i is set to 1 (Step S24). The soft-programming is carried out (Step S25) Thereafter, the erase verification shown in FIGS. 17 and 18 is effected (Step S26). Then, it is determined whether all memory cells of the selected block have a threshold voltage of −0.7V or lower (Step S27).

If YES in Step S27, it is then determined whether or not the variable i is 16 or smaller (Step 28). If YES in Step S28, one is added to the variable i (Step S29). Then, the soft-program voltage Vspgm is increased by 0.2V (Step 30). The operation returns to Step S25, in which the soft-programming is performed again. If the variable i exceeds 16, it is determined that an error has been made in the erase operation, and the erase operation is terminated (Step S37).

If NO in Step S27, that is, if at least one of the memory cells of the selected block has a threshold voltage higher than −0.7V, it is determined whether or not the variable i is 5 or higher (Step S31). If YES in Step S31, the erase operation is terminated (Step S35). If NO in Step S31, that is, if the variable i is 4 or smaller, it is determined whether or not the variable j is 2 or smaller (Step S32). If YES in Step S32, one is added to the variable j (Step S33). The erase voltage Vera is increased by 1V (Step s34). The operation returns to Step S23, in which the erase operation is carried out again. If NO in Step S32, that is, if the variable j is 3 or larger, it is determined that an error has been made in the erase operation. In this case, the erase operation is terminated (Step S36).

The erase operation shown in FIG. 19, particularly the soft-programming, releases any memory cell from an over-erased state. A programming operation can therefore be performed correctly.

As described above, in the nonvolatile semiconductor memory device according to the first embodiment, the soft-programming is effected after the erase operation, thereby storing "0" into over-erased memory cells, if any. The two memory cells connected to the selected memory cell can be reliably turned off. Data "0" can therefore be readily programmed into these memory cells.

The duration of the programming pulse is controlled in accordance with which data, "1," "2" or "3," is to be programmed into the selected memory cell. This compensates for the difference between the speeds of programming these data items. Therefore, the program voltage need not be applied frequently to the memory cell, frequently at short intervals, each time for the time long enough to program data "1." As a result, data can be programmed at high speed in the nonvolatile semiconductor memory device according to the first embodiment.

Other embodiments of the nonvolatile semiconductor memory device according to the present invention will be described. The same portions as those of the first embodiment will be indicated in the same reference numerals and their detailed description will be omitted.

Second Embodiment

Figure 20:
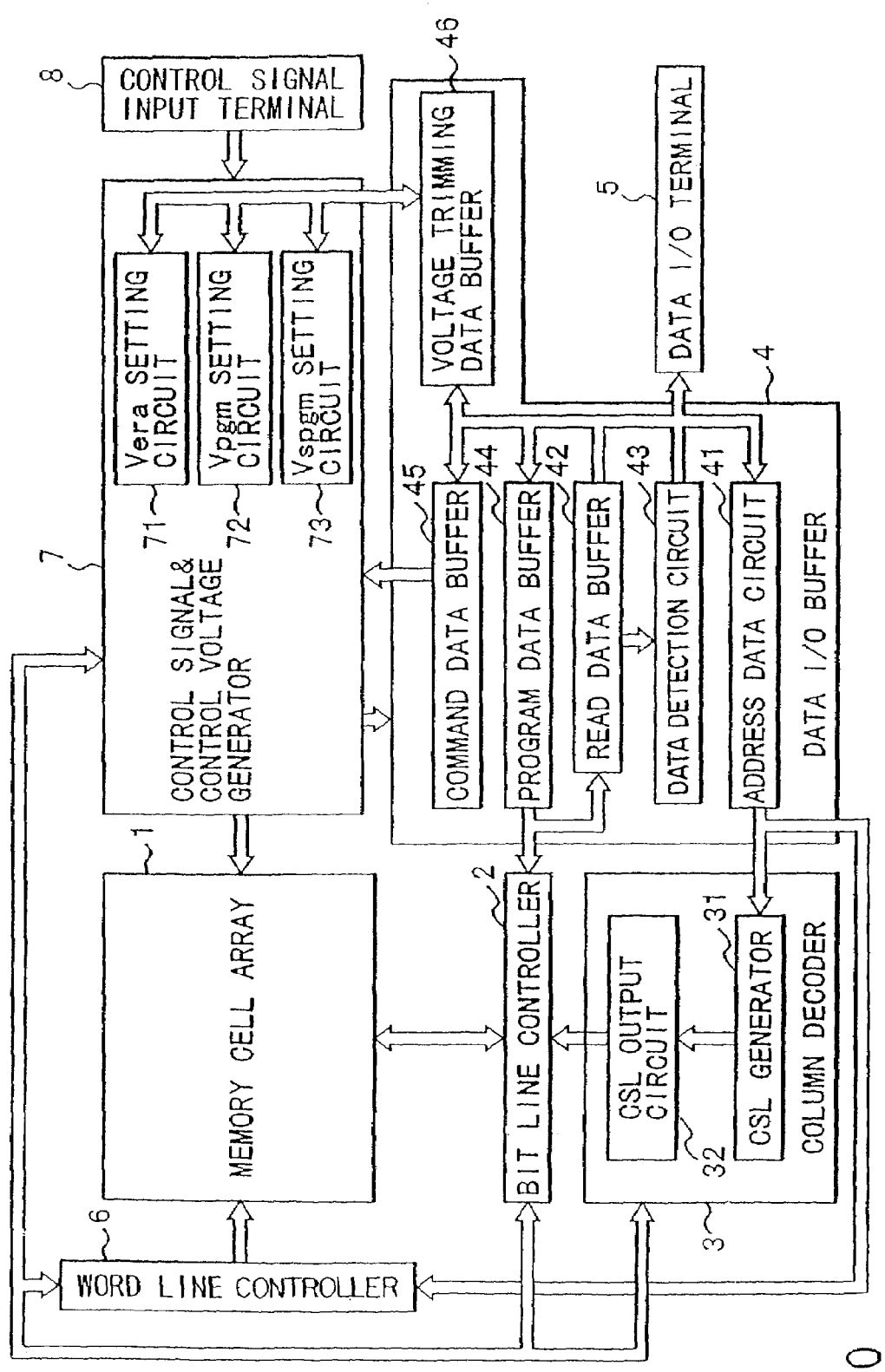
FIG. 20 is a block diagram of a nonvolatile semiconductor memory device according to a second embodiment of the present invention.

FIG. 20 shows a four-value NAND flash memory, which is the second embodiment of the present invention. The column decoder 3 comprises a CSL generator 31 and a CSL output circuit 32. The CSL generator 31 stores the initial value of column-selecting signals CSL and generates the column-selecting signals CSL one after another. The CSL output circuit 32 outputs the column-selecting signals. The data input/output buffer 4 comprises an address data buffer 41, a read data buffer 42, a data detection circuit 43, a program data buffer 44, a command data buffer 45, and a voltage-trimming data buffer 46.

The address data buffer 41 stores the address data input to the data input/output terminal 5. The read data buffer 42 stores the read data output from the bit line controller 2 for some time. The data detection circuit 43 outputs a flag signal in accordance with the read data output from the read data buffer 42. The program data buffer 44 stores the program data input to the data input/output terminal 5. The command data buffer 45 stores command data that has been input to the data input/output terminal 5 and that is to be supplied to the control signal and control voltage generator 7. The voltage-trimming data buffer 46 stores voltage-trimming data that has been input to the data input/output terminal 5 and that is used to control the voltage generated in the data input/output buffer 4.

The control signal and control voltage generator 7 comprises a Vera setting circuit 71, a Vpgm setting circuit 72, and a Vspgm setting circuit 73. The circuit 71 controls erase voltage Vera, the circuit 72 controls program voltage Vpgm, and the circuit 73 controls soft-program voltage Vspgm. The circuits 71, 72 and 73 control the stepwise application of the voltages Vera, Vpgm and Vspgm in accordance with the algorithms illustrated in FIGS. 14 and 19. They receive the initial values of Vera, Vpgm and Vspgm as voltage-trimming data items from the voltage-trimming data buffer 46. They automatically change the voltage-trimming data items in accordance with the algorithms, thereby raising the voltages Vera, Vpgm and Vspgm. They can transfer the values of the voltages Vera, Vpgm and Vspgm, as voltage-trimming data items, to the voltage-trimming data buffer 46. The voltage-trimming data items transferred to the buffer 46 can be output from the data input/output terminal 5 to an external device.

Figure 21:
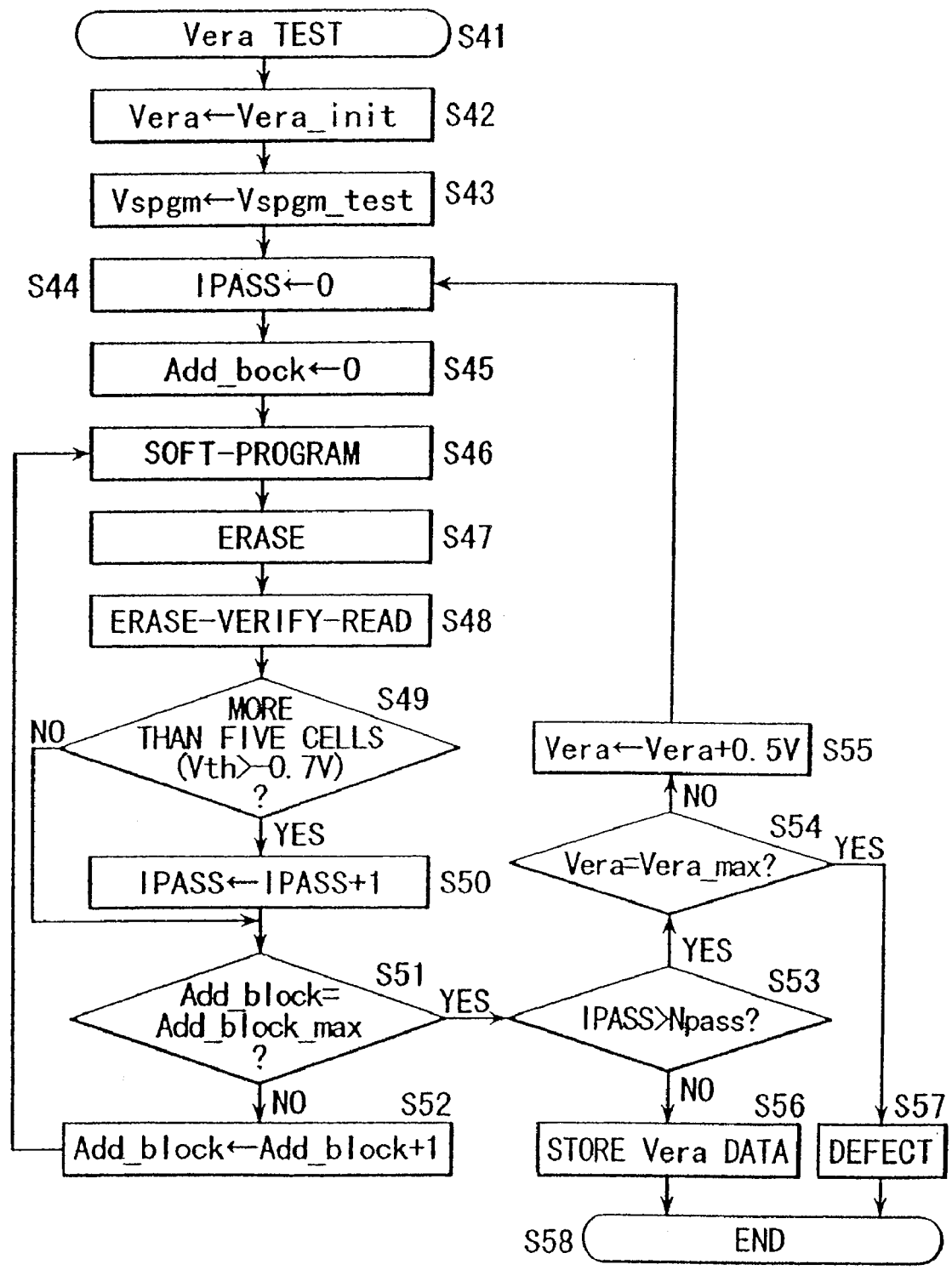
FIG. 21 is a flow chart illustrating the algorithm of testing the erase voltage in the second embodiment.

FIG. 21 shows the algorithm of testing the erase voltage Vera. With reference to FIG. 21, it will be explained how the initial value of the voltage Vera is determined before the voltage Vera is applied in stepwise fashion.

The test is started (Step S41). A sufficiently low voltage Vera_init is set as the initial value for the erase voltage Vera, by inputting voltage-trimming data to the Vera setting circuit 71, which corresponds to the sufficiently low voltage Vera_init (Step S42). A sufficiently high voltage Vspgm_test is set as soft-program voltage Vspgm, by inputting voltage-trimming data to the Vspgm setting circuit 73, which corresponds to the sufficiently high voltage Vspgm-test (Step S43). A variable IPASS is set to 0 (Step S44). The first block is selected (Step S45). The soft-program voltage Vspgm test is applied, thereby performing soft-program operation (Step S46). The soft-program operation is in order to set the memory cells in a programmed state before data is erased from the memory cells so that the threshold voltage of the memory cells may be stabilized after data is erased from the memory cells. Thereafter, data is erased from the memory cells (Step S47). Then, erase verification is carried out (Step S48).

In the column decoder 3, column-selecting signals CSL are automatically generated, one after another. The data detection circuit 43 detects the read data output from the bit line controller 2. Data is erased from 16,896 (=4,224×4, see FIG. 2). This data is compressed into 4,224-bit data in the erase verification, and the 4,224-bit data is read from the memory cell array 1. The data detection circuit 43 determines whether or not the 4,224-bit data includes at least 5 bits which indicate that the memory cells storing them have a threshold voltage of −0.7V or higher (Step S49). At least five of the 4,224 bits must be monitored for the following reason.

Even if only one cell has a threshold voltage of −0.7V or higher, the erase voltage Vera is too low. This would mean that a defective cell, if any, in which data cannot be erased always, has a threshold voltage of −0.7V or higher. If so, the erase voltage Vera can not be detected accurately. This is why it is necessary to monitor at least two of the 4,224 bits.

If YES in Step S49, that is, if the 4,224-bit data includes at least 5 bits indicating that the memory cells storing them have a threshold voltage of −0.7V or higher, the variable IPASS is increased by one (Step S50). Then, it is determined whether the block address is the last one or not (Step S51) If NO in Step S51, the next block is selected (Step S52). Then, Steps S46 to S52 are repeated.

If YES in Step S51, that is, if Steps S46 to S52 have been performed on all blocks, it is determined whether the variable IPASS is greater than a variable Npass (Step S53). The variable Npass includes a value very close to zero, for example, about a tenth of the number of all blocks provided. Npass could be zero if all blocks were flawless. If Npass were zero, it would be impossible to detect the erase voltage Vera correctly if any one of the block happened to be defective. In other words, it is determined in Step S53 whether or not data has been erased in a block which includes the average property. If NO in Step S53, that is, if IPASS is less than or equal to Npass, the data can be erased with the erase voltage Vera applied at present. In this case, the sum of the erase voltage Vera and a margin of about 0.5V is stored as the optimum erase voltage (Step S56). Then, the testing of the erase voltage Vera is terminated (Step S58).

If YES in Step S53, that is, if the variable IPASS is greater than Npass, the erase voltage Vera applied is too low to erase data. In this case, it is determined whether or not the erase voltage Vera has reached the maximum value Vera_max (Step S54). If NO in Step S54, the voltage Vera is raised by, for example, 0.5V (Step S55). Then, Steps S44 to S55 are repeated until the erase voltage Vera reaches the maximum value. If YES in Step S54, it is determined that no value optimal for the erase voltage Vera has been found and that the memory cell array 1 is defective (Step S57) Then, the test is terminated (Step S58).

Figure 22:
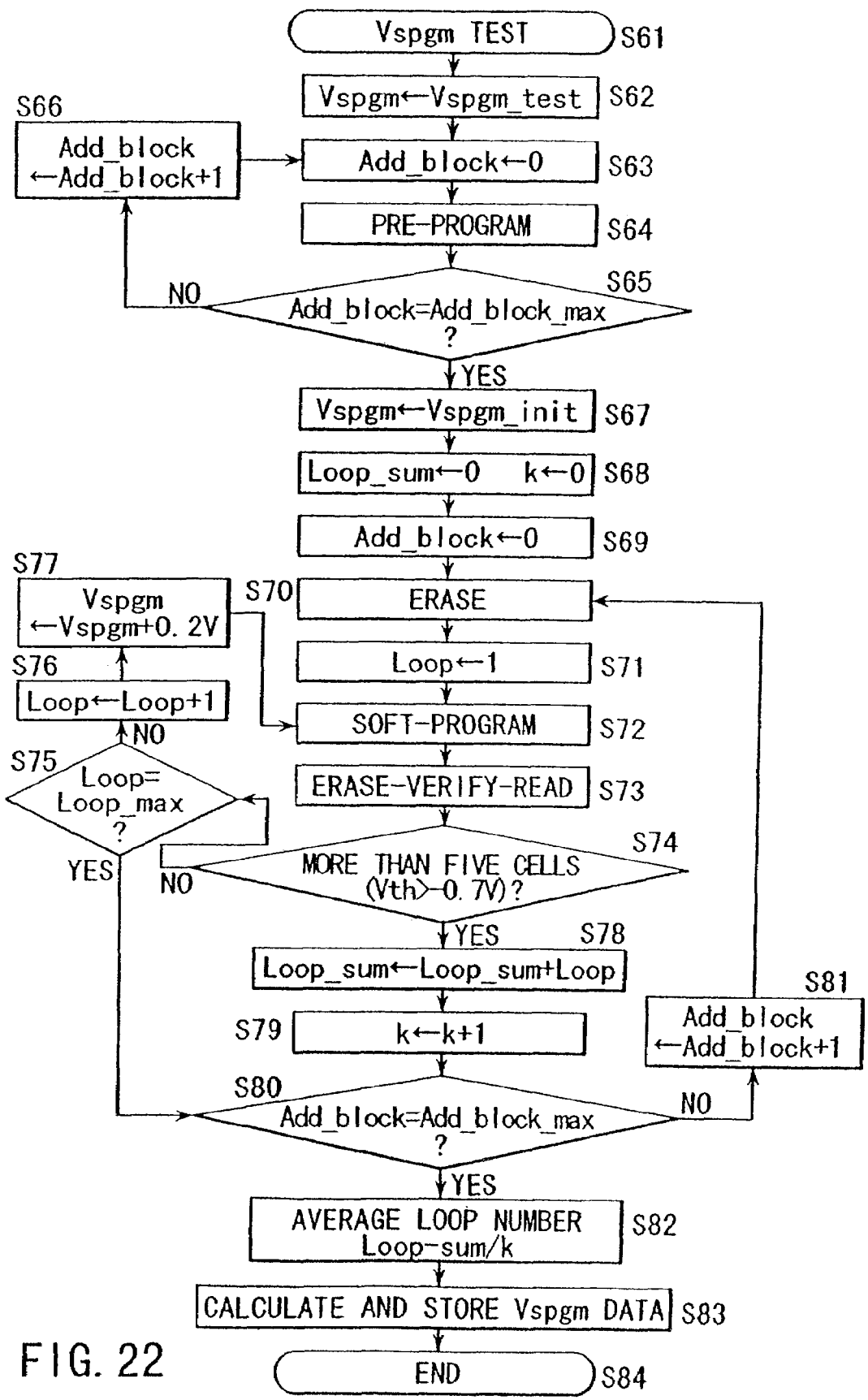
FIG. 22 is a flow chart depicting the algorithm of testing the soft-program voltage in the second embodiment.

FIG. 22 illustrates the algorithm of testing the soft-program voltage Vspgm, thereby to determine the initial value of the voltage Vspgm.

The test is started (Step S61) A voltage Vspgm_test is set, which is sufficiently high for the initial value of the soft-program voltage Vspgm (Step S62). The voltage Vspgm test is set by input voltage-trimming data to the Vspgm setting circuit 73, which corresponds to the voltage Vspgm test. Then, the first block is selected (Step S63). The soft-program voltage Vspgm is applied, thereby effecting pre-program operation (Step S64). This pre-program operation is in order to set the memory cells in a programmed state before data is erased from the memory cells so that the threshold voltage of the memory cells may be stabilized after data is erased from the memory cells. Next, it is determined whether the block address is the last one or not (Step S65). If NO in Step S65, the next block is selected (Step S66). Then, Steps S63 to S65 are repeated.

The voltage obtained in the test shown in FIG. 21 is set as the erase voltage Vera, and a sufficiently low voltage Vspgm_init is set as the initial value for the soft-program voltage Vspgm (Step S67). Step S67 is carried out by inputting the voltage Vera to the Vera setting circuit 71 and inputting the voltage Vspgm_init to the Vspgm setting circuit 73. A variable Loop_sum and a variable k are set to zero (Step S68). The first block is selected (Step S69). The erase voltage Vera is applied, thereby erasing data in the memory cells of the first block (Step S70). A variable Loop is set to one (Step S71). Then, the soft-program voltage Vspgm is applied, thus effecting soft-program operation (Step S72). Erase verification is performed (Step S73).

The column decoder 3 generates column-selecting signals CSL automatically, one after another. The data detection circuit 43 detects the read data output from the bit line controller 2. Data is thereby eased from 16,896 memory cells. Erase verification is effected, compressing the data stored in the memory cell array 1 to 4,224-bit data, which is read out. The data detection circuit 43 determines whether or not the 4,224-bit data includes at least 5 bits indicating that the memory cells storing them have a threshold voltage of −0.7V or higher (Step S74). At least five of the 4,224 bits must be monitored for the following reason.

Even if only one cell has a threshold voltage of −0.7V or higher, the soft-program operation will be terminated. This would mean that a defective cell, if any, in which data cannot be erased, always has a threshold voltage of −0.7V or higher. If so, the soft-program voltage Vspgm can not be detected accurately. This is why it is necessary to monitor at least five of the 4,224 bits.

If NO in Step S74, that is, if the 4,224-bit data includes less than 5 bits, which indicate that the memory cells storing them have a threshold voltage of −0.7V or higher, it is determined whether or not the variable Loop has reached the maximum value_Loop max (Step S75). If NO in Step S75, the variable Loop is increased by one (Step S76). Then, the soft-program voltage Vspgm is raised by, for example, 0.2V (Step S77). The operation returns to Step S72, in which the soft-program operation is performed again. If YES in Step S75, the operation goes to Step S80. In Step S80 it is determined whether the block address is the last one or not.

If YES in Step S74, that is, if the 4,224-bit data includes at least 5 bits indicating that the memory cells storing them have a threshold voltage of −0.7V or higher, the variable Loop is added to the variable Loop_sum (Step S78). The variable k is increased by one (Step S79). Then, it is determined whether the block address is the last one or not (Step S80).

If NO in Step S80, the next block is selected (Step S81). Then, Steps S70 to S80 are repeated.

If YES in Step S80, the average number of loops is obtained (Step S82). The number of loops is the number of times the steps S72 to S77 are repeated. Such a soft-program voltage Vspgm as would set the number of loops at 5 or higher, but not exceeding 16, is calculated (Step S83). The test is then terminated (Step S84). If the number of loops is less than 5, the initial value for the soft-program voltage Vspgm is decreased. If the number of loops is greater than 16, the initial value for the soft-program voltage Vspgm is increased.

Figure 23:
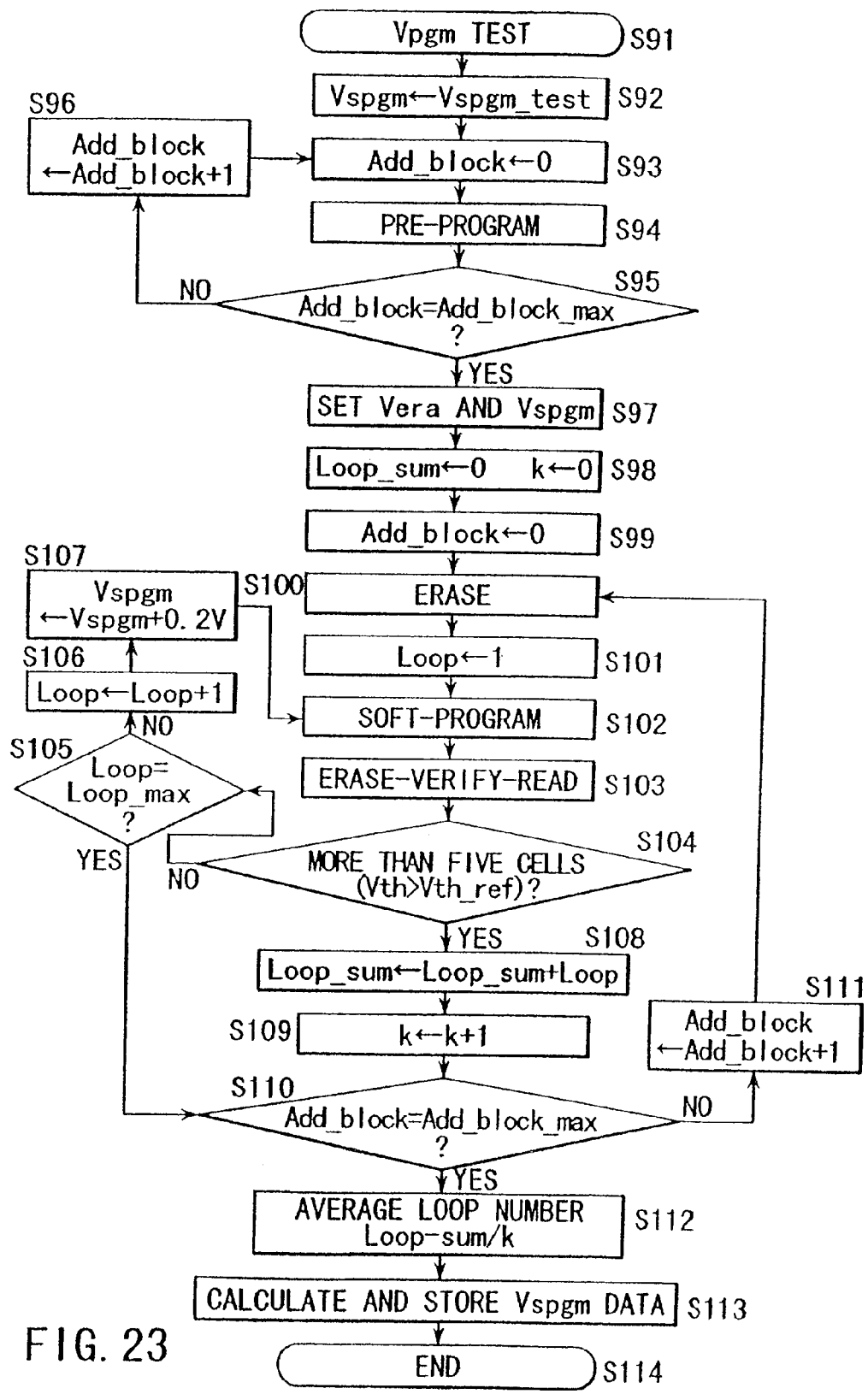
FIG. 23 is a flow chart explaining the algorithm of testing the programming voltage in the second embodiment.

FIG. 23 represents the algorithm of the test for determining the initial value for the program voltage Vpgm. With reference to FIG. 23, it will be explained how the initial value of the voltage Vpgm is determined.

The test is started (Step S91). A voltage Vspgm_test is set, which is high enough for a soft-program voltage Vspgm (Step S92). The voltage Vspgm_test is set by inputting the trimming data to the Vspgm setting circuit 73, which corresponds to the voltage Vspgm_test. The first block is then selected (Step S93). The soft-program voltage Vspgm_test is applied, thereby performing pre-program operation (Step S94). This pre-program operation is in order to set the memory cells in a programmed state before data is erased from the memory cells so that the threshold voltage of the memory cells may be stabilized after data is erased from the memory cells. Next, it is determined whether the block address is the last one or not (Step S95) If NO in Step S95, the next block is selected (Step S96) Then, Steps S93 to S95 are repeated.

The voltage obtained in the test shown in FIG. 21 is set as the erase voltage Vera, and the voltage Vspgm obtained in the test shown in FIG. 22 is set as the initial value for the soft-program voltage Vspgm_init (Step S97). Step S97 is accomplished by inputting the voltage Vera to the Vera setting circuit 71 and inputting the voltage-trimming data corresponding to the voltage Vspgm to the Vspgm setting circuit 73. The variable Loop_sum and the variable k are set to zero (Step S98). The first block is selected (Step S99). The erase voltage Vera is applied, thereby erasing data in the memory cells of the first block (Step S100). The variable Loop is set to one (Step S101). Then, the soft-program voltage Vspgm is applied, thus effecting soft-program operation (Step S102). Erase verification is effected under the control of the externally applied voltage (Step S103).

Figure 24:
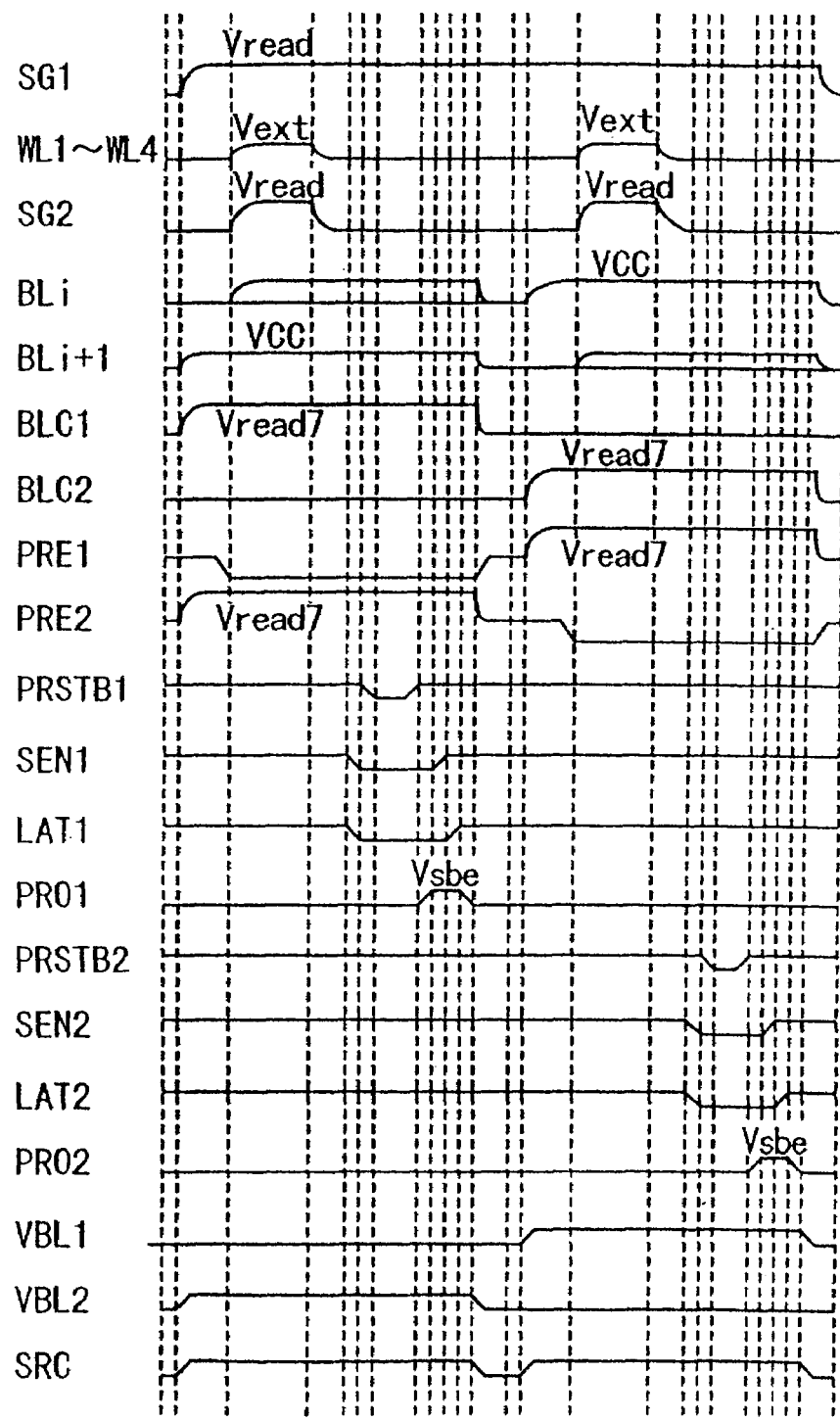
FIG. 24 is a timing chart for explaining how erase verification is effected under the control of an externally applied voltage, in the second embodiment.
Figure 25:
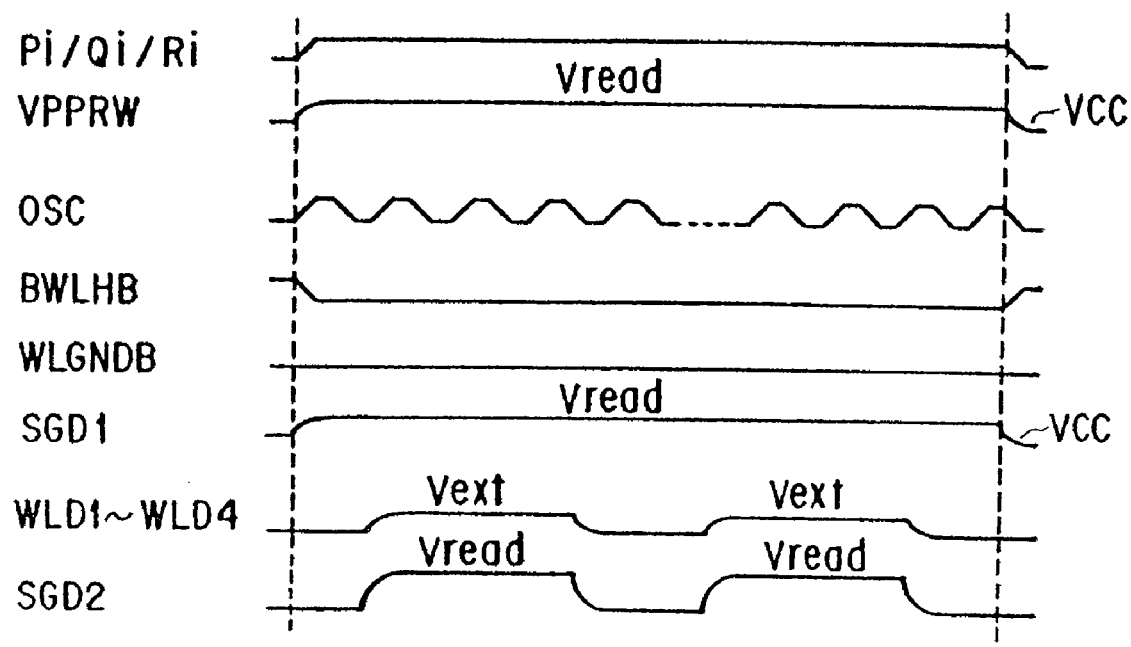
FIG. 25 is a timing chart for explaining how the word line controller operates during the erase verification operation controlled by the externally applied voltage.

The erase verification is conducted under the externally applied voltage, in order to detect the erased state of memory cells, as will be described with reference to FIG. 24. FIG. 25 is a timing chart explaining how the word line controller 6 operates during this erase verification.

This erase verification achieved under the control of an externally applied voltage is similar to the erase verification explained with reference to FIGS. 17 and 18. It differs, however, in that a voltage Vext is applied to the word lines WL1 to WL4 from the control voltage input terminal 8, as is seen from FIGS. 24 and 25. Thus, it is determined whether the threshold voltage of each memory cell is Vext −0.7V (=Vt_ref) or not. For example, if Vext=1V, it is determined whether the cell has a threshold voltage of 0.3V or not.

The column decoder 3 generates column-selecting signals CSL automatically, one after another. The data detection circuit 43 detects the read data output from the bit line controller 2. Data is thereby erased from 16,896 memory cells. Erase verification is effected, compressing the data stored in the memory cell array 1 to 4,224-bit data, which is read out. The data detection circuit 43 determines whether or not the 4,224-bit data includes at least 5 bits indicating that the memory cells storing them have a threshold voltage of Vt_ref or higher (Step S104). At least five of the 4,224 bits must be monitored for the following reason.

Even if only one cell has a threshold voltage of Vt_ref or higher, the soft-program operation will be terminated. This would mean that a defective cell, if any, in which data cannot be erased, always has a threshold voltage of Vt_ref or higher. If so, the soft-program voltage Vspgm can not be detected accurately. This is why it is necessary to monitor at least five of the 4,224 bits.

If NO in Step S104, that is, if the 4,224-bit data includes less than 5 bits, which indicate that the memory cells storing them have a threshold voltage of Vt_ref or higher, it is determined whether or not the variable Loop has reached the maximum value_Loop max (Step S105). If NO in Step S105, the variable Loop is increased by one (Step S106). Then, the soft-program voltage Vspgm is raised by, for example, 0.2V (Step S107). The operation returns to Step S102, in which the soft-program operation is performed again. If YES in Step S105, the operation goes to Step S110. In Step S110 it is determined whether the block address is the last one or not.

If YES in Step S104, that is, if the 4,224-bit data includes at least 5 bits indicating that the memory cells storing them have a threshold voltage of Vt_ref or higher, the variable Loop is added to the variable Loop_sum (Step S108). The variable k is increased by one (Step S109). Then, it is determined whether the block address is the last one or not (Step S110).

If NO in Step S110, the next block is selected (Step S111). Then, Steps S100 to S110 are repeated.

If YES in Step S110, the average number of loops is obtained (Step S112). The number of loops is the number of times Steps S102 to S107 are repeated. A program voltage Vpgm is calculated, which will set the number of loops at 20 or lower (Step S113). The test is then terminated.

The program voltage Vpgm is calculated by performing the soft-program operation, because the test time is short. The soft-program operation and the erase verification operation are performed on the entire block. Hence, in the memory cell array shown in FIG. 2, the soft-program operation and the erase verification operation take only an eighth of the time the program operation or the program verification operation which is performed on half the page each time.

With the second embodiment it is possible to obtain appropriate initial values for the erase voltage, soft-program voltage and program voltage which are applied in stepwise fashion. Therefore, the erase process, soft-program operation and program operation can be carried out within a short time.

Third Embodiment

Figure 26:
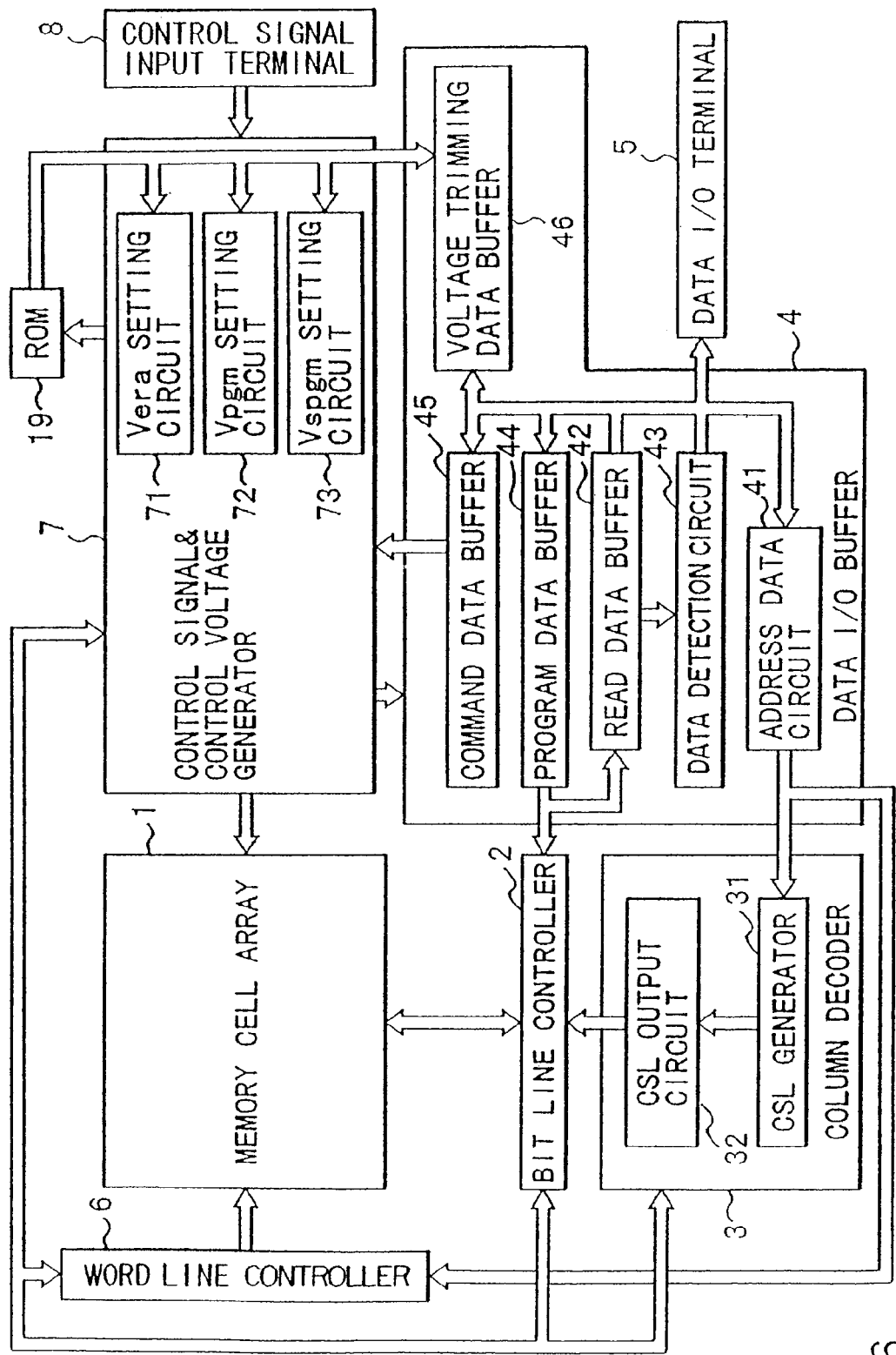
FIG. 26 is a block diagram of a nonvolatile semiconductor memory device according to a third embodiment of the present invention.

FIG. 26 shows a four-value NAND-type flash memory, which is the third embodiment of this invention. The third embodiment is a modification of the second embodiment. It comprises a ROM 19 which stores the initial values of the erase voltage Vera, program voltage Vpgm and soft-program voltage Vspgm. In the case where no voltage-trimming data is supplied from an external device, the voltage-trimming data stored in the ROM 19 is automatically transferred to the Vera setting circuit 71, Vpgm setting circuit 72 and Vspgm setting circuit 73.

Once calculated and stored into the ROM 19, the initial values of the erase voltage Vera, program voltage Vpgm and soft-program voltage Vspgm need not be calculated every time they are required.

Fourth Embodiment

Figure 27:
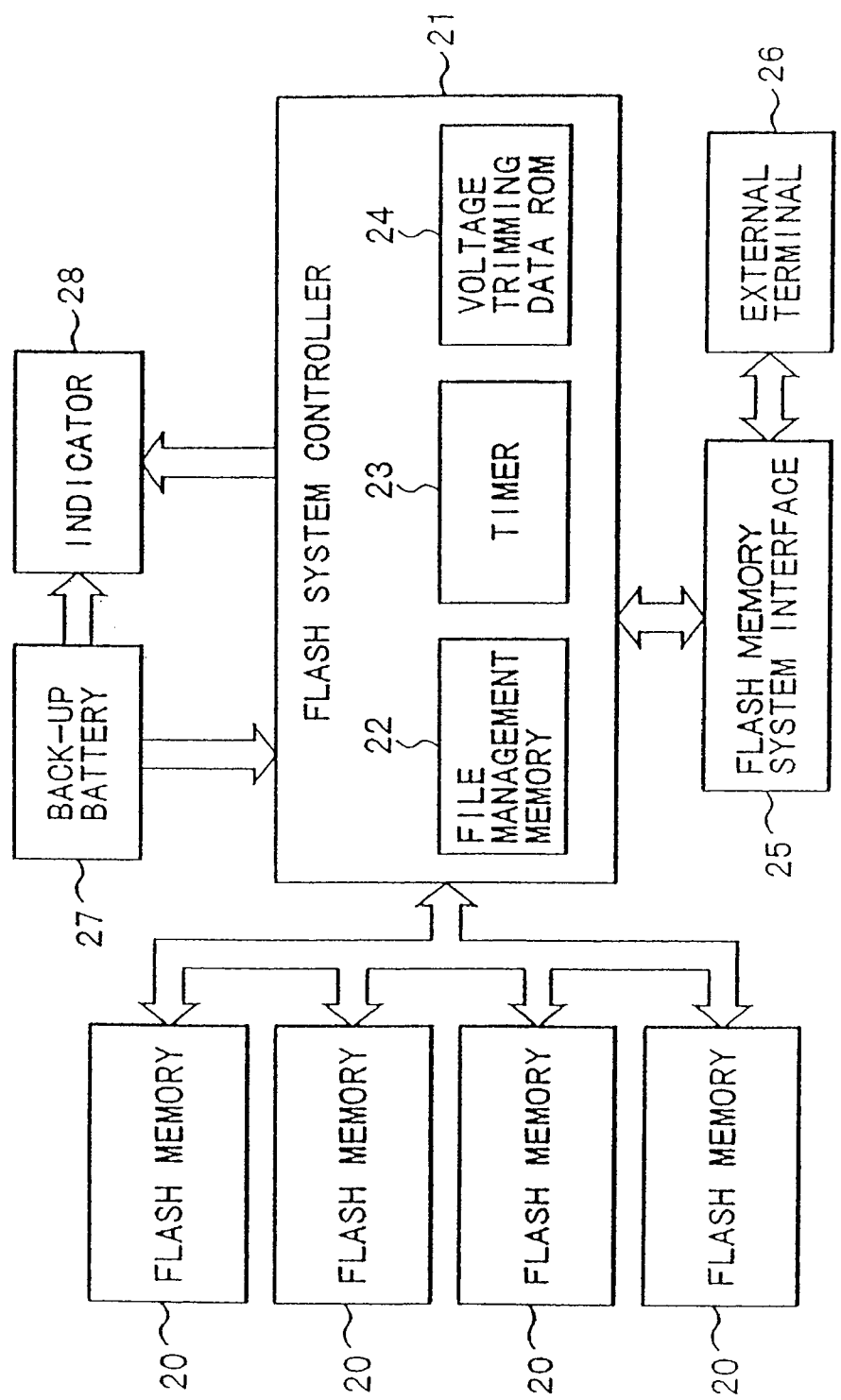
FIG. 27 is a block diagram of a nonvolatile semiconductor memory device according to a fourth embodiment of the invention.

FIG. 27 illustrates a flash memory system, which is the fourth embodiment of the invention. As shown in FIG. 27, the system comprises flash memories 20. Each flash memory 20 may be the four-value NAND-type flash memory shown in FIG. 20 (the second embodiment). Alternatively, it may be the four-value NAND-type flash memory shown in FIG. 26 (the third embodiment).

In the flash memory system, a flash system controller 21 controls four flash memories 20 of the type depicted in FIG. 20. The flash system controller 21 comprises a file management memory 22, a timer 23, and a voltage-trimming data ROM 24. The voltage-trimming data ROM 24 stores voltage-trimming data items optimal for the flash memories 20. The file management memory 22 stores data items relating to the data files programmed in the flash memories 20 (for example, the time when each data file was programmed into a flash memory). The memory 22 is, for example, an SRAM. The timer 23 determines how long data files have been stored in the flash memories 20.

The flash system controller 21 exchanges signals with an external device via a flash memory system interface 25 and an external terminal 26. Not only signals but also the power-supply voltage is externally supplied through the external terminal 26. The system incorporates a back-up battery 27, which supplies power in the case where external power supplies are unavailable. The back-up battery 27 always supplies power to the flash system controller 21 (more precisely, to the timer 23). The flash system controller 21 generates an alarm signal to an indicator 28 upon lapse of a prescribed time after a data file was programmed into the system. The indicator 28 issues the alarm signal to an external device, indicating that there is the possibility that the data file has been destroyed. The back-up battery 27 supplies power to the indicator 28, too. Upon detecting that the prescribed time has elapsed after a data file was programmed into the system, the flash system controller 21 determines that the data file may have been destroyed, and automatically refreshes the data file. Thus, the flash system controller 21 renders the flash memory system reliable.

If no external power supplies are available, the back-up battery 27 supplies power to the flash system controller 21. In this case, the flash system controller 21 does not always supply power to the flash memories 20; it supplies power to the flash memories 20 only when the data files stored in the memories 20 need to be refreshed.

The back-up battery 27 is chargeable. The battery 27 is charged while an external power supply is connected to the flash memory system. When an external power supply is available, the flash system controller 21 consumes the power supplied from the external power supply, not the power accumulated in the back-up battery 27.

Figure 28:
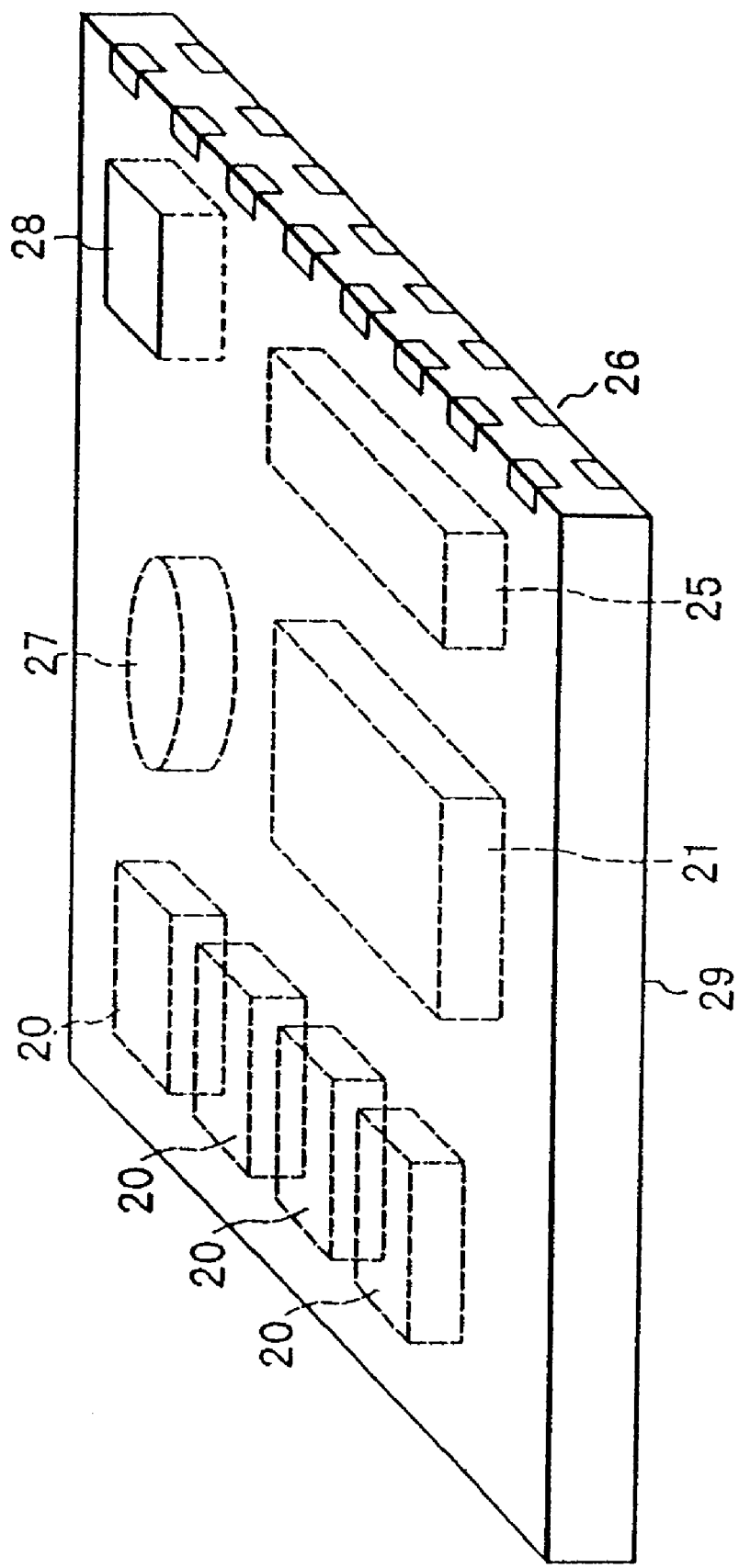
FIG. 28 is a perspective view of a flash memory system shaped as a card, which is a modification of the fourth embodiment.

FIG. 28 is a perspective view of a flash memory system. As seen from FIG. 28, the system is shaped like a memory card. The indicator 28 includes one side exposed outside. Upon lapse of the prescribed time after a data file was programmed in the system, the flash system controller 21 determines that the data file has been destroyed. The controller 21 then generates and supplies an alarm signal to the indicator 28. In response to the alarm signal, the indicator 28 indicates the possibility of the data-file destruction, for example by emitting light of a specific color.

In the fourth embodiment, the timer 23 determines how long data files have been stored in the flash memories 20, and the flash system controller 21 refresh any data file upon lapse of the prescribed time after the data file was programmed in the flash memory system. This prevents the destruction of any data file stored in the system. The flash memory system therefore includes high reliability.

Fifth Embodiment

According to the soft-program operation described above, if the block from which data has been erased includes a memory cell into which data can easily be programmed and which has a threshold voltage higher than the predetermined value of −0.7V (see Step S27 shown in FIG. 19), the soft-program operation is terminated though all other memory cells still remain in erased state. This phenomenon is undesirable in the case where data "0" is programmed into each memory cell of a NAND-type cell unit while the word lines connected to the two adjacent memory cells are held at 0V.

To store multi-value data in a memory cell, the charge accumulated in the memory cell must be controlled in a stepwise fashion. In this case, it is required that the threshold voltage of the memory cell reliably fall within a specific range. With the soft-program algorithm described above (especially, step S27 in FIG. 19), however, the threshold voltage of the memory cell can hardly fall within such a range if there is an exceptional memory cell into which data can easily be programmed.

The fifth embodiment, to overcome the above problem, will be described with reference to FIG. 29. As can be understood from FIG. 29, the fifth embodiment is a four-value NAND-type flash memory.

Figure 29:
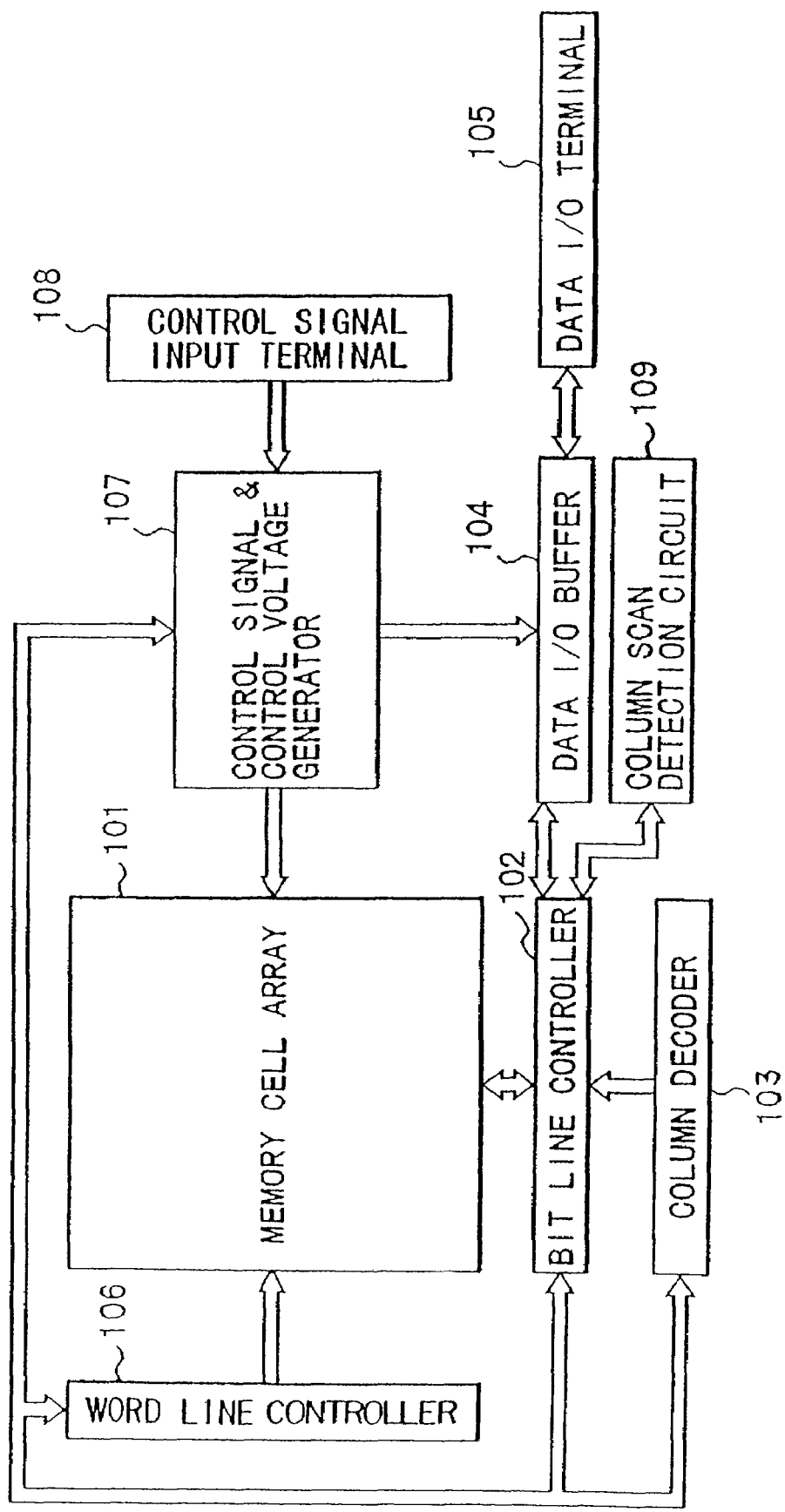
FIG. 29 is a block diagram of a NAND-type flash memory, which is a fifth embodiment of the invention.

As FIG. 29 shows, the four-value NAND-type flash memory comprises a memory cell array 101. The array 101 includes a plurality of bit lines, a plurality of word lines, a common source line, and a plurality of electrically programmable memory cells. The memory cells are arranged in rows and columns, at intersections of the bit lines and word lines. As in most flash memories, the memory cell array 101 is composed of a plurality of cell blocks. The flash memory further comprises a bit line controller 102, a column decoder 103, data input/output buffer 104, a data input/output terminal 105, a word line controller 106, a control signal and control voltage generator 107, a control signal input terminal 108, and a column scan detection circuit 109.

The bit line controller 102 and the word line controller 106 are connected to the memory cell array 101. The bit line controller 102 controls the bit lines. The word line controller 106 controls the word lines.

The bit line controller 102 performs various functions. It reads data from the memory cells of the array 1 through the bit lines. It detects the states of the memory cells, through the bit lines. It applies a program-control voltage to the memory cells through the bit lines, in order to program data into the memory cells.

The bit line controller 102 includes a plurality of data memories. The data read from the memory cells is stored into those of the data memories which the column decoder 103 includes selected. The data is read from these data memories, stored into the data input/output buffer 104, and output from the data input/output terminal 105. The data input to the data input/output terminal 105 from an external device is stored in the data input/output buffer 104. The input data is then into the data memories selected by the column decoder 103 and will be used as initial control data.

The word line controller 106 selects at least one of the word lines in the memory cell array 101. It applies a voltage to the word lines selected, for reading data from, programming data into, or erasing data in the memory cells connected to the word lines selected.

The control signal and control voltage generator 107 controls the memory cell array 101, bit line controller 102, column decoder 103, data input/output buffer 104 and word line controller 106. The control signal and control voltage generator 107 is, in turn, controlled by a control signal input to the control signal input terminal 108 from an external device. So controlled, the generator 107 serves to perform soft-program operation which causes the threshold voltage of any memory cell erased to fall within a predetermined range.

Before describing the components shown in FIG. 29 in detail, it will be explained how soft-program operation and verification read operation are in the fifth embodiment after data has been erased from all memory cells, with reference to FIG. 30, FIGS. 31A to 31C and FIGS. 32 and 33.

Figure 30:
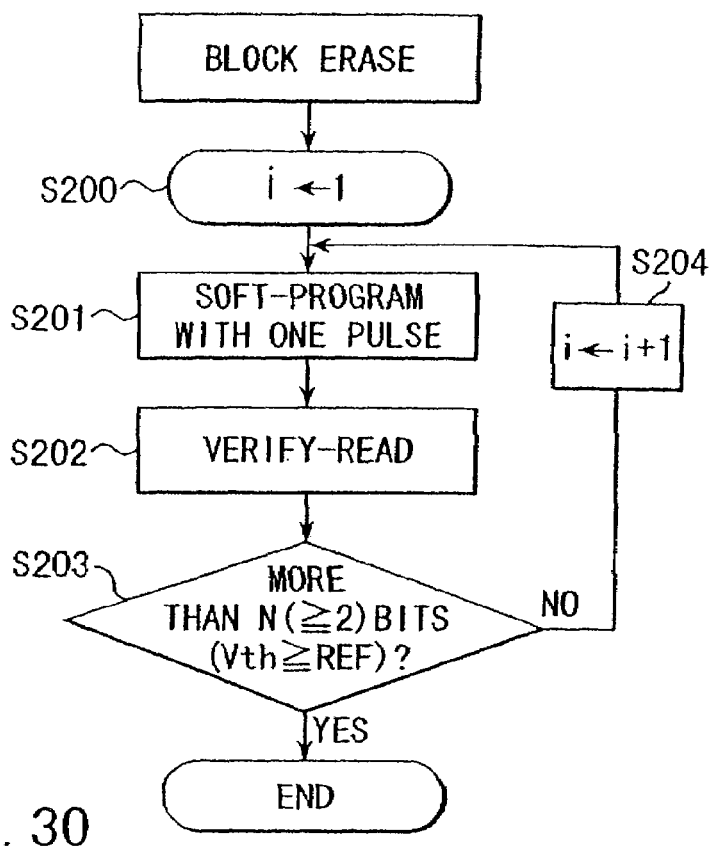
FIG. 30 is a flow chart explaining the erase operation in the fifth embodiment.

FIG. 30 is a flow chart explaining the erase operation in the fifth embodiment. At first, a variable i is set to 1 (Step S200). Soft programming is performed, by using a soft-programming pulse having a short width (Step S201). Read verification is carried out, thereby monitoring the threshold voltages of the memory cells (Step S202). Then, it is determined whether or not N memory cells (N≧2) have threshold voltages which is higher than the prescribed value REF (Step S203). If NO in Step S203, the variable i is increased by one (Step S204) The operation then returns to Step S201. In Step S201, the soft-programming is effected again, and in Step S202, the verification read is carried out again. If YES in Step S203, that is, if N memory cells (N≧2) have threshold voltages higher than the prescribed value REF, the soft-program operation is terminated.

Figure 31A:
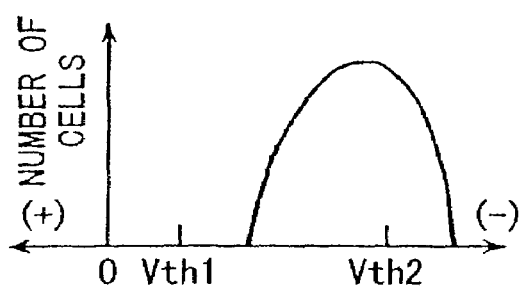
FIGS. 31A, 31B and 31C are diagrams showing how the distribution of the threshold voltages of each memory cell changes with time during the erase operation.
Figure 31B:
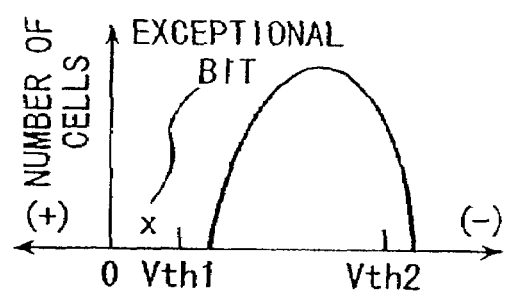

Assume that the threshold voltages of the memory cells are distributed as is illustrated in FIG. 31A. The first threshold voltage Vth1 of D type, which is a low negative voltage, is used in the verification read. The second threshold voltage Vth2 of D type, which is a high negative voltage, means that the memory cell has been over-erased if the threshold voltage is lower than the second threshold voltage Vth2. FIG. 31B indicates that a peculiar memory cell has a threshold voltage which is higher than the first threshold voltage Vth1, thus forced out of the distribution region. If the soft-program operation is terminated when the threshold voltages of the memory cells are distributed as shown in FIG. 31B, many memory cells may still remain over-erased, having threshold voltages lower than the second threshold voltage Vth2. In the fifth embodiment, therefore, the soft-program operation is not terminated even if such a peculiar memory cell exists. Rather, the soft-program operation is terminated when it is detected that at least two memory cells have come to have the first threshold voltage Vth1 or higher.

Figure 31C:
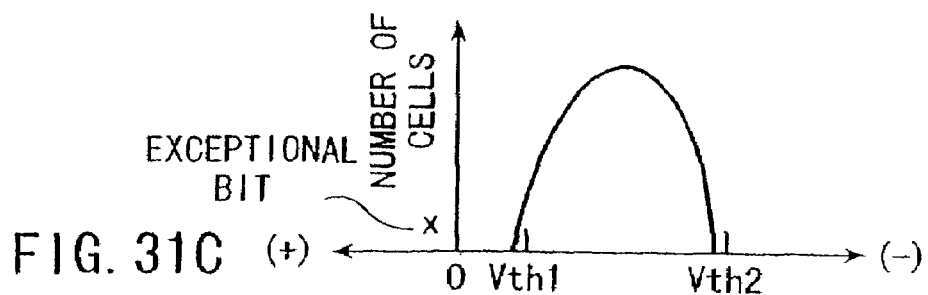

As a result, most memory cells can have threshold voltages that fall within an allowable range, between the first and second threshold voltages Vth1 and Vth2, as is illustrated in FIG. 31C.

As FIG. 31C shows, the threshold voltage of the peculiar memory cell may fall outside the allowable range, changing the data stored in the memory cell to data "1," as is illustrated in FIG. 31C. Nonetheless, this erroneous programming in the peculiar memory cell can be easily corrected in the read operation by means of an error-code correction (ECC) circuit. No problem will arise at all.

Figure 32:
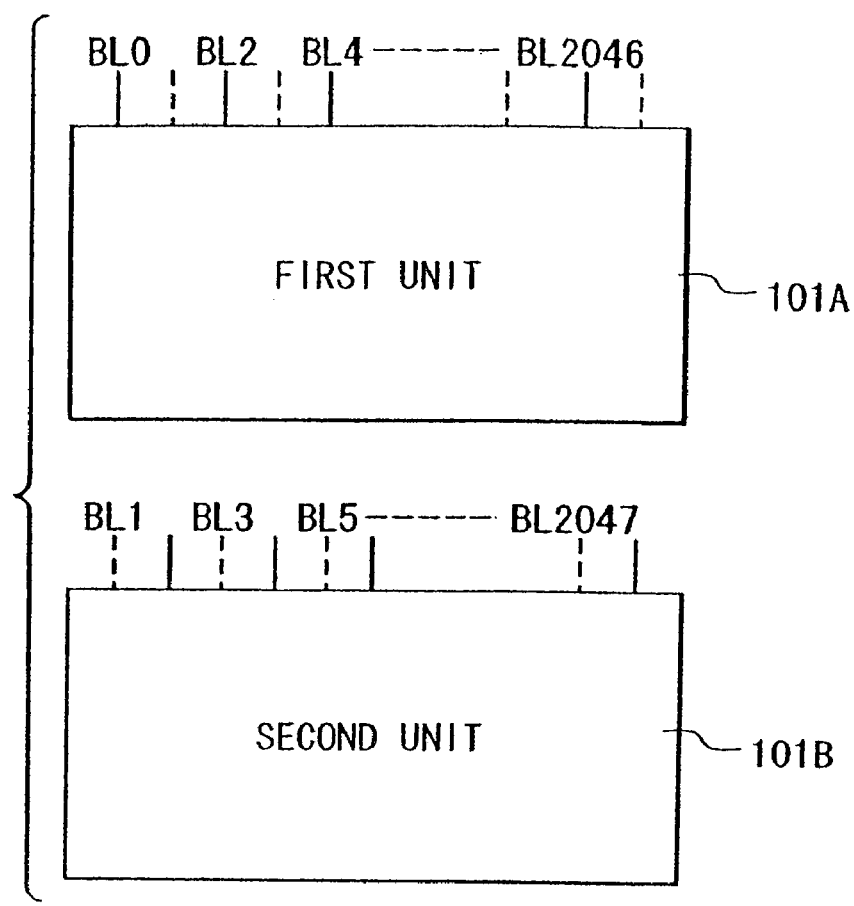
FIG. 32 is a diagram explaining one method of dividing the memory cell array into units, before a soft-program operation is conducted in the fifth embodiment.
Figure 33:
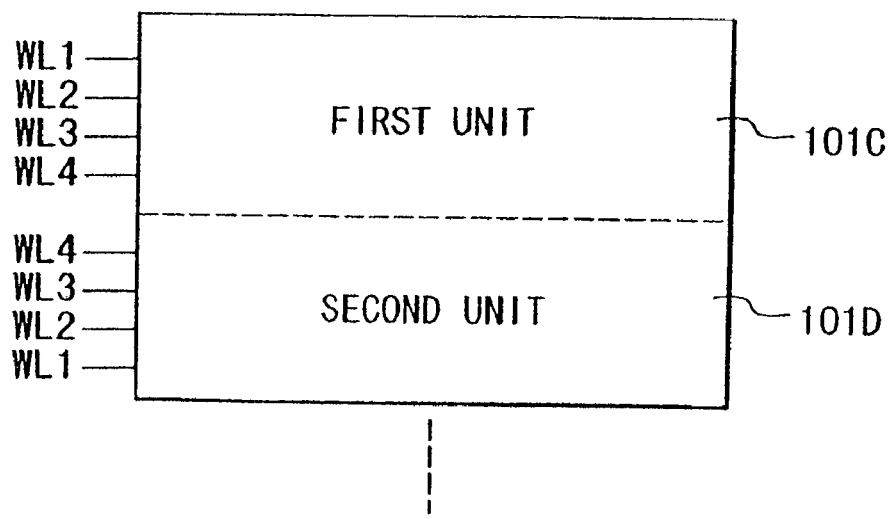
FIG. 33 is a diagram explaining another method of dividing the memory cell array into units, before a soft-program operation is conducted in the fifth embodiment.

Various methods can be employed to determine whether N memory cells (N≧2) have threshold voltages which are higher that the prescribed value REF. A first method is to divide all memory cells into N groups and to find one peculiar memory cell in each group. A second method is to find N peculiar memory cells among all memory cells. The first method makes most memory cells have threshold voltages controlled within the allowable range, more reliably than the second method. The memory cells may be divided into N groups (N≧2) in various ways. For example, as shown in FIG. 32, the memory cell array 101 can be divided into two cell units 101A and 101B. The first unit 101A is connected to one group of bit lines BL0, BL2, BL4, . . . and BL2046, and the second unit 101B is connected to bit lines BL1, BL3, BL5, . . . and BL2047. Alternatively, as shown in FIG. 33, the memory cell array 101 can be divided into two cell units 101C and 101D. In this case, the first unit 101C is connected to one group of word lines WL1 to WL4, and the second unit 101D is connected to another group of word lines WL1 to WL4. In either case, the verification read is performed on each cell unit.

In the first-mentioned case (FIG. 32), the memory cells of the first unit 101A are selected by energizing the even-numbered bit lines BL0, BL2, BL4, . . . and BL2046, while those of the second unit 101B are selected by energizing the odd-numbered bit lines BL1, BL3, BL5, . . . and BL2047. The second-mentioned case (FIG. 33) is applied to four-value NAND memory units, wherein the four memory cells of the first unit 101C are connected four word lines WL1 to WL4, while the four memory cells of the second unit 101D are connected to another four word lines WL1 to WL4.

In both cases of FIGS. 32 and 33, the soft-program operation and verification read operation are carried out after data has been erased from all memory cells. Next, erase verification operation is performed on the first unit. If any one of the memory cells of the first unit have come to have the first threshold voltage Vth1, a flag is set for the first unit. Then, erase verification operation is performed on the second unit. If any one of the memory cells of the second unit have come to have the first threshold voltage Vth1, a flag is set for the second unit. Thereafter, erase verification operation is effected on any other of the N units. When N flags are finally set in the four-value NAND-type flash memory (FIG. 29), the soft-programming is terminated.

The components shown in FIG. 29 will now be described in detail. Also it will be described how the data input/output line is scanned to set the threshold voltages of most memory cells within the allowable range.

Figure 34:
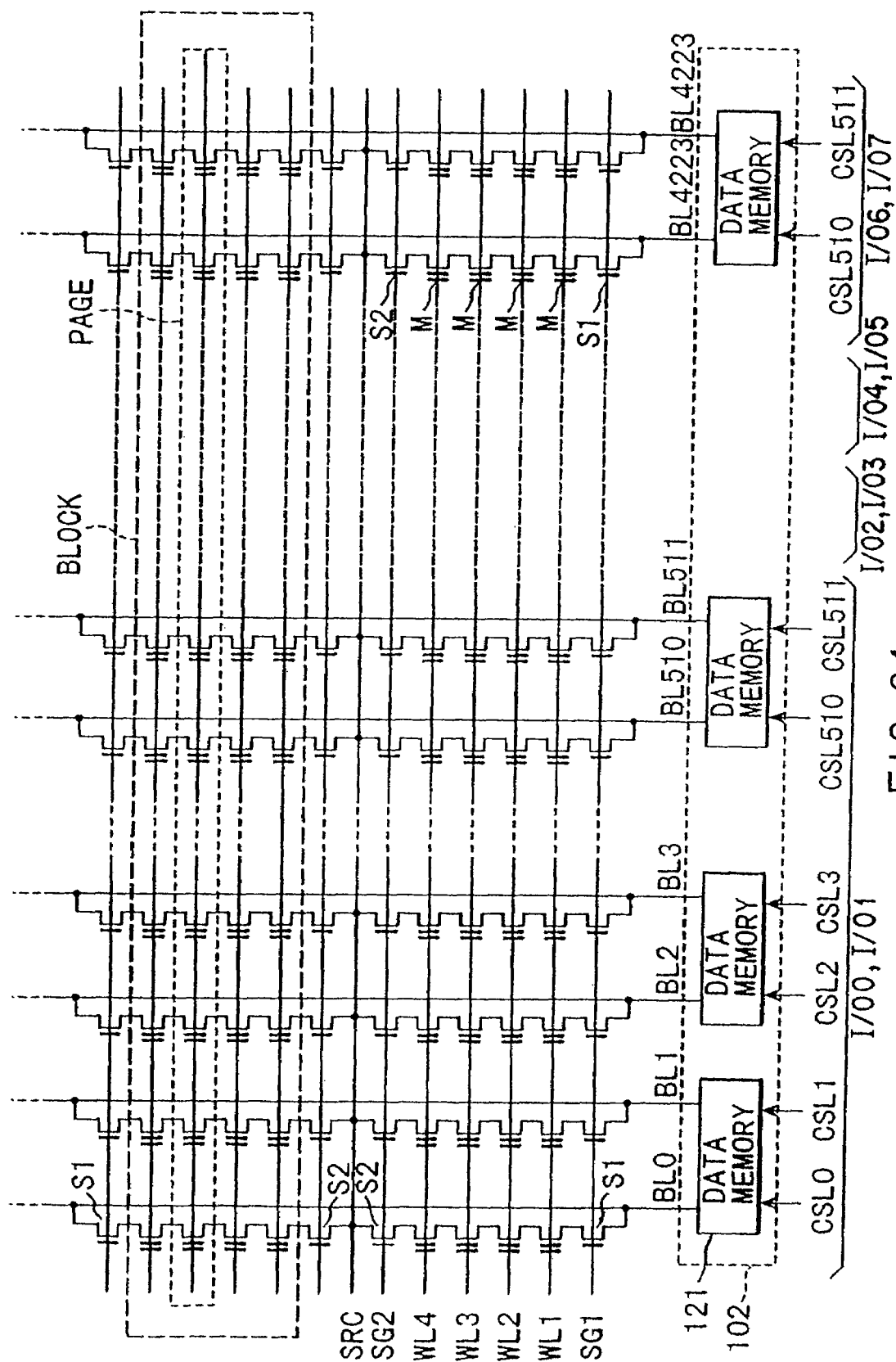
FIG. 34 is a diagram illustrating the memory cell array in the flash memory according to the fifth embodiment.

FIG. 34 illustrates the memory cell array 101 and the bit line controller 102.

As shown in FIG. 34, the memory cell array 101 includes a plurality of NAND-type cell units, each comprising four memory cells M connected in series. Each NAND-type cell unit includes one end connected by a selection transistor S1 to a bit line BL, and the other end connected by a selection transistor S2 to a common source line SRC. The control gate electrodes of the four memory cells M of each NAND-type memory cell unit are connected to four word lines WL1 to WL4, respectively. The two selection transistors S1 and S2 are connected to selection gate lines SG1 and SG2, respectively.

The memory cells M accessed at the same time, i.e., connected to one word line WL constitute a unit of storage area, called a "page." The memory cells M connected to four adjacent word lines, constituting four pages, form a larger unit of storage area, which is called a "block." Only the memory cells constituting two blocks are illustrated in FIG. 34. Nonetheless, the four-value NAND flash memory of FIG. 29 may have, for example, 1,024 blocks. Although 2,048 bit lines BL0 to BL2047 are shown in FIG. 34, the four-value NAND flash memory can have any other number of bit line. For example, it may have 4,096 bit lines. For example, eight data input/output lines I/O0 to I/O7 are provided.

The bit line controller 102 includes a plurality of data memories 121. Each data memory 121 is provided for two bit lines BL. Nonetheless, each data memory 121 may be provided for one, four, six or nine bit lines.

The column decoder 103 generates column-selecting signals CSL. Of these column-selecting signals, the signals CSL0 and CSL1 select the data memory 121 connected to the bit lines BL0 and BL1. The data read from the memory cells that are connected to the bit lines BL0 and BL1 is output to the data input/output buffer 104.

The signals CSL2 and CSL3 select the data memory 121 connected to the bit lines BL2 and BL3. The control data output from the data input/output buffer 104 is initially transferred to the data memory 121 that is connected to the bit lines BL2 and BL3.

In the read operation, each data memory 121 reads data from the memory cells connected to one of the two bit lines which are connected to the data memory 121. In the program operation, each data memory 121 applies a program-control voltage to the memory cells connected one of the two bit lines, in accordance with control data.

In the program verification operation, each data memory 121 detects the data-storage states of the memory cells connected to one of the two bit lines.

The memory cells M and the selection transistors S are of the same types shown in FIGS. 3A and 3B. Hence, they will not be described here, in detail. When a voltage higher than the threshold voltage of the memory cell M is applied to the control gate of the memory cell M, a channel is formed beneath the floating gate of the memory cell M. Assume that the capacitance between the control gate and the floating gate is 1 fF, that the capacitance between the floating gate and the channel is 1 fF, that the capacitance between the channel and the substrate 11 is 0.25 fF and that the capacitance between the n-type diffusion layer and the substrate 11 is 0.25 fF. Then, the ratio of the capacitive coupling of the control gate to that of the channel (or the n-type diffusion layer 12) is 50%. Hence, if the voltage applied on the control gate rises by 1V while the channel and n-type diffusion layer are in floating state, the potential of the channel or the n-type diffusion layer will increase by 0.5V.

The NAND-type cell units are of the types illustrated in FIG. 4, or are identical to those used in the first embodiment.

The data memories 121 shown in FIG. 34 are of the same type as is shown in FIG. 5, or identical to those incorporated in the first embodiment.

The word line controller 106 is of the same structure as its counterpart of the first embodiment, which is shown in FIG. 7.

The read operation in this embodiment is just the same as the read operation in the first embodiment, which has been explained with reference to FIGS. 8 and 9.

The program operation in this embodiment is exactly the same as the program operation in the first embodiment, which has been explained with reference to FIGS. 10 and 11.

The program verification operation in the present embodiment is identical to the program verification operation in the first embodiment, which has been explained with reference to FIGS. 12 and 13.

The algorithm of the program operation, applied to the present embodiment, is the program operation algorithm applied in the first embodiment, which is illustrated in FIG. 14.

The erase operation in this embodiment is the same as the erase operation in the first embodiment, which has been explained with reference to FIG. 15.

The soft-program operation in the present embodiment is identical to the soft-program operation in the first embodiment, which has been described with reference to FIG. 16.

The erase verification operation in this embodiment is exactly the same as the erase verification operation in the first embodiment, which has been explained with reference to FIGS. 17 and 18.

The erase operation algorithm employed in the present embodiment differs from the erase operation algorithm used in the first embodiment. This algorithm may be better understood if explained after the column scan detection circuit 109. The circuit 109 scans the data items stored in the memory cells of each column, which are latched by one data memory 121. Upon detecting a memory cell having a threshold voltage which is higher than the predetermined value (−0.7V), the circuit 109 stops scanning the data items in the memory cells.

Figure 35:
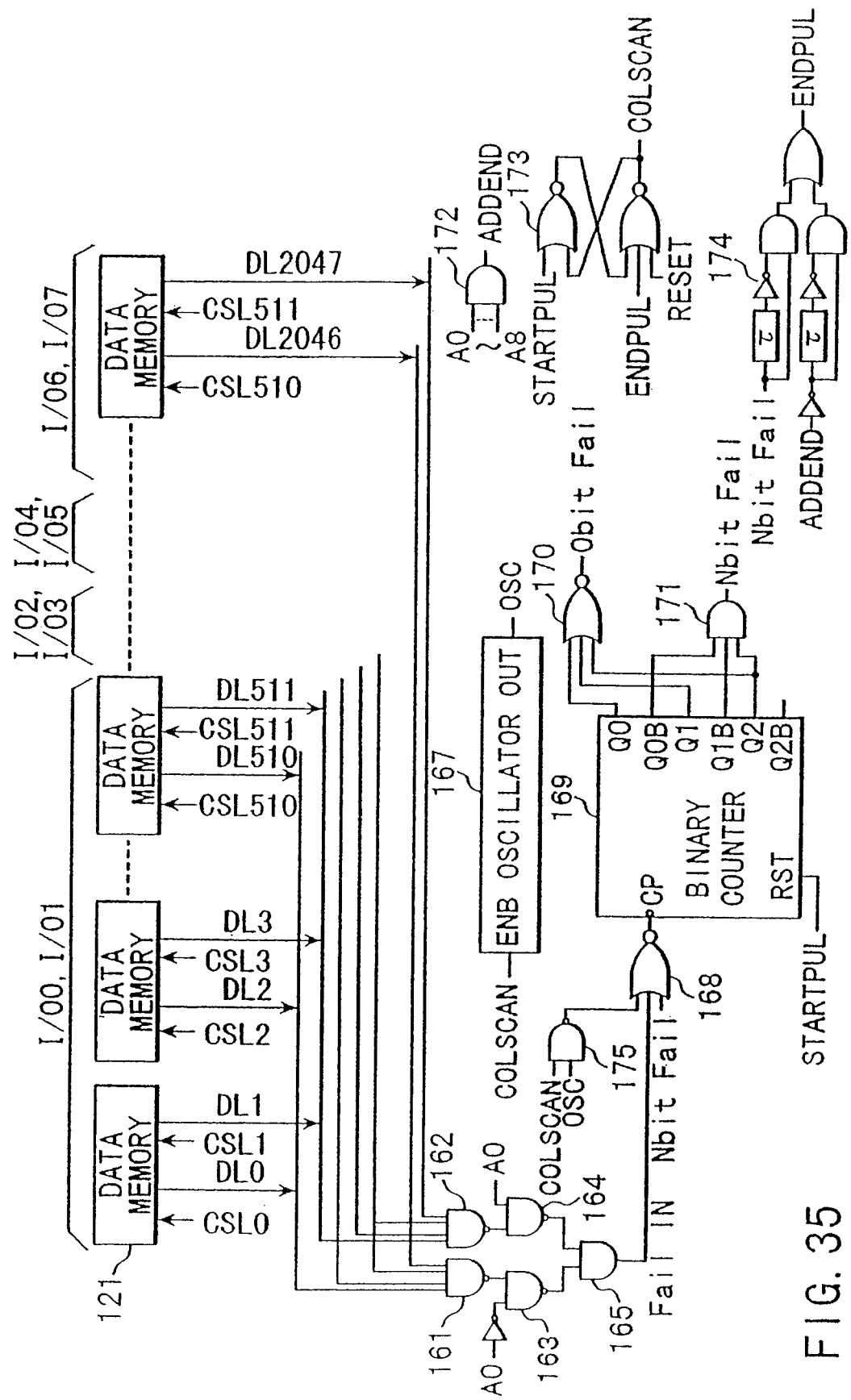
FIG. 35 shows, in detail, the column scan detection circuit in the fifth embodiment shown in FIG. 29.

FIG. 35 shows the column scan detection circuit 109. The data memories 121 are selected by column-selecting signals CLS0 to CSL511. When so selected, the data memories 121 output data items to data lines DL0 to DL2047. If the signal CSL0 is selected, the data is supplied to the data line DL0 via data input/output lines I/O0 and I/O1, to the data line DL512 via the data input/output lines I/O2 and I/O3, to the data line DL1024 via the data input/output lines I/O4 and I/O5, and to the data line DL1536 via the data input/output lines I/O6 and I/O7. If the signal CSL1 is selected, the data is supplied to the data line D1 via data input/output lines I/O0 and I/O1, to the data line DL513 via the data input/output lines I/O2 and I/O3, to the data line DL1025 via the data input/output lines I/O4 and I/O5, and to the data line DL1537 via the data input/output lines I/O6 and I/O7. The data items stored in the four memory cells connected to a data line DL selected by an even-numbered column-selecting signal CSL are input to a four-input NAND gate 161 to detect coincidence. Similarly, the data items stored in the four memory cells connected to a data line DL selected by an odd-numbered column-selecting signal are input to a four-input NAND gate 162 to detect coincidence.

If read failure occurs (because the cell has a threshold voltage of −0.7V or higher), the data will be supplied to the data line DL. In this case, data "1" is latched by the first and second sub-data circuits SD1 and SD2, and data "0" is latched at the nodes Nbi and $Nb_{i+1}$, both shown in FIG. 5.

In the erase verification operation, a margin voltage (e.g., 0.3V) is applied to the control gates of all memory cells of the NAND-type cell unit. Using the bit line potential of 0.7V as a reference value, it is possible to determine whether each memory cell has a threshold voltage lower than −0.4V which is higher than the first threshold voltage Vth1(−0.7V) If the threshold voltage of the memory cell is −0.4V or higher, it is determined that read failure has occurred.

If the four data items on the four data lines DL selected by an even-numbered column-selecting signal CSL are all "1" (that is, no read failure has occurred), the NAND gate 161 outputs "0." At this time, NAND gates 163 and 164 generate "1" because they have received the least significant bit A0 of the column address. The outputs "1" of the NAND gates 163 and 164 are input to an AND gate 165. The AND gate 165 therefore generates data "1," or an output Fail In of "1." On the other hand, if read failure is detected, the NAND gate 161 or the NAND gate 162 outputs "1." In this case, the NAND gate 163 or the NAND gate 164 outputs "0," whereby the AND gate 165 generates data "0," or an output Fail In of "0."

During the column scanning, the mode flag COLSCAN having value "1" is latched by an RS latch 173. While the flag COLSCAN remains at value "1," an oscillator 167 toggles a clock signal OSC. The flag COLSCAN and the clock signal OSC are input to a NAND gate 175. The output of the NAND gate 175, the output Fail IN of the AND gate 165, and fail bits Nbit Fail are input to a NOR gate 168. Hence, when Fail In="0," fail bits are input to a binary counter 169 as count pulses, in synchronism with the clock signal OSC. The counter 169, which counts fail bits, includes its count increased by one at each leading edge of the clock signal OSC when Fail In="0." The output of the binary counter 169 is decoded by a NOR gate 170 and an AND gate 171, which generate a signal 0 bit Fail and an Nbit Fail, respectively. As seen from FIG. 35, the signal Nbit Fail serves to detect a 4-bit fail. In other words, the output signal 0 bit Fail of the NOR gate 170 is "1" when no read fail has occurred, and the output signal Nbit Fail of the AND gate 171 is "1" when the counter 169 counts four read failures.

In the present embodiment, the 4-input NAND gates 161 and 162 compress 4-bit data into 1-bit data. This means that the signal Nbit Fail includes the value of "1" when read fail occurs on various numbers of bits, ranging from 4 bits to 16 bits. This does not matter at all, however. In the data-erasing sequence, soft-programming is performed at intervals, each time after the erase operation, thereby determining whether the upper limit of the threshold-voltage distribution is higher than −0.7V. Thus, the distribution degree sharply increases (>>16) in the near-upper limit region, from the upper limit toward the center of distribution.

Figure 36:
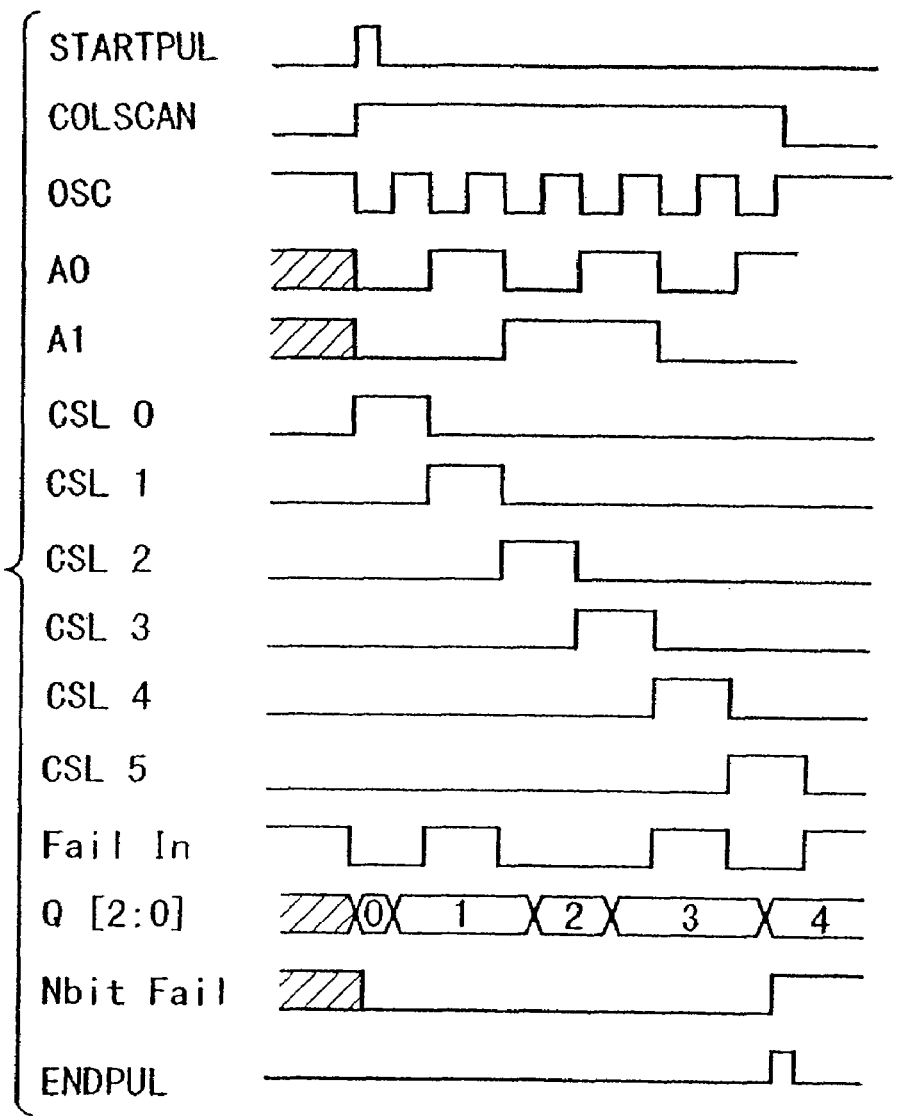
FIG. 36 is a timing chart for explaining how the column scan detection circuit operates in the fifth embodiment.

FIG. 36 explains how the column scan detection circuit 109 operates. To state more specifically, FIG. 36 shows that the circuit 109 stops scanning the columns of memory cells when read failure occurs on four bits.

The column address is reset when a pulse STARTPUL is supplied to the reset terminal of the binary counter 169. The counter 169 is thereby reset, toggling the clock signal OSC. The column address is incremented at every leading edge of the clock signal OSC, whereby column-selecting signals CSL0, CSL1, CSL2, and so on, are selected sequentially. The AND gate 165 generates an output Fail In corresponding to any column-selecting signal selected. The count of the binary counter 169 is incremented when Fail In="0" at the leading edge of the clock signal OSC. When the count increases to four, Nbit Fail="1." This is detected by a leading-edge detecting circuit 174, which generates an end pulse ENDPUL. The end pulse ENDPUL is supplied to the RS latch 173, resetting the latch 173. The latch 173 therefore ceases to hold the mode flag COL SCAN.

Figure 37:
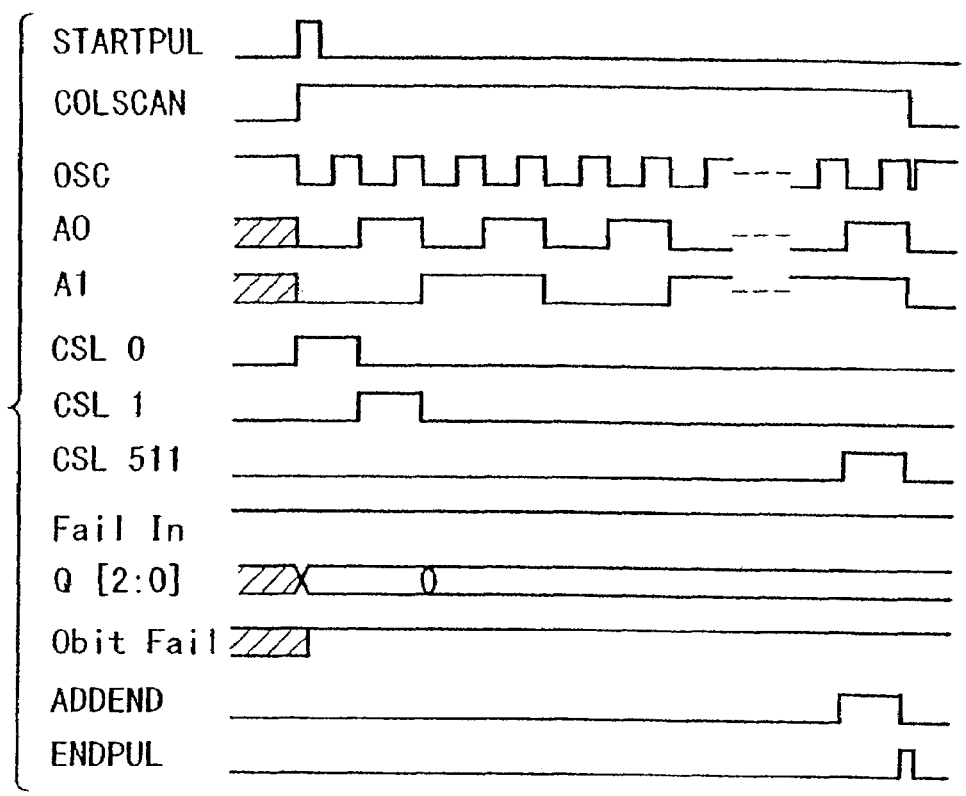
FIG. 37 is a timing chart for explaining how the column scan detection circuit operates in another manner in the fifth embodiment.

FIG. 37 explains how the column scan detection circuit operates 109 in another manner. More precisely, FIG. 37 shows that the circuit 109 stops scanning the columns of memory cells upon scanning the very last column of memory cells.

The column address is incremented in the same way as is shown in FIG. 36, whereby the column-selecting signals CSL0, CSL1, CSL2, . . . CSL511, are selected sequentially. If no read failure occurs in the process, Fail In="1." If so, the count of the binary counter 169 is not incremented at all. When the last column-selecting signal CSL511 is selected, an AND gate 172 outputs a signal ADDEND of "1," which indicates that all column addresses have been read. The leading-edge detecting circuit 174 detects the leading edge of the signal ADDEND and generates an end pulse END- PUL. Namely, the output signal 0 bit Fail of the NOR gate 170 holds "0" at this time. This means that the memory cell array 101 includes no memory cells that have a threshold voltage of −0.7V or higher.

Figure 39:
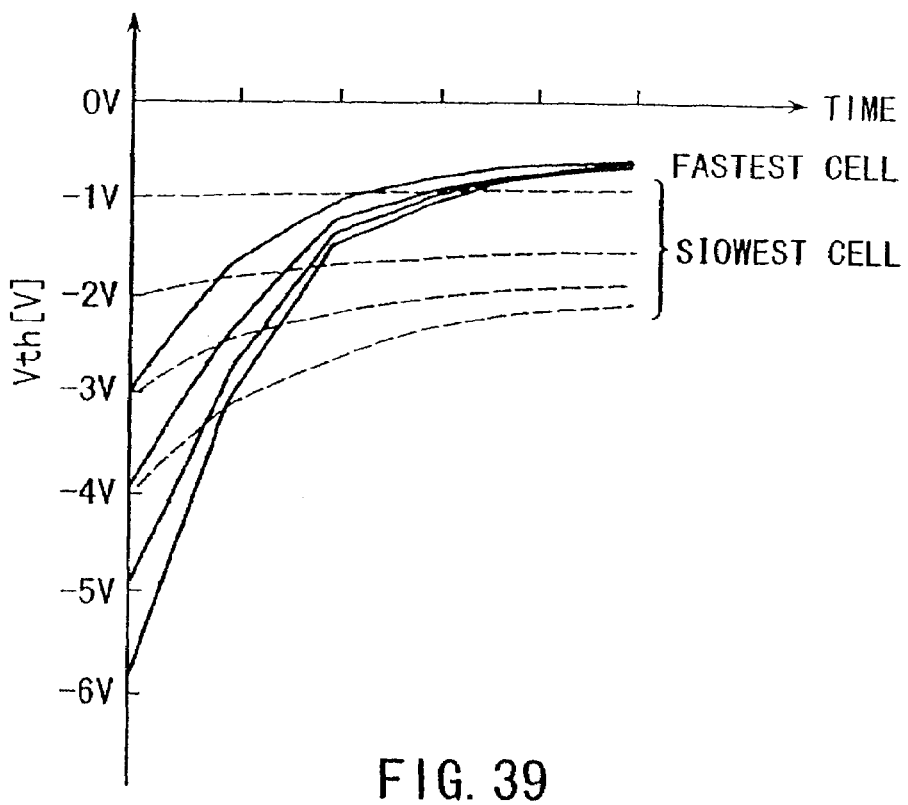
FIG. 39 is a graph showing how the threshold voltages of the memory cells change with time during the soft-program operation in the fifth embodiment.
Figure 38:
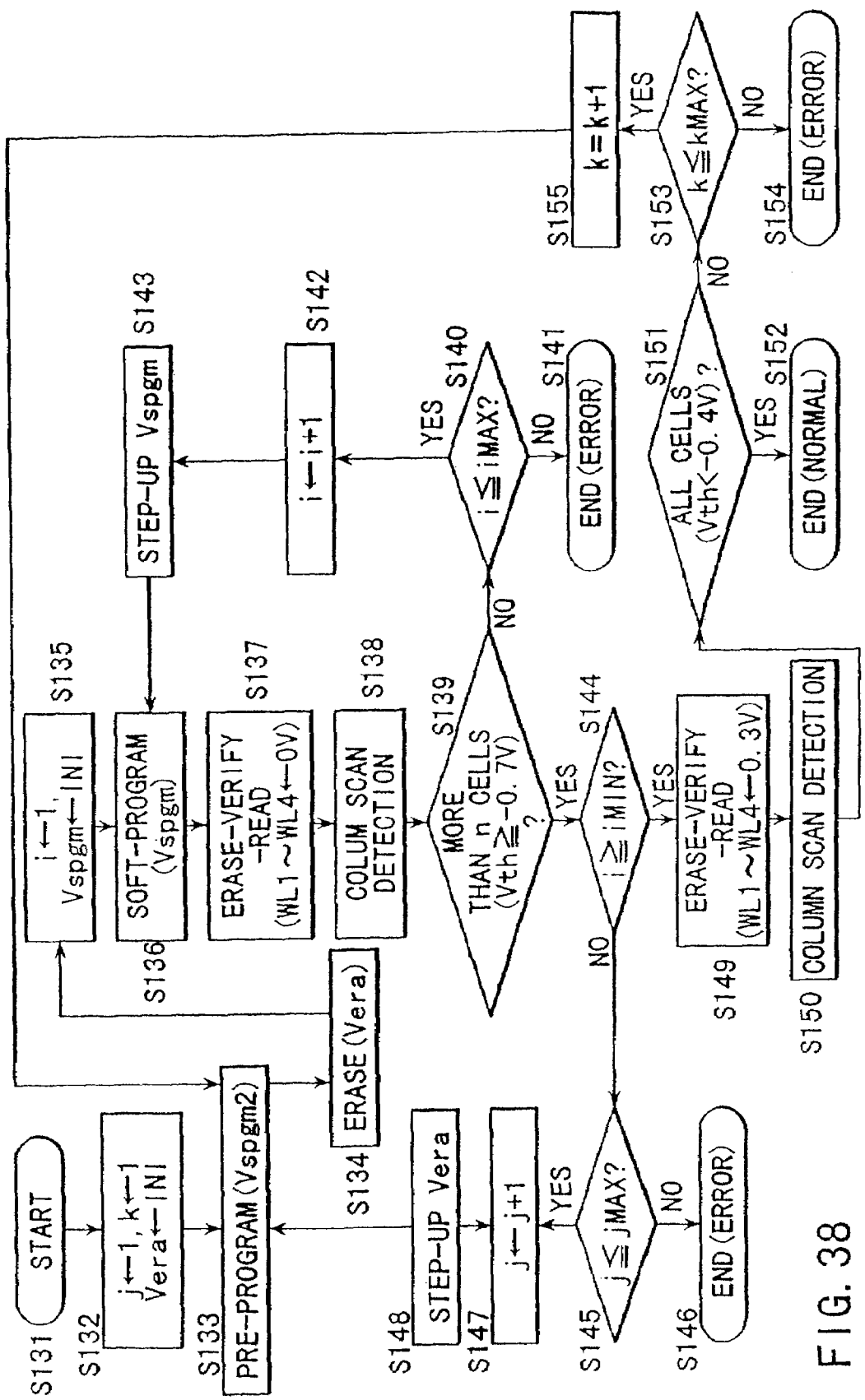
FIG. 38 is a flow chart explaining the erase operation in the fifth embodiment.

FIG. 38 shows the algorithm of performing the erase operation, soft-program operation, erase verification operation and column scanning, all described above. This algorithm is controlled by the control signal and control voltage generator 107. With reference to FIGS. 38 and 39, it will be described how the erase operation, soft-program operation, erase verification operation and column scanning are in the fifth embodiment.

An erase command is input to the control signal and control voltage generator 107 (Step S131). Variables j and k are set to 1, and the erase voltage Vera is set at an initial value (Step S132). FIG. 39 shows how the threshold voltages of the memory cells change with time during the soft-program operation. Assume that data has been erased from a slowest cell, into which data can be programmed but slowly. Then, the threshold voltage of the slowest cell is not sufficiently high when the threshold voltage of a fastest cell reaches −0.7V or higher.

In order to prevent this phenomenon, pre-program operation is performed on all memory cells of a block (Step S133) by applying a soft-program voltage Vspgm2. The voltage Vspgm2 is, however, almost equal to the ordinary program voltage, unlike the soft-program voltage Vspgm, which will be described later.

Then, the erase process is in units of blocks, in the same way as the erase process in the first embodiment, which has been described with reference to FIG. 15 (Step S134). The variable i is set to 1, and the soft-program voltage Vspgm is set at the initial value (Step S135). The voltage Vspgm is lower than ordinary program voltage, because the soft-program operation must be effected at intervals, little by little. Then, the soft-program operation is carried out on the entire block in the same way as the soft-program operation in the first embodiment, which has been explained with reference to FIG. 16 (Step S136). Thereafter, the erase verification operation is effected on the block in the same way as the erase verification operation in the first embodiment, which has been described with reference to FIGS. 17 and 18 (Step S137). Further, column scanning is effected, which has been explained with reference to FIGS. 34 to 37 (Step S138). It is then determined whether or not the block includes at least n memory cells which have a threshold voltage of −0.7V or higher (Step S139). The block is found to include at least n memory cells having such a threshold voltage, if the signal Nbit Fail is "1." In this instance, n is, for example, 4, for the following reason. One memory cell may have a threshold voltage of −0.7V or higher, greatly deviating from those of the other memory cells of the block. If so, data can be programmed into this memory cell far more quickly than into the other memory cells of the block, and the erase operation will then be terminated.

If NO in Step S139, it is determined whether the variable i is equal to or smaller than the maximum value iMAX (e.g., 32) (Step S140). If YES in Step S140, one is added to the variable i (Step S142). The soft-program voltage Vspgm is increased by, for example, 0.2V (Step S143). The operation returns to Step S136, in which the soft-program operation is performed again. If NO in Step S140, that is, if the variable i exceeds the maximum value iMAX, it is determined that the erase operation has ended unsuccessfully, and the erase operation is terminated (Step S141).

Erase verification operation is carried out (Step S137), and column scanning is effected (Step S138). Thereafter, it is determined in Step S139 that the block includes at least n memory cells having a threshold voltage of −0.7V or higher. Then it is determined whether variable i is equal to or greater than the minimum value iMIN, e.g., 5 (Step S144). If NO in Step S144, it is determined the variable j is equal to or smaller than the maximum value jMAX, e.g., 3 (Step S145) If YES, one is added to the variable j (Step S147). Then, the erase voltage Vera is increased by, for example, 0.5V (Step S148). The soft-program operation is carried out again (Step S133), and the erase operation is effected again (Step S134). If YES in Step S144, it is determined that the erase operation has ended unsuccessfully, and the erase operation is terminated (Step S146).

If YES in Step S144, that is, if the variable i is equal to or greater than the minimum value iMIN, erase verification operation is performed, applying an erase-verification operation margin voltage of 0.3V to all memory cells of each NAND-type cell unit (Step S149). Then, the column-scan verification operation is effected (Step S150).

Since the soft-program voltage Vspgm is increased by 0.2V each time, the change in the threshold voltage of any memory cell is saturated at about 0.2V after the soft-program operation has been repeated about five times. Hence, the upper limit of the threshold voltage of the memory cell must have changed to −0.7V or higher upon completion of the soft-programming loop in which −0.7V or higher is used as a reference value for the threshold voltage of the memory cells. The erase verification operation is, therefore, carried out by applying an offset voltage of 0.3V to all the memory cells of each NAND-type memory cell unit, so that the memory cells may finally have a threshold voltage of −0.4V or lower.

In Step S151, it is determined whether or not all memory cells have a threshold voltage of −0.4V or lower. If NO, that is, if at least one memory cell has a threshold voltage exceeding −0.4V, the operation goes to Step S153. In Step S153, it is determined whether or not the variable k is equal to or lower than the maximum value kMAX. If YES in Step S153, it is determined that the erase operation has ended unsuccessfully, and one is added to the variable k (Step S155). Then, the operation returns to Step S133, in which the soft-programming is performed again. The erase operation is effected again (Step S134).

If NO in Step S153, that is, if the variable k exceeds the maximum value kMAX, it is determined that the erase operation has ended unsuccessfully, and the erase operation is terminated (Step S154).

No memory cells are left over-erased by performing the erase operation as described above, causing the threshold voltage to fall with the allowable range. The program operation can thereby be effected successfully. In particular, an erroneous program operation on NAND-type memory cells can be prevented. This is accomplished by applying 0V on the word lines connected to the two memory cells adjacent to the selected memory cell, thereby turning off these memory cells. The channel of the selected memory cell is therefore set into a floating state, to have its potential increased by virtue of the capacitive coupling with the selected word line.

In the nonvolatile semiconductor memory device, the erase operation is performed, and the soft-program operation and verification read operation are then performed at intervals, little by little. The soft-program operation is terminated when it is determined that a plurality of memory cells have threshold voltages reaching the prescribed value. This prevents the soft-program operation from being terminated, leaving the memory cells left over-erased, though data is easily programmed into these memory cells. Thus, the threshold voltage of any memory cell set in erased state is made to fall within the allowable range, preventing the memory cell from functioning erroneously.

The fifth embodiment can be modified in the same way as the first embodiment. In other words, the second to fourth embodiments can be applied to the fifth embodiment, too.

In the embodiments described above, the upper limit of the threshold-voltage distribution is controlled so that each memory may have a threshold voltage of −0.7V or lower before data is erased from the memory cell. Despite this measure taken, data may be erroneously programmed into the memory cell. This is because the threshold voltage that each memory cell includes after data is erased from it ranges from, for example, −1V to −5V.

To prevent such erroneous programming of data, it is desirable the threshold voltage of each memory cell after being erased be controlled not to fall to, for example, −3V or lower. The threshold voltage of each memory cell is so controlled in the sixth to twelfth embodiments of the invention, which will be described below.

The sixth to twelfth embodiments are all EEPROMs comprising multi-value NAND-type cell units. These embodiments can be applied to binary NAND-type EEPROMs, because the erase process is in the same way on a multi-value NAND-type cell unit and a binary NAND-type cell unit.

Sixth Embodiment

Figures 40A, 40B:
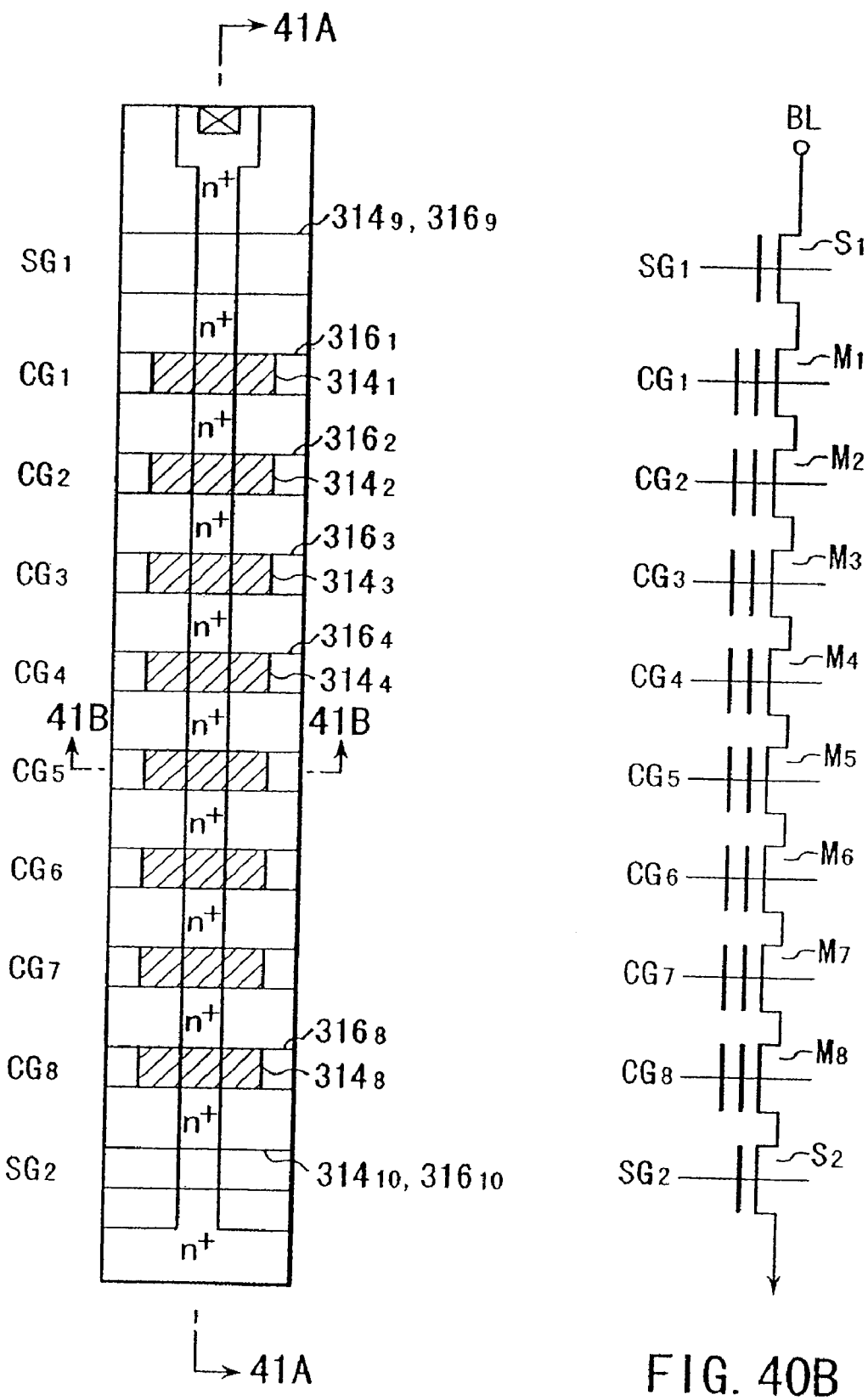
FIGS. 40A and 40B are respectively a plan view of a NAND-type EEPROM cell unit for use in a sixth embodiment according to the invention and an equivalent circuit diagram thereof.
Figure 41A:
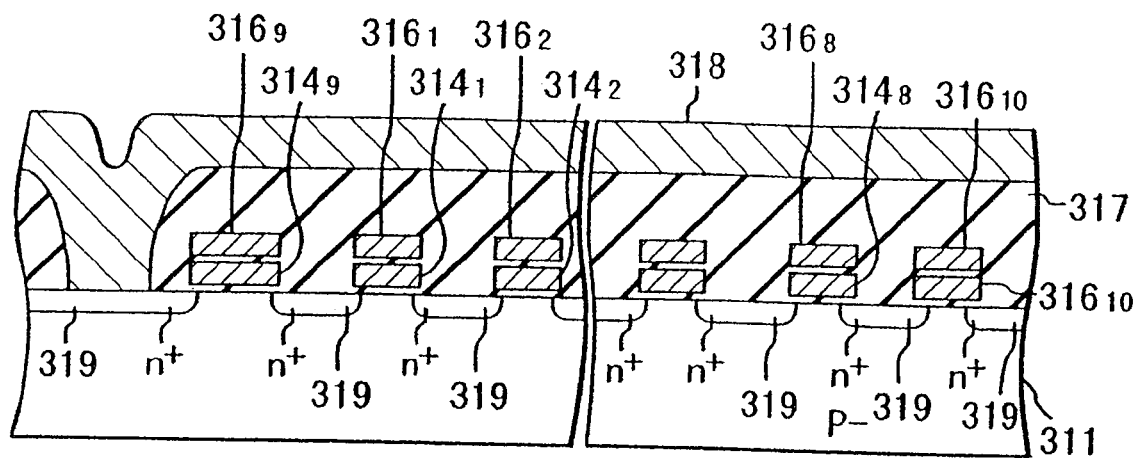
FIGS. 41A and 41B are sectional views taken along two different lines in FIG. 40A.
Figure 41B:
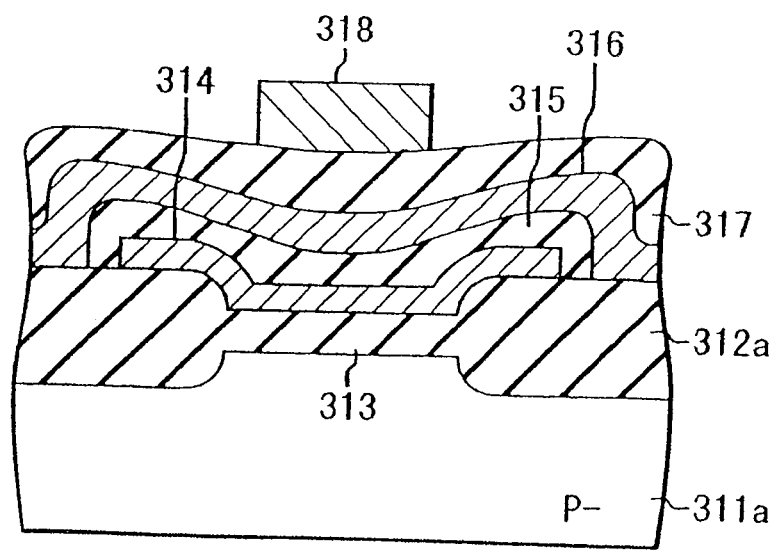

FIG. 40A is a plan view of a NAND-type EEPROM cell unit for use in the sixth embodiment of the invention. FIG. 40B is an equivalent circuit diagram thereof. FIG. 41A is a sectional view taken long line 41A-41B shown in FIG. 40A. FIG. 41B is a sectional view taken along line 41B-41B shown in FIG. 40A.

A memory cell array is in a p-type silicon substrate (or p-type well) 311a which is surround by an element-isolating oxide film 312a. The memory cell array comprises a plurality of NAND-type cell units. Each NAND-type cell unit is composed of eight memory cells M1 to M8 connected in series. In each memory cell, a gate insulating film 313 is formed on the substrate 311a, and a floating gate 314 ($314_1$, $324_2$, ... $314_8$) is provided on the gate insulating film 313. N-type diffusion layers 319 used as the source and drains of the memory cells M1 to M8 are electrically connected in series, each to two adjacent ones.

First selection gates $314_9$ and $316_9$ are provided on the drain side of each NAND-type cell unit. Second selection gates $314_{10}$ and $316_{10}$ are provided on the source side on each NAND-type cell unit. The selection gates $314_9$, $316_9$, $314_{10}$ and $316_{10}$ have been formed at the same time, together with the floating gates 314 ($314_1$ to $314_8$) and the control gates 316 ($316_1$ to $316_8$) The selection gates $314_9$ and $316_9$ are two layers located one above the other and electrically connected at a part (not shown). Similarly, the selection gates $314_{10}$ and $316_{10}$ are two layers located one above the other and electrically connected at a part (not shown). The substrate in which elements have been formed is covered with a CVD oxide film 317. Bit lines 318 are arranged on the CVD oxide film 317. The control gates $316_1$, $316_2$, ... and $316_8$ (CG1, CG2, ... and CG8) of each NAND-type cell unit function as word lines. The selection gates $314_9$ and $316_9$ (SG1) and the selection gates $314_{10}$ and $316_{10}$ (SG2) extend in parallel to the columns of memory cells, and function as selection gate lines.

Figure 42:
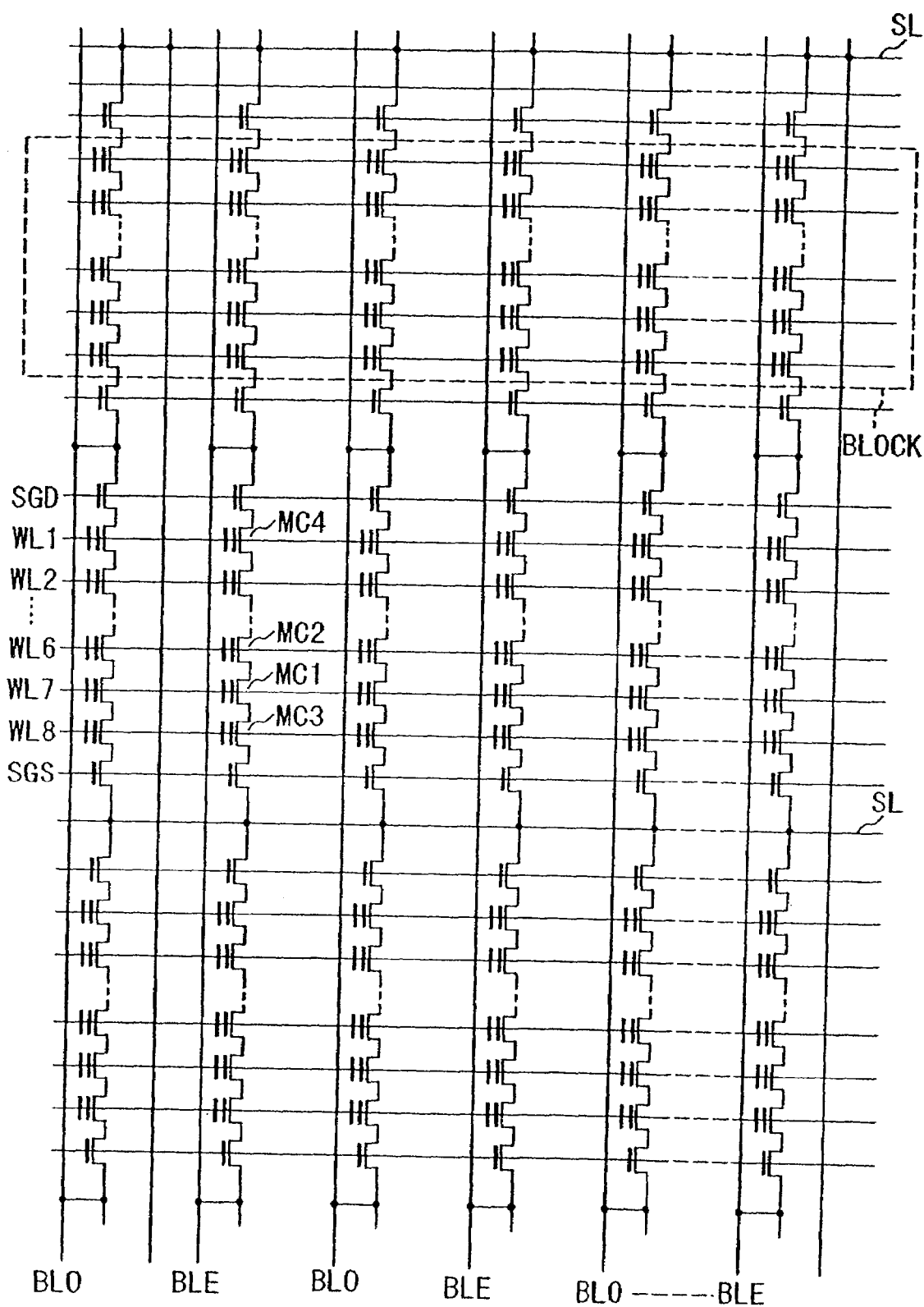
FIG. 42 is a circuit diagram of the memory cell array in the sixth embodiment.

FIG. 42 is an equivalent circuit diagram of the memory cell array which comprises the NAND memory cells arranged in rows and columns. The memory cell array further comprises source lines SL, each provided for, for example, every 64 bit lines. Each source line SL is connected at one part (not shown) to a reference potential line by a contact (not shown). The reference potential line is made of aluminum (Al), polysilicon (poly-Si) or the like, and is connected to the circuits provided around the memory cell array.

The control gates, first selection gates and second selection gates of memory cells extend parallel to the rows of memory cells. The set of memory cells connected to one control gate is called "one page." A set of pages provided between a source (i.e., first selection gate) and a drain (i.e., second selection gate) is called "one NAND block" or "one block." One page comprises, for example, 256×8 memory cells and can hold 256 bytes of data. Data is programmed into the memory cells of one page, at substantially the same time. One block comprises, for example, 2,048×8 memory cells and can hold 2,048 bytes of data. Data is erased from the memory cells of one block, substantially at the same time.

Figure 43:
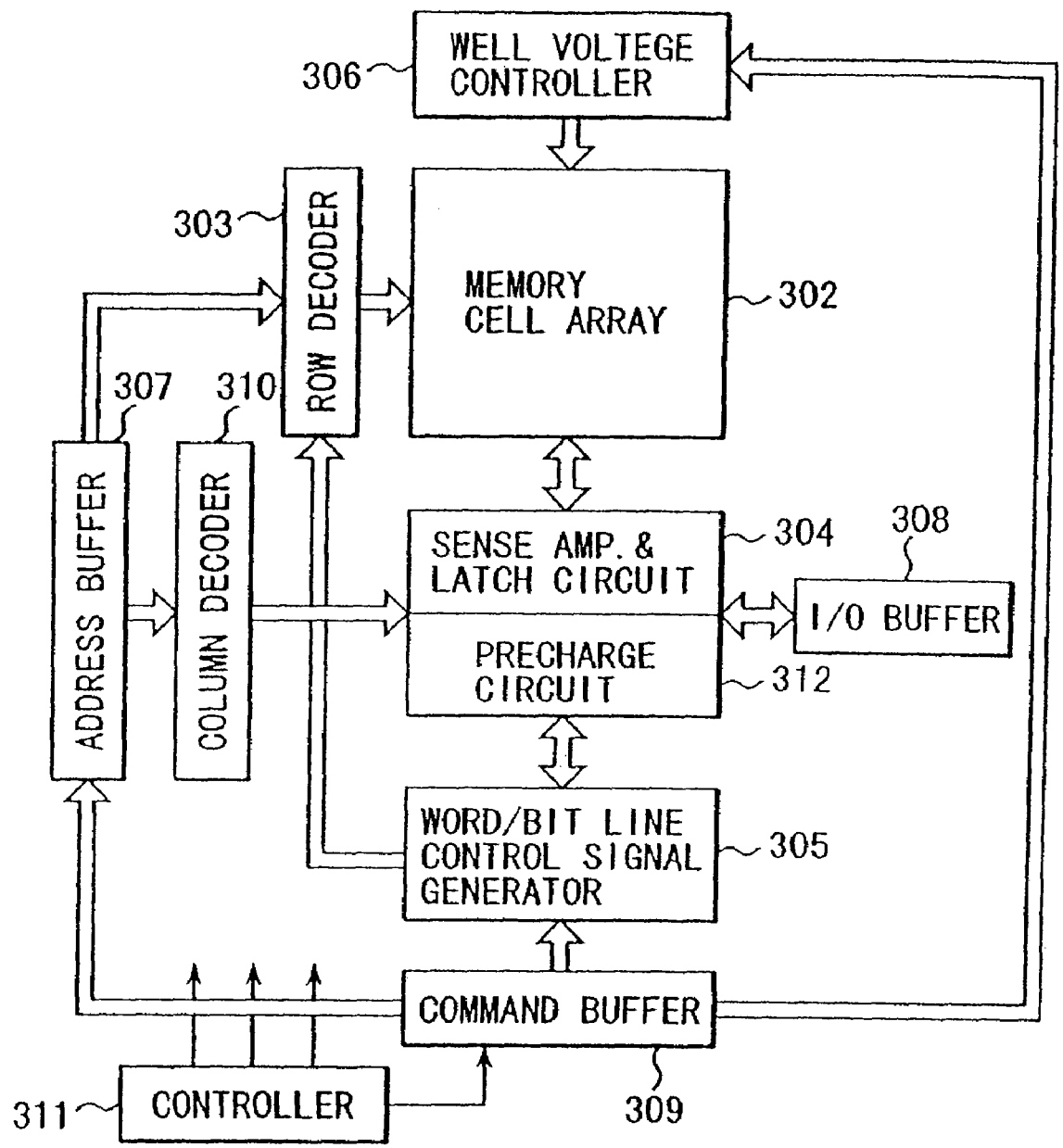
FIG. 43 is a block diagram showing the sixth embodiment.

FIG. 43 is a block diagram showing a nonvolatile semiconductor memory device according to the sixth embodiment. As FIG. 43 shows, the memory comprises a memory cell array 302, a row decoder 303, a sense-amplifier/latch circuit 304, a word line/bit line control signal generator 305, a well voltage controller 306, an address buffer 307, an I/O buffer 308, a command buffer 309, a column decoder 310, a controller 311, and a pre-charge circuit 312.

As shown in FIG. 43, the memory cell array 302 comprises word lines WL1 to WL4, bit lines BLE, bit lines BLO, and a number of memory cells. Each bit line BLE is connected an even-numbered page, and each bit line BLO to an odd-numbered page. The memory cells are arranged in rows and columns. Each memory cell can be selected by energizing one word line and one bit line, to which it is connected.

In the present embodiment, a group of memory cells which can be selected simultaneously is called "page." Every two bit lines share the sense amplifier as will be described later, whereas each bit line is connected one sense amplifier in the first to fifth embodiments. Hence, one page is not defined by all memory cells connected to one word line. Rather, of the memory cells connected one word line, the even-numbered cells constitute one page, and the odd-numbered cells constitute another page.

The address buffer 307 generates a column address signal and a row address signal in accordance with an input address or a command supplied from the command buffer 309. The row decoder 303 selects a word line in accordance with the row address signal supplied from the address buffer 307, and applies a prescribed voltage to the memory cells connected to the selected word line. The column decoder 310 selects the sense amplifier/latch circuit 304 and connects the same to the bit line, in accordance with the column address signal supplied from the address buffer 307. The sense amplifier/latch circuit 304 latches and senses that voltage on the bit line which corresponds to the data read from the memory cell, and also applies a voltage to the bit line to program data into the memory cell. The data thus programmed into the memory cell corresponds to the voltage applied to the bit line. The word line/bit line control signal generator 305 supplies control signals to the word lines and the bit lines. The pre-charge circuit 312 applies a voltage to the bit lines not connected to the sense amplifier/latch circuit 304 when data is to be programmed into the memory cells. This voltage is not high enough to change the data. The I/O buffer 308 stores the input data to be programmed into the memory cells and also stores the output data read from the memory cells. That is, the I/O buffer 308 is a relay between the memory cell array 302 and a device provided outside the nonvolatile semiconductor memory device. The command buffer 309 generates various commands such as a program command and a read command. The well voltage controller 306 applies a predetermined voltage to the well region of each memory cell. The controller 311 is connected to the command buffer 309, well voltage controller 306, the voltage generator (not shown), and the like. It controls the various process in the memory device, including program operation, read operation, erase operation, and verification operation. It also controls the sequence of over-erase verification operation and the sequence of soft-program operation, as will be described later.

Figure 44:
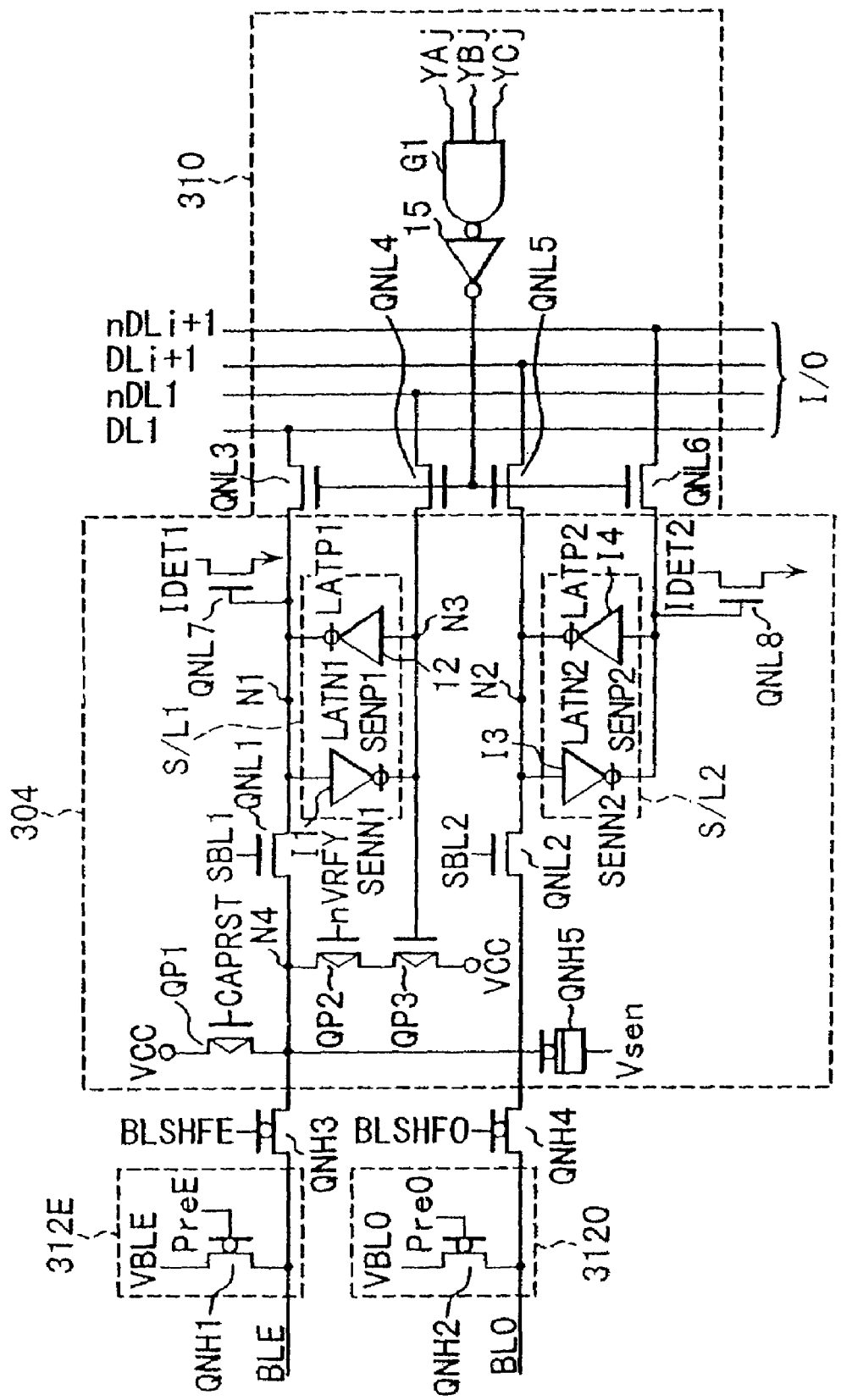
FIG. 44 is a circuit diagram showing the sense amplifier/latch circuit in the sixth embodiment.

FIG. 44 is a circuit diagram illustrating the connection of the column decoder 310, sense amplifier/latch circuit 304, pre-charge circuit 312, bit lines and I/O lines, all shown in FIG. 43. The present embodiment is a nonvolatile semiconductor memory device which comprises three-value NAND-type flash memory cell units.

The three-value sense amplifier/latch circuit 304 is selectively connected to two bit lines BLE and BLO by n-channel MOS (NMOS) transistors QNH3 and QNH4 having a high withstand voltage. The two bit lines BLE and BLO, so to speak, shares the three-value sense amplifier/latch circuit 304. Signal BLSHFE is supplied to the gate of the NMOS transistor QNH3, and signal BLSHFO is supplied to the gate of the NMOS transistor QNH4. Pre-charge circuits 312E and 312O are connected to the bit lines BLE and BLO, respectively.

The pre-charge circuit 312E connected to the bit line BLE is composed of, for example, an NMOS transistor QNH1 which includes a high withstand voltage. The current path of the NMOS transistor QNH1 is connected at one end to the bit line BLO. A voltage VBLE is applied to the other end of the current path of the NMOS transistor QNH1. Signal PreE is supplied to the gate of the NMOS transistor QNH1.

The pre-charge circuit 312O connected to the bit line BLO is composed of, for example, an NMOS transistor QNH2 which includes a high withstand voltage. The current path of the NMOS transistor QNH2 is connected at one end to the bit line BLO. A voltage VBLE is applied to the other end of the current path of the NMOS transistor QNH2. Signal PreO is supplied to the gate of the NMOS transistor QNH2.

The three-value sense amplifier/latch circuit 304 comprises two sense amplifier/latch circuits S/L1 and S/L2 (hereinafter referred to as "sense/latch circuits.") The first sense/latch circuit S/L1 is composed of two inverters I1 and I2. The second sense/latch circuit S/L1 is composed of two inverters I3 and I4. The inverter I1 is a clocked inverter driven by signals SENN1 and SENP1. The inverter I2 is a clocked inverter driven by signals LATN1 and LATP1. The inverter I3 is a clocked inverter driven by signals SENN2 and SENP2. The inverter I4 is a clocked inverter driven by signals LATN2 and LATP2.

The three-value sense amplifier/latch circuit 304 further comprises p-channel MOS (PMOS) transistors QP1, QP2 and QP3 and n-channel MOS (NMOS) transistors QNL1, QNL2, QNH5, QNL7 and QNL8. The power-supply voltage VCC is applied to one end of the current path of the PMOS transistor QP1. The other end of the current path is connected to the current path of the NMOS transistor QNH3. The PMOS transistors QP2 and QP3 are connected in series between the other end of the current path of the PMOS transistor QP1 and the terminal applied with the power-supply voltage VCC. Signal nVRFY is supplied to the gate of the PMOS transistor QP2. The node N4 of the transistors QP1 and QP2 is connected to one end of the current path of the NMOS transistor QNL1. Signal SBL1 is supplied to the gate of the transistor QNL1. The other end of the current path of the transistor QNL1 is connected to the input terminal of the inverter I1 and the output terminal of the inverter I2. The output terminal of the inverter I1 and the input terminal of the inverter I2 are connected to the gate of the transistor QP3.

Voltage Vsen is applied to one end of the current path of the transistor QNH5 which constitute a capacitor. The other end of the current path of the transistor QNH5 is connected to the current path of the transistor QNH4 and also to one end of the current path of the NMOS transistor QNL2. Signal SBL2 is supplied to the gate of the transistor QNL2. The other end of the current path of the transistor QNL2 is connected the input terminal of the inverter I3 and the output terminal of the inverter I4. The output terminal of the inverter I3 and the input terminal of the inverter I4 are connected to each other.

The other end of the current path of the transistor QNL1 is connected to the gate of the NMOS transistor QNL7. The current path of the transistor QNL7 is connected at one end to a wiring IDET1 and is connected at the other end to the ground. The input terminal of the inverter I4 is connected to the gate of the NMOS transistor QNL8. The current path of the transistor QNL8 is connected at one end to a wiring IDET2 and is connected at the other end to the ground.

The three-value sense amplifier/latch circuit 304 is connected to the I/O lines by the column decoder 310. The column decoder 310 comprises an NAND gate G1, an inverter I5, and NMOS transistors QNL3, QNL4, QNL5 and QNL6. Address signals YAj, YBj and YCj are input to the NAND gate G1. The output of the NAND gate G1 is connected to the input of the inverter I5. The output of the inverter I5 is connected to the gates of the NMOS transistors QNL3, QNL4, QNL5 and QNL6. The current path of the transistor QNL3 is connected at one end to the output terminal of the inverter I2. The current path of the transistor QNL4 is connected at one end to the input terminal of the inverter I2. The current path of the transistor QNL5 is connected at one end to the output terminal of the inverter I4. The current path of the transistor QNL6 is connected at one end to the input terminal of the inverter I4. The current paths of the transistors QNL3, QNL4, QNL5 and QNL6 are connected at the other end to I/O lines DL1, nDL1, $DL_{i+1}$, $nDL_{i+1}$, respectively.

Table 5 below shows the relationship of the data items "0," "1," and "2" each memory cell may store, the threshold voltages the cell may have, and data items N1 and N2 the circuit 304 may latch.

TABLE 5

| Tri-level Data | Threshold Voltage | Read | | Program | |
| --- | --- | --- | --- | --- | --- |
| | | N1 | N2 | N1 | N2 |
| "0" | −3 V to 0 V | L | L | HL | H |
| "1" | 1 V to 1.5 V | H | L | L | H |
| "2" | 2 V to 2.5 V | H | H | L | L |

Figure 45:
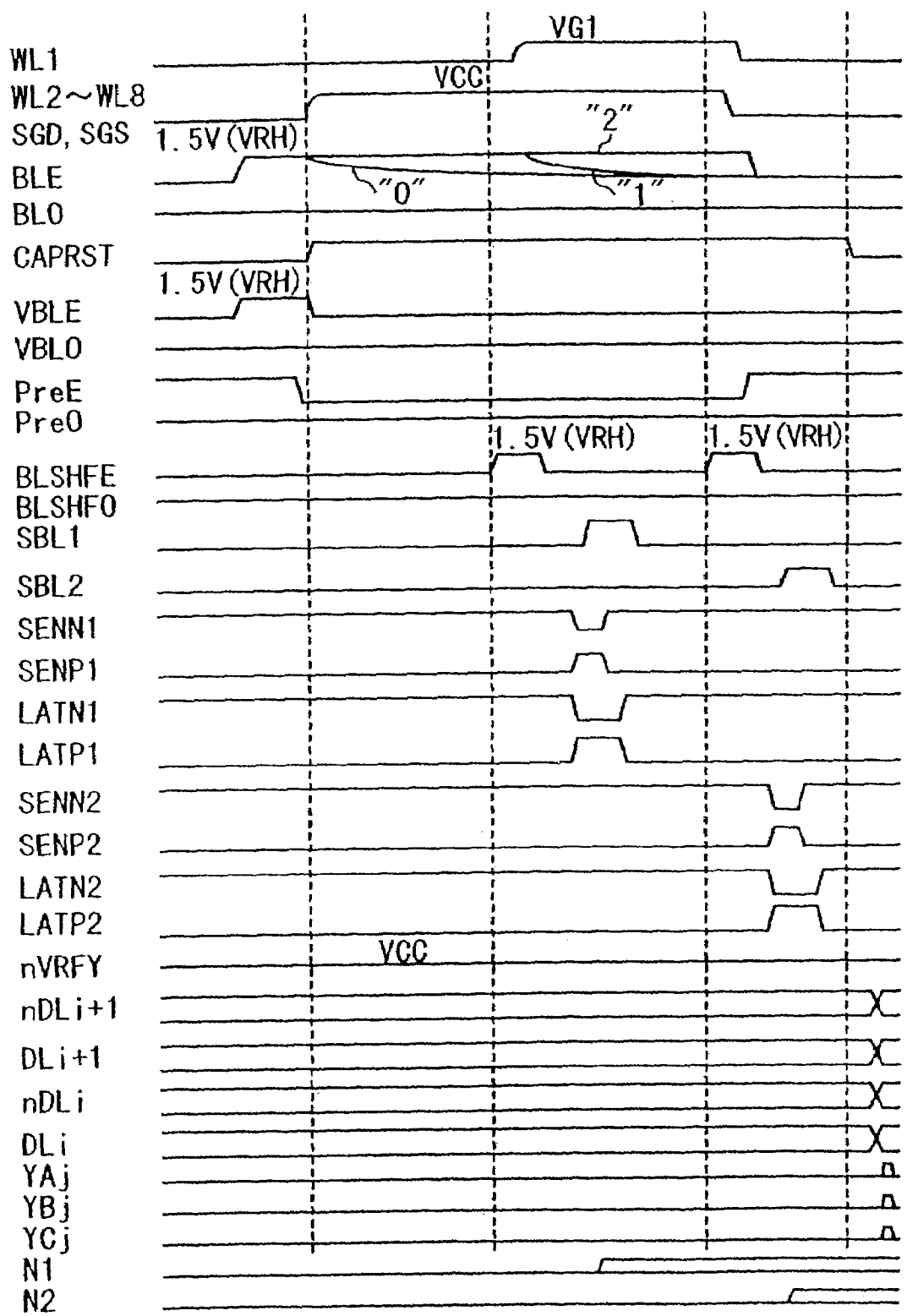
FIG. 45 is a timing chart explaining the read operation in the sixth embodiment.
Figure 46:
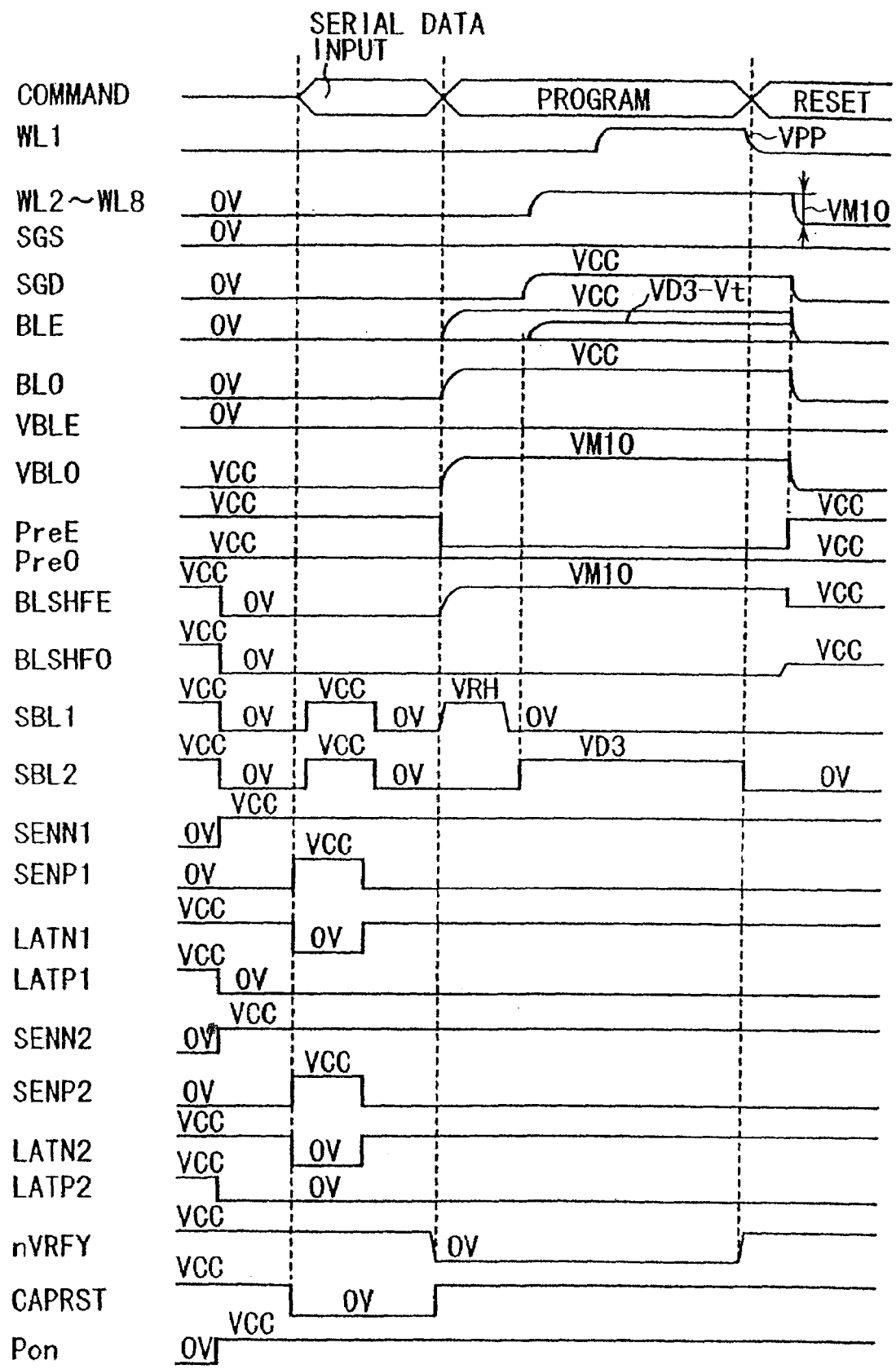
FIG. 46 is a timing chart explaining the program operation in the sixth embodiment.
Figure 47:
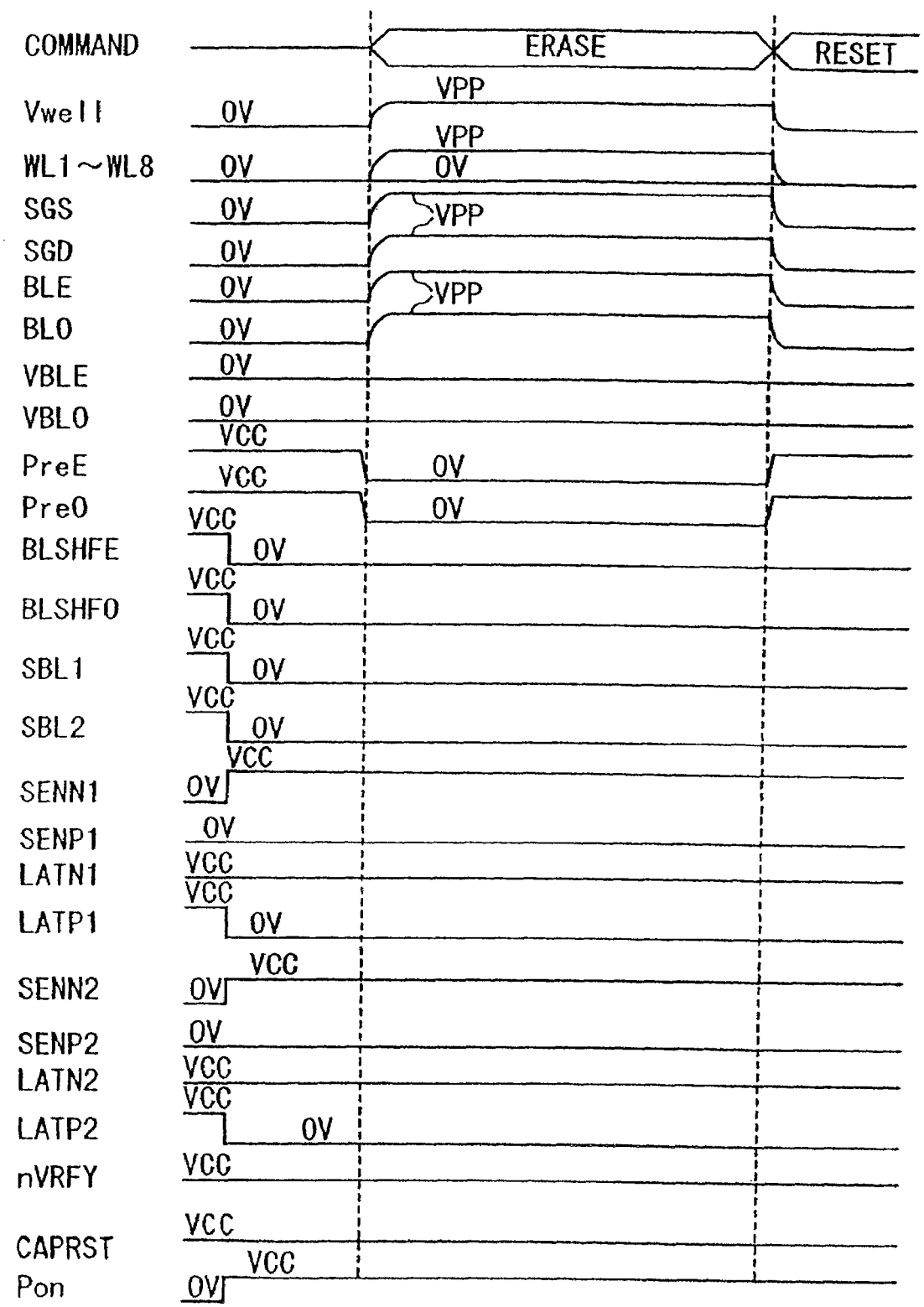
FIG. 47 is a timing chart explaining the erase operation in the sixth embodiment.

FIGS. 45, 46 and 47 are timing charts, respectively explaining the read operation, the program operation, and the erase operation. In the present embodiment, the bit line BLE is selected and the bit line BLO is not selected. Assume that the memory cell MC4 (FIG. 42) has been selected.

How the read operation is performed on the memory cell MC4 will be explained, with reference to FIG. 45.

The selected bit line BLE is charged to 1.5V by the pre-charge circuit 12 driven by signal PreE. The bit line BLE is then set into floating state. Thereafter, the nonselected word line WL2 to WL8 and selection gates SGS and SGD are set at the power-supply voltage VCC. The selected word line is set at 0V. If the selected memory cell MC4 stores data "0," the bit line BLE is discharged to 0V. If the memory cell MC4 stores data "1" or data "2," the bit line BLE remains at 1.5V.

The voltage on the bit line BLE is applied to the first sense/latch circuit S/L1 through the transistor QNH3 which has been turned on by signal BLSHFE and through the transistor QNL1 which has been turned on by the signal SBL1. Hence, the potential of the node N1 is at "L" level if the memory cell MC4 stores data "0", or at "H" level if the memory cell MC4 stores data "1" or data "2."

Thereafter, the selected word line is set at VG1 (=1.8V). Then, the bit line BLE is discharged to 0V if the memory cell MC4 stores data "1," remains at 1.5V if the memory cell MC4 stores data "2," or set at 0V if the memory cell MC4 stores data "0." The voltage on the bit line BLE is applied to the second sense/latch circuit S/L2 through the transistor QNH3 and through the transistor QNL2 which has been turned on by the signal SBL2. Hence, the potential of the node N2 is at "L" level if the memory cell MC4 stores data "0" or "1," or at "H" level if the memory cell MC4 stores data "2." (See Table 5.) The data items latched by these sense/latch circuits S/L1 and S/L2 are read serially to the I/O lines as the column decoder 310 performs its function.

How the program operation is performed on the memory cell MC4 will be explained, with reference to FIG. 46.

The operating voltage of the memory device becomes high enough to operate the memory normally after the power switch has been closed. Then, power-on signal Pon rises to "H" level. At the leading edge of the signal Pon, both data items N1 and N2 latched by the three-value sense amplifier/latch circuit 304 are set at "L" level. When a program command is supplied to the memory, both data items N1 and N2 latched by the circuit 304 are inverted, rising to "H" level.

The selected bit line BLE is set at VCC if the program data is "0," at VD3−Vt(=1V) if the program data is "1," and at 0V if the program data is "2." The voltage VCC is applied to the nonselected bit line BLO, via the pre-charge circuit 3120, thereby not to change the data. Thereafter, the selection gate SGD is set at VCC, the selection gate SGS is set at 0V, the selected word line WL1 is set at VPP(=20V), the selected word line WL2 is set at 0V, and the nonselected word lines WL3 to WL8 are set at VM10(=10V). Of the voltages applied from the sense amplifier/latch circuit 304 to the bit lines, 0V is the program voltage and VCC is the non-program voltage.

The selected memory cell, which is connected to the bit line applied with either 0V or 1V includes a high gate-channel voltage. A tunnel current therefore flows in the memory cell, increasing the threshold voltage of the memory cell. The threshold voltage increases more when the bit line is applied with 0V than when the bit line is applied with 1V. This is because more tunnel current flows when the bit line is applied with 0V than when the bit line is applied with 1V. Since the selected memory cell, which has been applied with VCC, includes a low gate-channel voltage, no tunnel current flows in the memory cell. The memory cell therefore keeps storing data "0."

How the erase operation is performed on the memory cell MC4 will be explained, with reference to FIG. 47.

When a program command is supplied to the memory device, a voltage VPP(=20V) is applied to the well of the memory cell array 302. The selected memory cell therefore has its gate set at 0V. The tunnel current flows in the direction reverse to that direction in which it flows to program data in the memory cell. As a result, the threshold voltage of the memory cell falls. By contrast, the nonselected memory cells and the selection transistors have their gates set into floating state. The gate voltages of the nonselected memory cell and selection transistors rises to a value near VPP, along with the voltage of the well of the array 302. No tunnel current flows in the nonselected memory cell, and the threshold voltage of the nonselected memory cell does not change at all.

As described above, the program data and the read data are connected to only one of the two memory-cell columns which are connected to the three-value sense amplifier/latch circuit 304, e.g., the bit line BLE. In the erase operation, both memory-cell columns, or both bit lines BLE and BLO, are selected at the same time, thereby erasing the data from the entire block.

<Erase-Verification Read Operation>

After the erase operation, an erase-verification read operation is performed to determine whether or not the memory cell has assumed erased state, with its threshold voltage decreased to a predetermined value or a smaller value.

Figure 48:
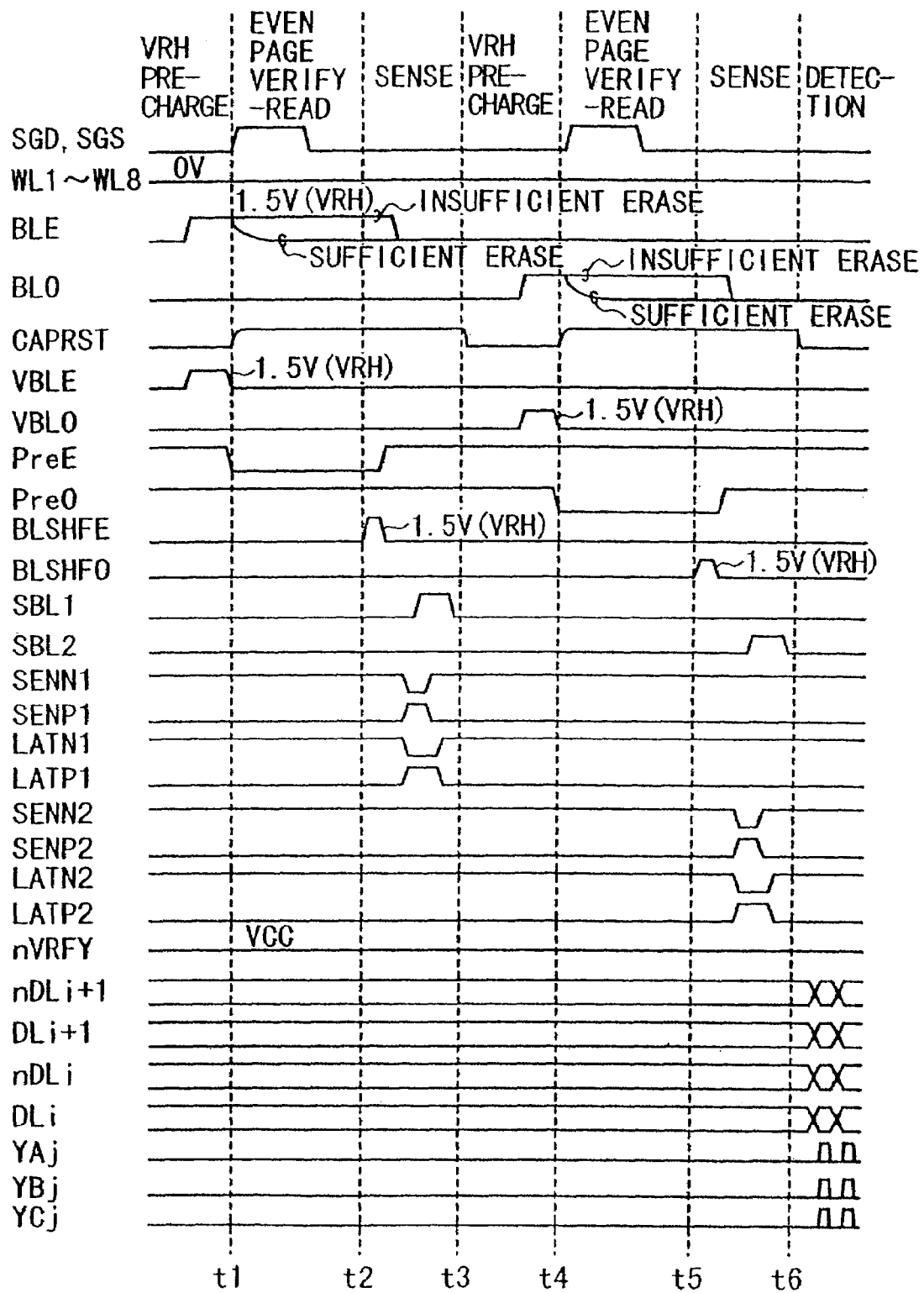
FIG. 48 is a timing chart explaining the erase-verification read operation in the sixth embodiment.

FIG. 48 is a timing chart explaining the erase-verification read operation. After data has been erased from all memory cells of one block (the memory cells have been selected by energizing, for example, the word lines WL1 to WL8), the verification read operation is performed first on the memory cells constituting even-numbered pages and then on the memory cells constituting odd-numbered pages.

First, the verification read operation is effected on an even-numbered page (e.g., the memory cells connected to the bit line BLE shown in FIG. 42). The read data from the even-numbered page is held in the first sense/latch circuit S/L1. Then, the verification read operation is effected on an odd-numbered page (e.g., the memory cells connected to the bit line BLO shown in FIG. 42). The read data from the odd-numbered page is held in the second sense/latch circuit S/L2.

More specifically, the bit line BLE is charged to 1.5V as shown in FIG. 48. Thereafter, at time t1 the selection gates SGS and SGD are set at the power-supply voltage VCC, and the word lines WL1 to WL8 are set at 0V. If data has completely erased from the memory cells, all memory cells are conductive. The bit line BLE is therefore discharged to 0V. If data has not completely erased from the memory cells, at least one of the memory cells is nonconductive. In this case, the bit line BLE is not discharged, remaining at 1.5V.

At time t2, the signal BLSHFE is set at 1.5V, turning on the transistor QNH3. The potential of the bit line BLE is applied to the three-value sense amplifier/latch circuit 304. When the signal SBL1 rises to "H" level thereafter, the transistor QNL1 is turned on. Data is transferred to the node N1 and sensed by the first sense/latch circuit S/L1. Thus, the data read from the even-numbered page is held by the first sense/latch circuit S/L1. While data is being read from the even-numbered page, the bit line BLO is held at 0V, reducing the coupling noise between the bit lines.

Next, the verification read operation is effected on the odd-numbered page (e.g., the memory cells connected to the bit line BLO shown in FIG. 42). At time t3, the bit line BLO is pre-charged to 1.5V. At time t4, the selection gates SGS and SGD are set at the power-supply voltage VCC and the word liens WL1 to WL8 are set at 0V. If data has completely erased from the memory cells, the bit line BLO is set at 0V. If data has not completely erased from the memory cells, the bit line BLO remains at 1.5V. At time t5, the signal BLSHFO is set at 1.5V, turning on the transistor QNH4. The potential of the bit line BLO is transferred to the three-value sense amplifier/latch circuit 304. When the signal SBL2 rises to "H" level thereafter, the transistor QNL2 is turned on. Data is transferred to the node N2 and sensed by the second sense/latch circuit S/L2. Thus, the data read from the odd-numbered page is held in the second sense/latch circuit S/L2. While data is being read from the odd-numbered page, the bit line BLE is held at 0V, reducing the coupling noise between the bit lines.

In the present embodiment, the threshold voltage of each memory cell is distributed from –3V to 0V after data has been erased. A lower limit (i.e., –3V) is set for the threshold voltage for the purpose of turning off the memory cells connected to the selection gates SGS and SGD and biased to 0V, thereby to prevent erroneous programming of data.

Figure 49:
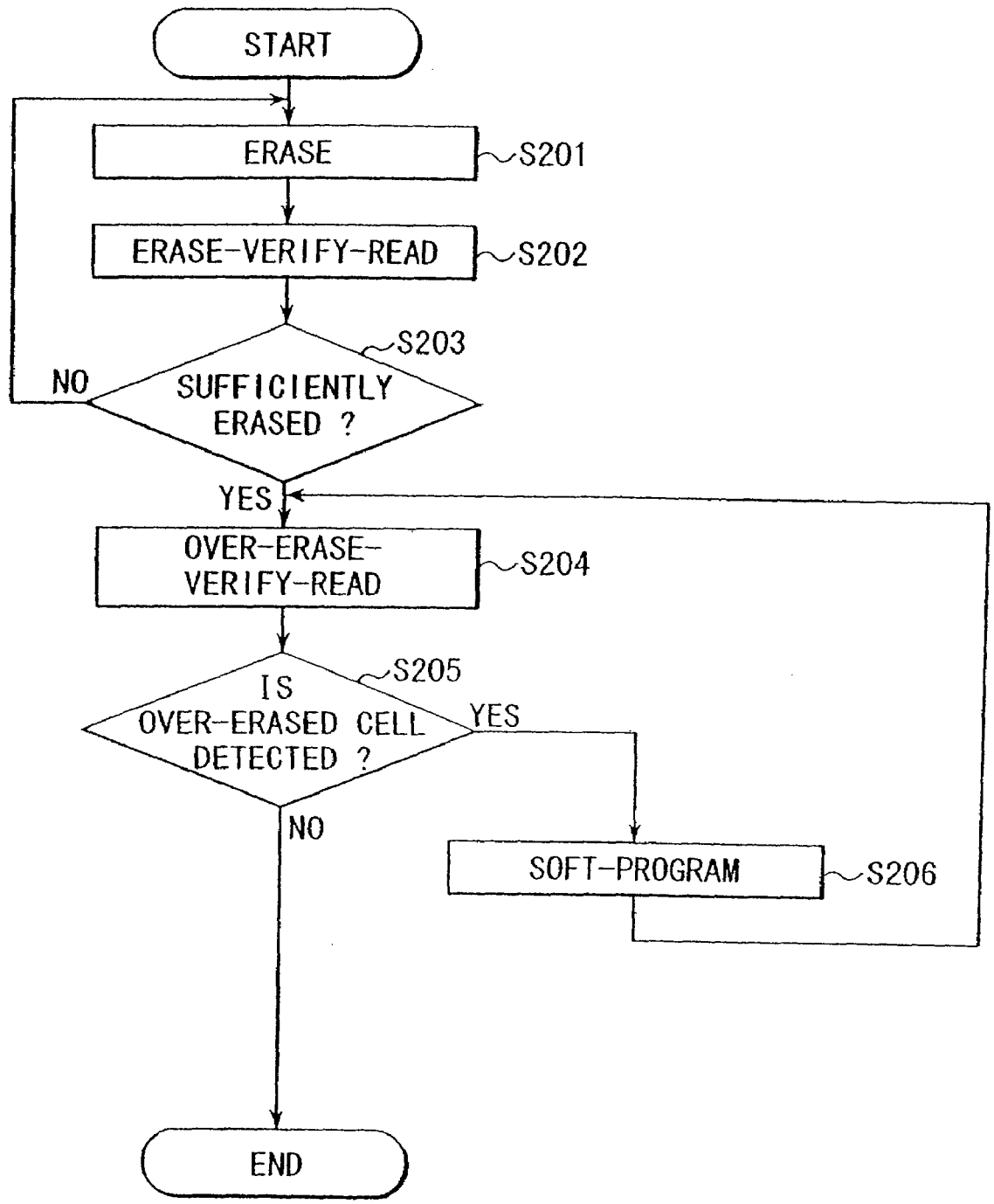
FIG. 49 is a flow chart explaining the erase operation in the sixth embodiment.

FIG. 49 is a flow chart explaining the erase-verification read operation in the present embodiment. As indicated above, data is completely erased from all memory cells of a selected block (Steps S201 to S203). Then, an over-erase-verification read operation is carried out (Step S204). Further, it is determined whether any memory cell has been over-erased, with its threshold voltage reduced to –3V or lower (Step 205). If YES in Step S205, soft-program operation is effected to make the threshold voltage raise to –3V or higher (Step 206).

The over-erase-verification read operation (Step S205) and the soft-program operation (Step S206) will be explained in detail.

<Over-Erase Verification Read Operation>

Figure 50:
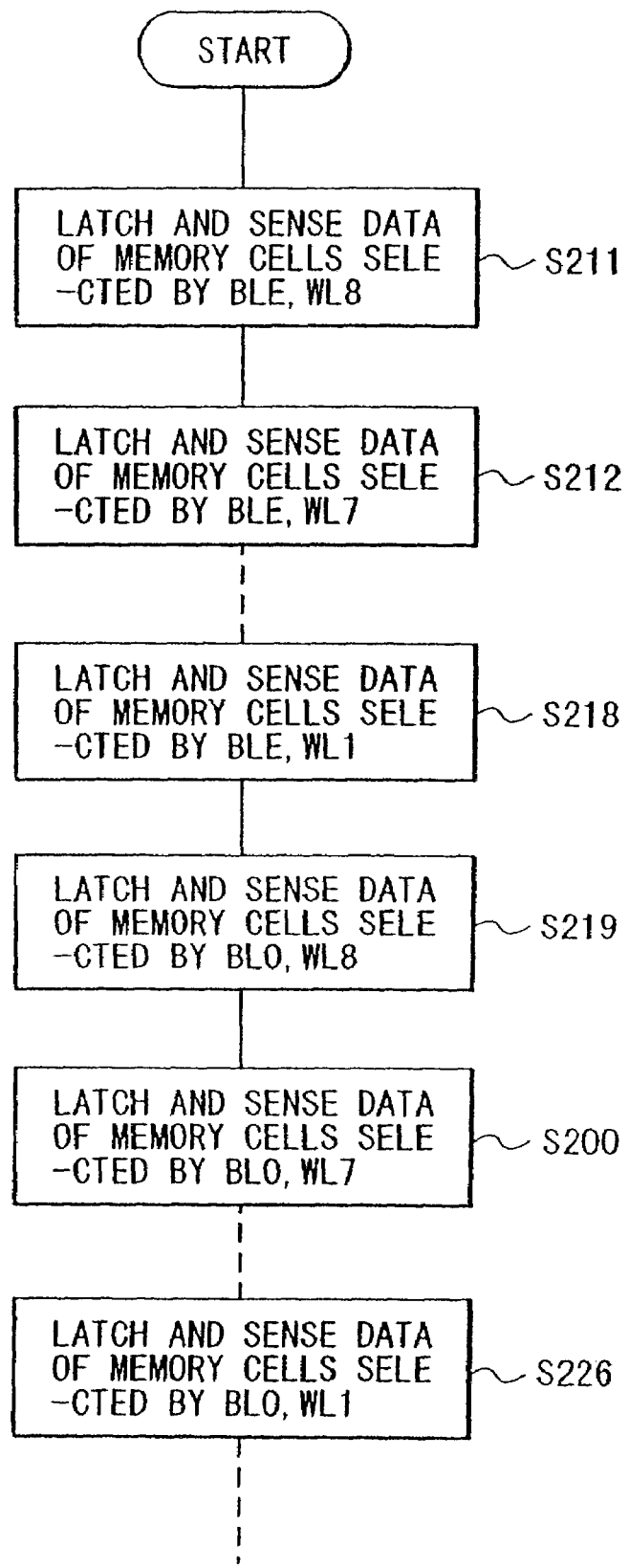
FIG. 50 is a flow chart explaining the over-erase-verification read operation in the sixth embodiment.

First, the sense amplifier/latch circuit 304 is connected to the bit line BLE, as is illustrated in FIG. 50. The over-erase-verification read operation is performed on the memory cells connected to the word line WL8 (Step S211), then the memory cells connected to the word line WL7 (Step S212), next the memory cells connected to the word line WL6, and so forth. Finally, the over-erase-verification read operation is performed on the memory cells connected to the word line WL1 (Step S218). The data read from these memory cells is latched by the first sense/latch circuit S/L1 and sensed. Further, the sense amplifier/latch circuit 304 is connected to the bit line BLO. The over-erase-verification read operation is performed on the memory cells connected to the word line WL8 (Step S219), then the memory cells connected to the word line WL7 (Step S220), next the memory cells connected to the word line WL6, and so forth. Finally, the over-erase-verification read operation is conducted on the memory cells connected to the word line WL1 (Step S226). The data read from these memory cells is latched by the second sense/latch circuit S/L2 and is sensed.

Figure 51:
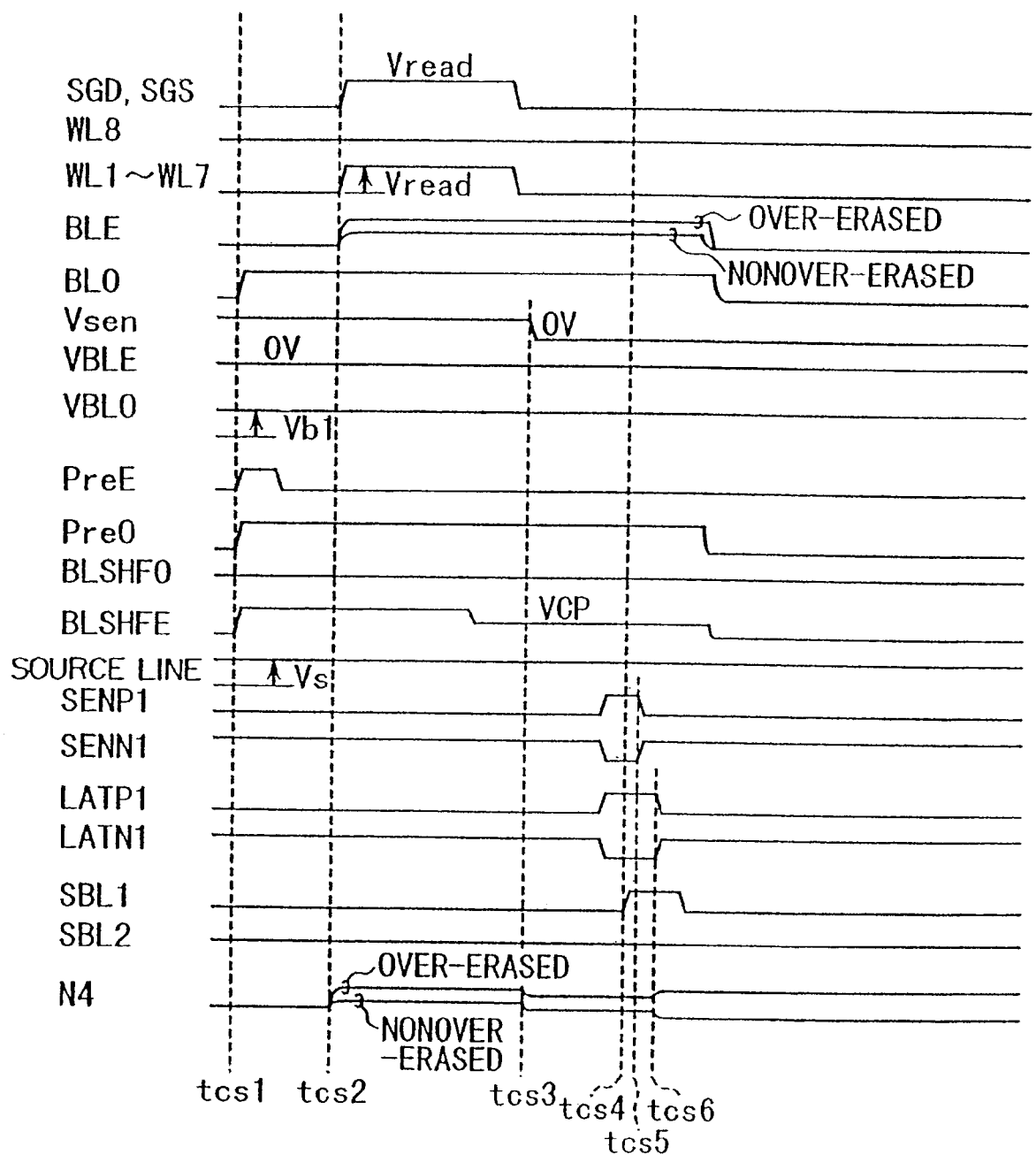
FIG. 51 is a timing chart explaining the over-erase-verification read operation in the sixth embodiment.

It will be described how the over-erase-verification read operation is carried out on the memory cell connected to the word line WL8 and to the bit line BLE, while the line BLE is connected to the sense amplifier/latch circuit 304, with reference to the flow chart of FIG. 51.

First, at time tcs1, the selected bit line BLE is set at 0V. The nonselected bit line BLO is kept at Vb1 (e.g., VCC) throughout the over-erase-verification read operation, removing the coupling noise between the bit lines. At time tcs2, the selected bit line WL8 is set at 0V, and the nonselected word lines WL1 to WL7 and the selection gates SGS and SGD are set at voltage Vread. The voltage Vread is, for example, 4.5V, but may be VCC. The source lines are set at voltage Vs (e.g., VCC).

Assume that the voltage Vs is VCC. When the voltage of the selection gates is raised, the potential of the bit line BLE is determined in accordance with the threshold voltage of the selected memory cell MC8. If the power-supply voltage VCC is 3V, the bit line BLE will be set at 3V if the selected memory cell MC8 has been over-erased, with its threshold voltage decreased to –3V or lower.

If the memory cell MC8 has a threshold voltage of, for example, –2.5V while its back-gate bias is –3V, the bit line BLE will be set at 2.5V. In this case, it suffices to set the signal BLSHFE at 5V in order to transfer the voltage of the bit line to the node N4. The voltage Vsen applied to the transistor QNH5 (i.e., capacitor) is, for example, VCC/3. The voltage Vsen may be fixed at a desired value, e.g., 0V or VCC, during the program operation and the erase operation.

Thereafter, at time tcs3, the voltage Vsen changes from VCC/3 (e.g., 1V) to 0V. The signal BLSHFE is at voltage Vcp, e.g., 2V. If the memory cell MC8 has been over-erased, the transistor QNH3 is off. The node N4 therefore assumes a floating state. The potential of the node N4 changes from 3V to 2V, because the transistor QNH5 functioning a capacitor includes a capacitance greater than the parasitic capacitance of the node N4.

If the memory cell MC8 has not been over-erased, the potential of the node N4 changes from 1.5V to 0.5V. The potential of the node N4 would not become lower than 0.5V since the signal BLSHFE is set at 2V.

At time tcs4, the signal SBL1 is set at "H" level. The potential of the node N4 is thereby applied to the node N1 through the transistor QNL1. The first sense/latch circuit S/L1 senses the potential of the node N4 at time tcs4 and latches the same at time tcs5. Whether any memory cell has been over-erased may be determined by reading the potentials of the nodes N1 and N3 to the I/O line or by using the transistor QNL7 provided for detecting the states of all memory cells connected to the bit line BLE. That is, whether any memory cell has been over-erased or not can be determined by detecting whether the transistor QNL7 is turned on or off. The transistor QNL7 is connected in parallel to each column of memory cells. The wiring IDET1 is first pre-charged to the power-supply voltage VCC and then set into a floating state. If at least one memory cell of any column has been over-erased, the node N1 of this column is set at "H" level. In this case, the wiring IDET1 is discharged to 0V, whereby at least one memory cell of that column has been over-erased can be detected.

Thereafter, the over-erase-verification read operation is performed on the memory cells connected to the bit line BLE and the word lines WL1 to WL8 (Steps S212 to S218 in FIG. 50). Further, the over-erase-verification read operation is performed on the memory cells connected to the bit line BLO and the word lines WL1 to WL8 (Steps S219 to S226 in FIG. 50).

It will be described how the over-erase-verification read operation is carried out on the memory cell connected to the word line WL8 and the bit line BLE, with reference to the flow chart of FIG. 50.

The data read through the bit line BLO is latched via the transistors QNH4 and QNL1 by the first sense/latch circuit S/L1. Except this operational point, the over-erase-verification read operation is effected on the selected memory cell, exactly in the same way as is illustrated in FIG. 51.

Figure 53:
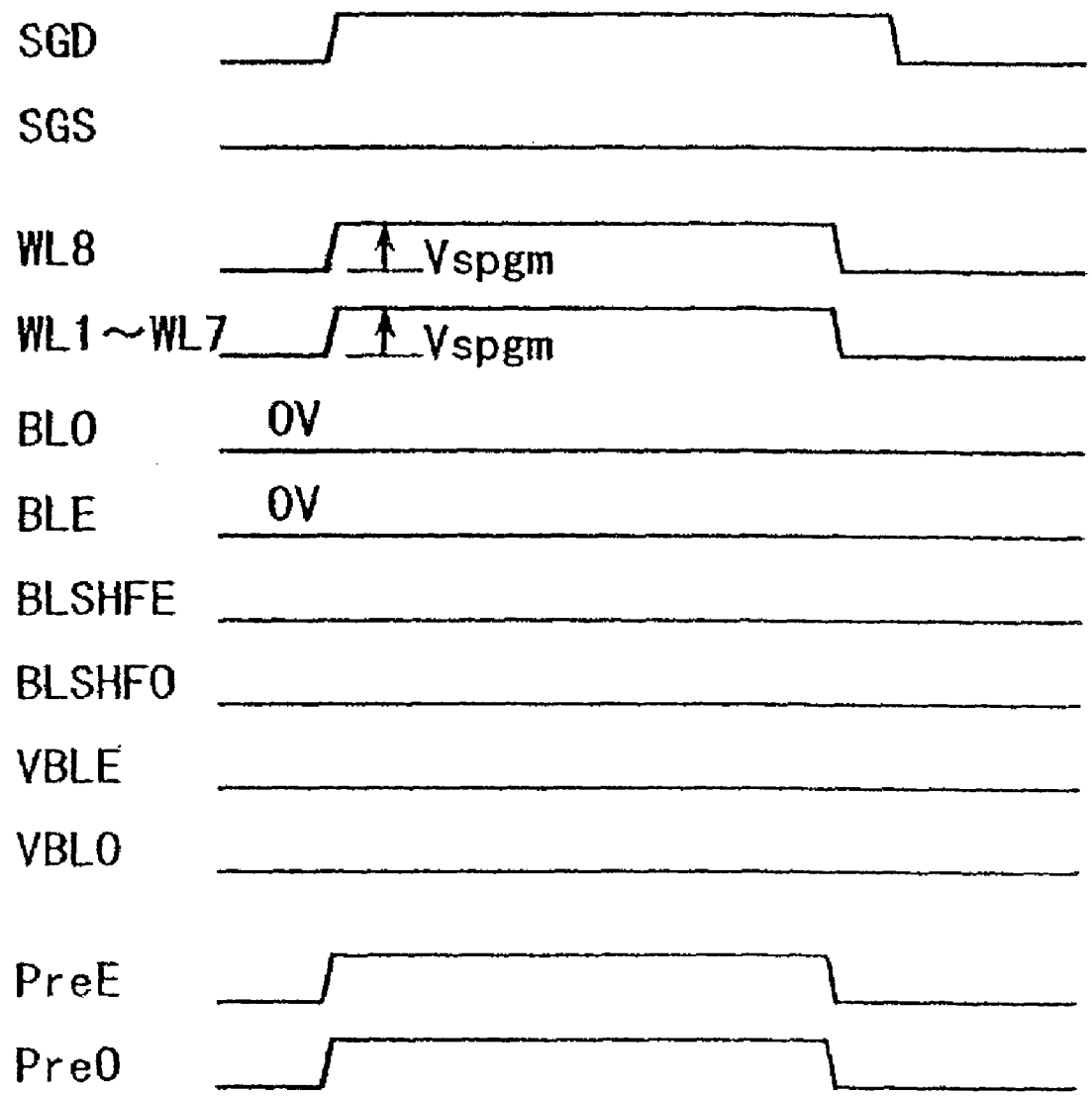
FIG. 53 is a timing chart explaining the soft-program operation in the sixth embodiment.

If any memory cell is found to have been over-erased, soft-program operation will be performed on the memory cell, as will be explained with reference to the timing chart of FIG. 53.

To achieve soft-program operation, all bit lines are at first connected to the ground, or set at 0V. Then, the word lines WL1 to WL8 are set at soft-program voltage Vspgm of, for example, 6V. Being over-erased, the memory cell includes a relatively thin tunnel oxide film. Data can therefore be easily programmed into the memory cell. Namely, the threshold voltage of the memory cell over-erased changes from −5V to −2V. By contrast, data cannot be easily programmed into any memory cell not over-erased. The cell not over-erased maintains the threshold voltage it acquired when data was erased from it.

Figure 54:
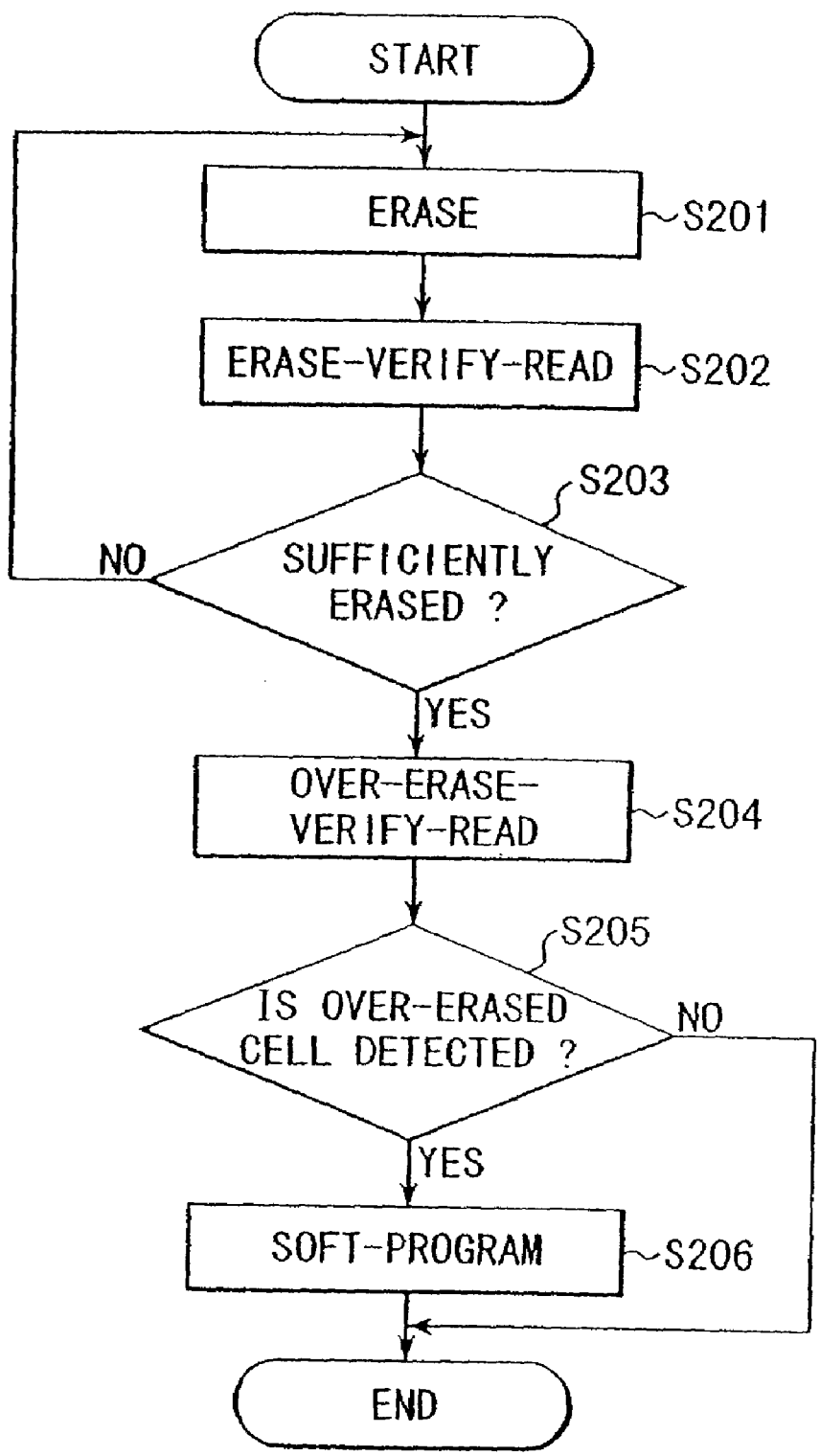
FIG. 54 is a flow chart explaining the erase operation in the sixth embodiment of the invention.

After the soft-program operation is performed, the over-erase-verification read operation may be effected again as is shown in FIG. 49 (Steps S204 and S205). The memory cell may have its threshold voltage adequately changed when subjected to a soft-program operation only once. If this is the case, the memory cell needs not be subjected to over-erase-verification read operation after the soft-program operation, as is illustrated in the flow chart of FIG. 54. The steps similar or identical to those shown in FIG. 49 are designated by the same reference numerals in FIG. 54 and will not be described.

In the sixth embodiment, the over-erase-verification read operation is effected on any memory cell after data has been erased from the memory cell, as has been described above. If the memory cell is found to have been over-erased, it is subjected to soft-program operation. The threshold voltage of the memory cell can therefore fall within a range of −3V to −1V. This prevents erroneous data-programming into the memory cell.

Seventh Embodiment

Figure 55:
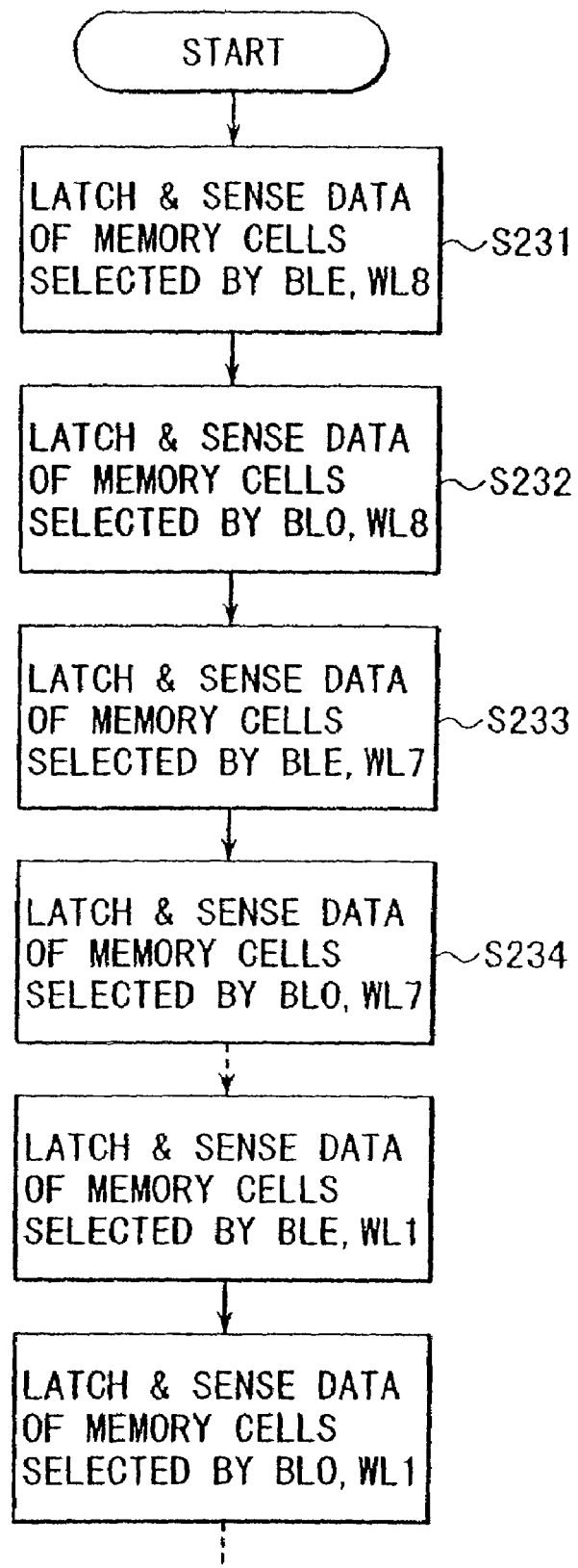
FIG. 55 is a flow chart explaining the over-erase-verification read operation in a seventh embodiment of the invention.

FIG. 55 is a flow chart explaining the over-erase-verification read operation in the seventh embodiment of the invention.

In the seventh embodiment, the bit line BLE is connected to the sense amplifier/latch circuit 304. Then, the erase-verification read operation is conducted on the selected memory cell, i.e., the memory cell connected to the bit line BLE and the word line WL8 (Step S231). Next, the bit line BLO is connected to the sense amplifier/latch circuit 304, and the erase-verification read operation (latch and sense operation) is conducted on the selected memory cell, i.e., the memory cell connected to the bit line BLE and the word line WL8 (Step S232). Thereafter, the erase-verification read operation is effected on the memory cell connected to the bit line BLE and the word line WL7 (Step S233), and on the memory cell connected to the bit line BLO and the word line WL7, and so forth. Thus, the over-erase-verification read operation is performed on all pages, by selecting the bit lines BLE and BLO alternatively and the word lines WL1 to WL8 sequentially.

Eighth Embodiment

Figure 56:
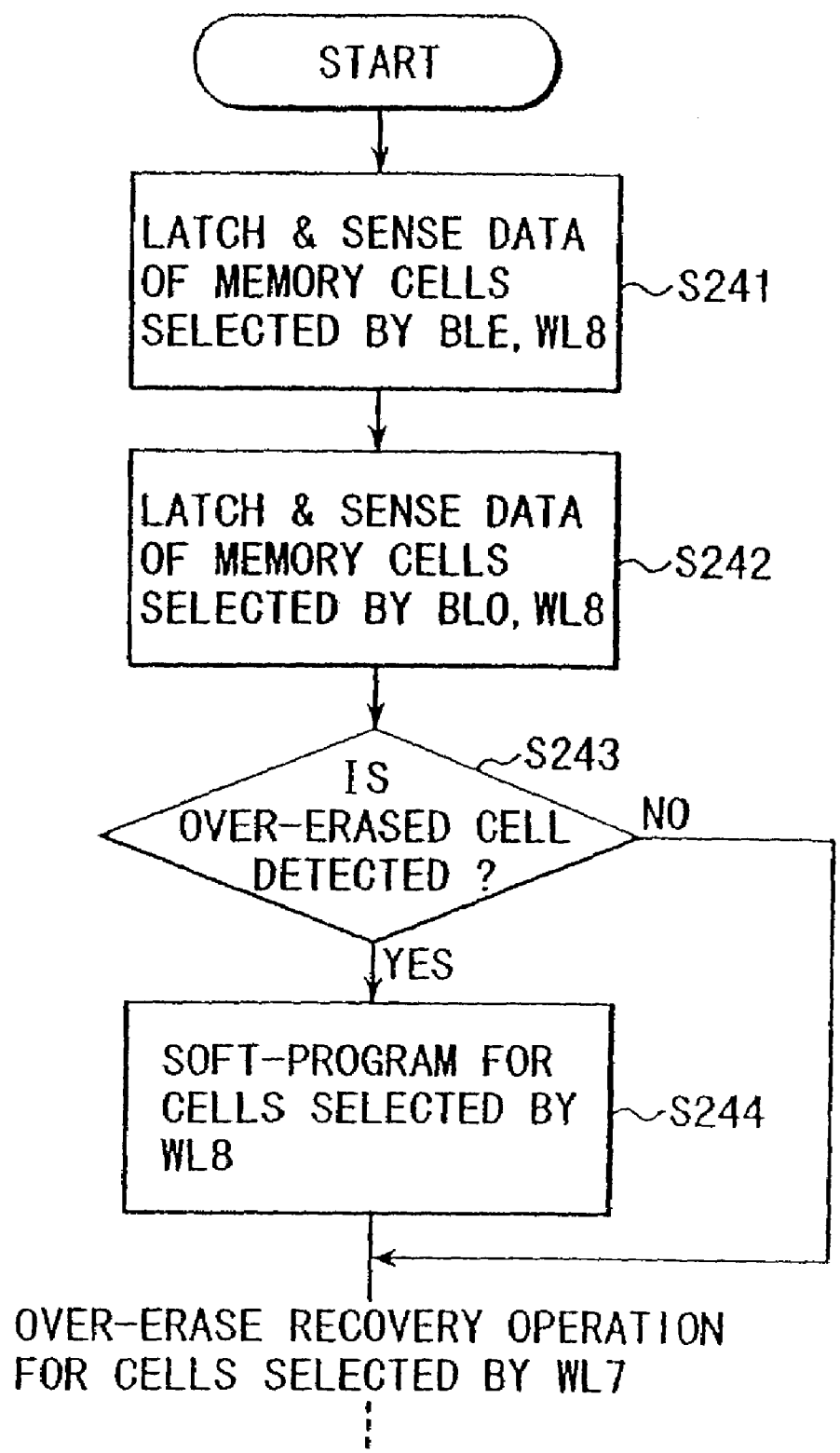
FIG. 56 is a flow chart explaining the over-erase-verification read operation and the soft-program operation, both in an eight embodiment of the invention.

FIG. 56 is a flow chart explaining the over-erase-verification read operation and the soft-program operation in the eight embodiment of the invention. These two operations correspond to Steps S204 to 206 (FIG. 49) in the sixth embodiment.

In the eighth embodiment, the over-erase-verification read operation and the soft-program operation are effected on each page. First, the over-erase-verification read operation is conducted on the memory cell connected to the bit line BLE and the word line WL8, and the data thereby read from the memory cell is latched by the first sense/latch circuit S/L1 and is sensed (Step S241). Then, the over-erase-verification read operation is conducted on the memory cell connected to the bit line BLO and the word line WL8, and the data thereby read from the memory cell is latched by the second sense/latch circuit S/L2 and is sensed (Step S242). From the data items thus latched by the sense/latch circuits S/L1 and S/L2 it is determined whether or not any memory cell has been over-erased (Step S243). If YES in Step S243, a soft-program operation is effected on the memory cells connected to the word line WL8 (Step S244). This soft-program operation is achieved by setting the word line WL8 at the soft-program voltage Vspgm and the other word lines WL1 to WL7 at either 0V or VCC.

Thereafter, the soft-program operation is performed on the memory cells connected to the word line WL7, on the memory cells connected to the word line WL6, and so forth. Finally, soft-program operation is effected on the memory cells connected to the word line WL1.

Figure 52:
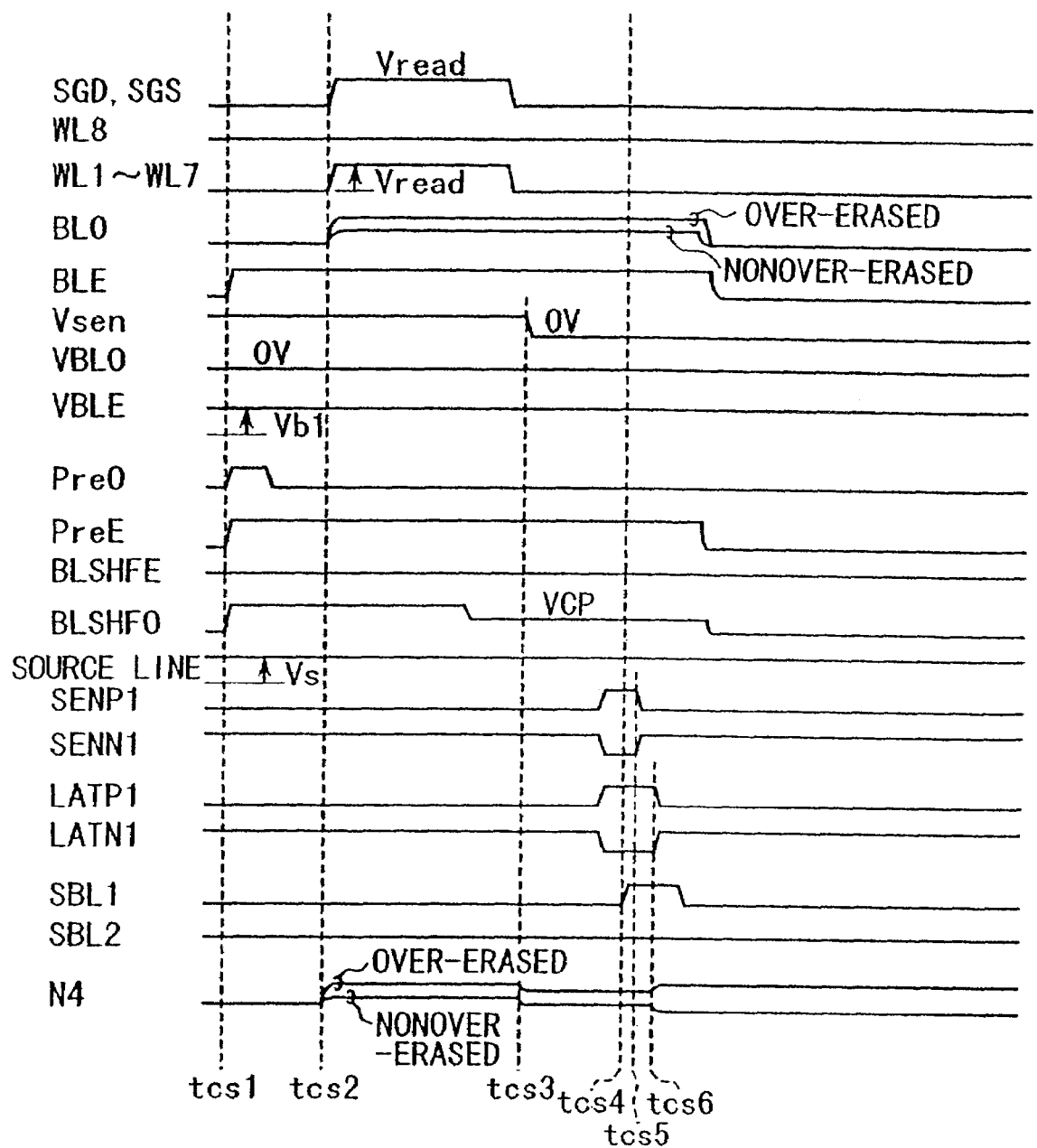
FIG. 52 is a timing chart explaining the over-erase-verification read operation in the sixth embodiment.

In the sixth embodiment, the signals SBL1, SENP1, SENN1, LATP1 and LATN1 are activated, as shown in FIG. 52, to latch the data read from a memory cell connected to the word line WL0 into the second sense/latch circuit S/L2. Instead, the signals SBL2, SENP2, SENN2, LATP2 and LATN2 may be activated for the same purpose. In this case, all memory cells over-erased can be detected at a time by using the transistors QNL7 and QNL8, while the data items remain latched by the first and second sense/latch circuits S/L1 and S/L2. In addition, the same signal may be supplied through the wirings IDET1 and IDET2 in the case where the data items in the sense/latch circuits S/L1 and S/L2 are detected at the same time.

Ninth Embodiment

Figure 57:
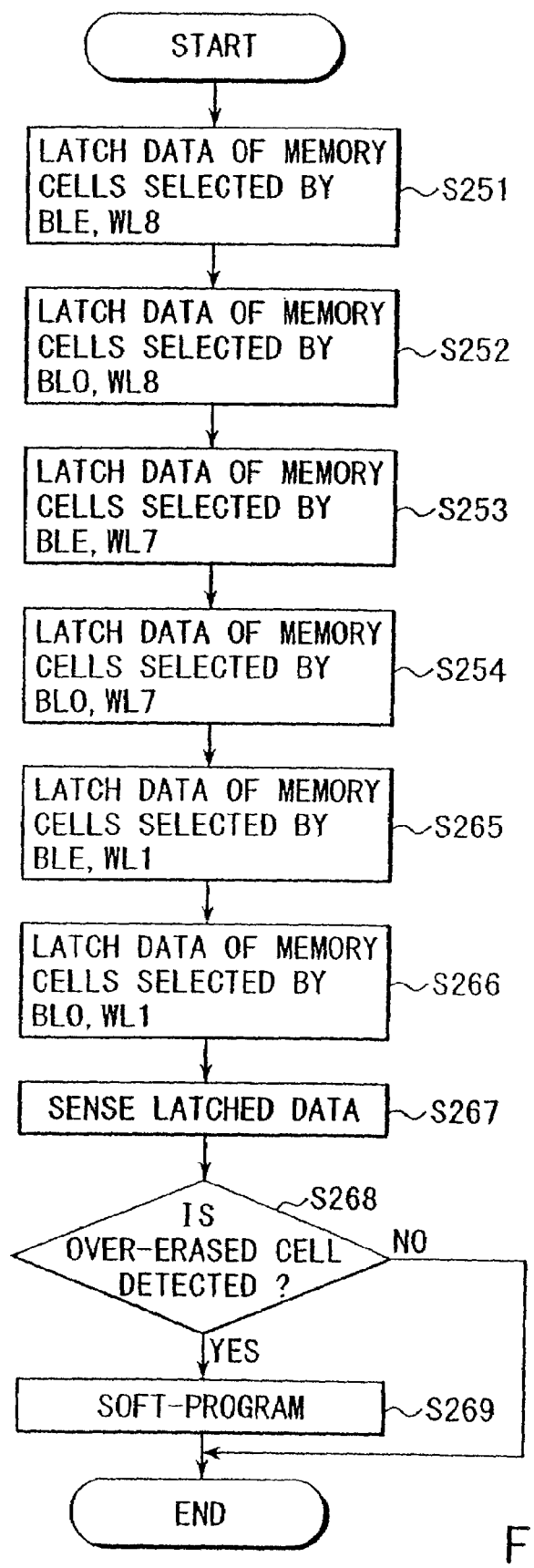
FIG. 57 is a flow chart explaining the over-erase-verification read operation and the soft-program operation, both in a ninth embodiment of the invention.

FIG. 57 is a flow chart explaining the over-erase-verification read operation and the soft-program operation in the ninth embodiment. FIG. 58 is a circuit diagram showing the column decoder 310, sense amplifier/latch circuit 304, pre-charge circuit 312, bit lines, and I/O lines, all incorporated in the ninth embodiment.

The structure of FIG. 58 is identical to the structure of FIG. 44, except for a few features. Only the components which are different from those illustrated in FIG. 44 will be described in detail. As shown in FIG. 58, NMOS transistors QN21 and QN22 are connected in series between a node N4 and a terminal applied with a voltage $V_{SE}$. The transistor QN21 has its gate connected to the gate of a PMOS transistor QP3. A signal nVRFY1 is supplied to the gate of the transistor QN22.

First, over-erase-verification read operation is performed on the memory cell connected to the bit line BLE and the word line WL8. The data read from this memory cell is latched by the first sense/latch circuit S/L1 (Step S251). The timing of the verification read operation and the data-latching operation are just the same as is shown in FIG. 51. If the memory cell has been over-erased, the potentials of nodes N1 and N3 are set at "H" level and "L" level, respectively. If the memory cell has not been over-erased, the potentials of nodes N1 and N3 are both set at "H."

Next, the over-erase-verification read operation is performed on the memory cell connected to the bit line BLO and the word line WL8. The data read from this memory cell is latched by the first sense/latch circuit S/L1 (Step S252).

Figure 59:
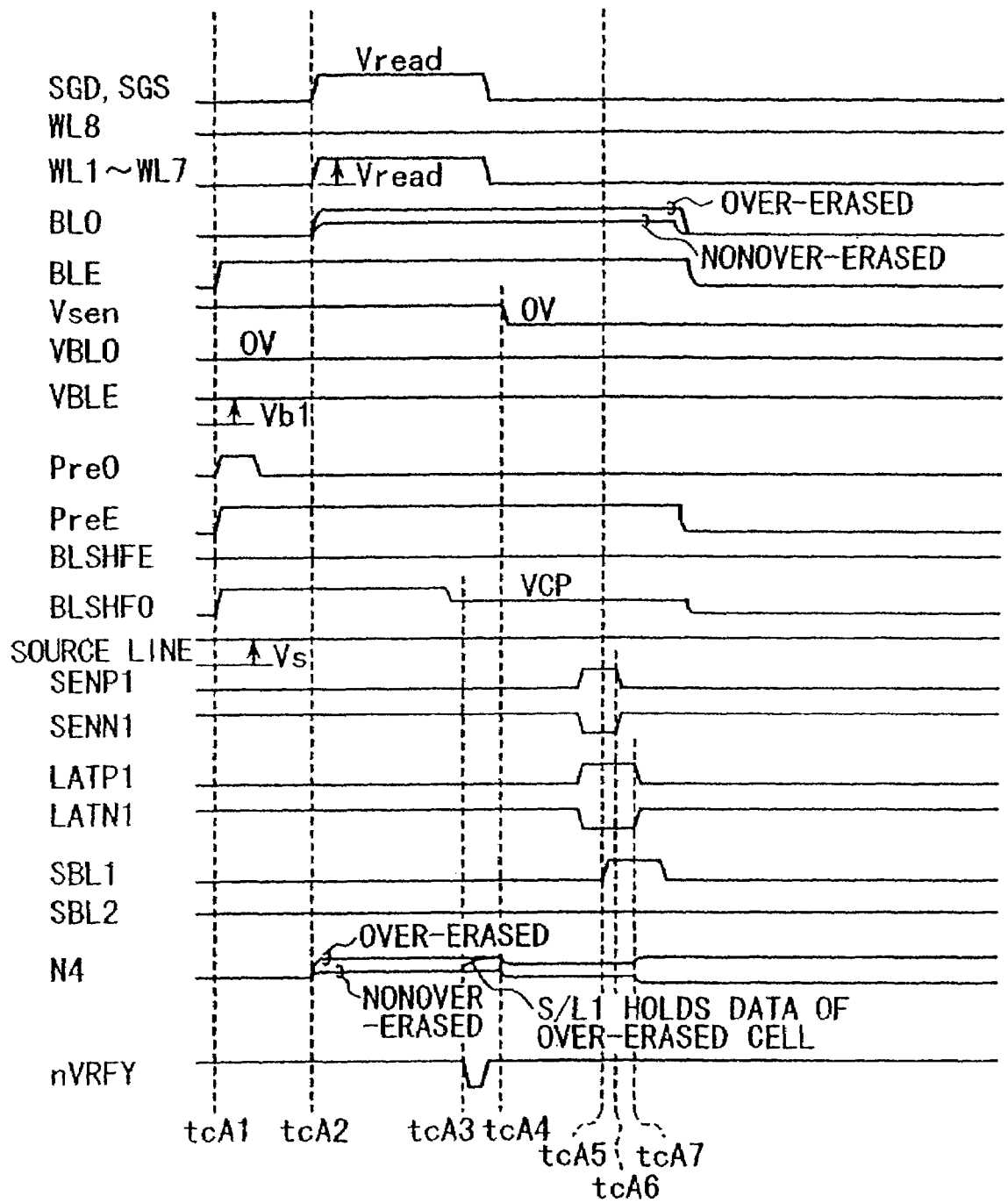
FIG. 59 is a timing chart explaining the over-erase-verification read operation for the selected memory cell by the bit line BL0 and the word line WL8 in the ninth embodiment.

FIG. 59 is a timing chart of the over-erase-verification read operation conducted on the memory cells connected to the bit lines BLE and BLO and the word line WL8. This verification read operation differs from the verification read operation illustrated in FIG. 52, in that the signal nVRFY is set at 0V at time tcA3, activating the transistor QP2. If the memory cell has been over-erased, which is connected to the bit line BLE and the word line WL8 and from which data has been read and latched by the first sense/latch circuit S/L1, the node N3 is at "L" level. The transistor QP3 is therefore turned on. As a result, the node N4 is charged to the power-supply voltage VCC even if the memory cell connected to the bit line BLO and the word line WL8 has not been over-erased.

On the other hand, if the memory cell has not been over-erased, which is connected to the bit line BLO and the word line WL8 and from which data has been read and latched by the first sense/latch circuit S/L1, the node N3 is at "H" level. The transistor QP3 therefore remains nonconductive, and the data is held at the node N4. At time tcA5, the transistor QNL1 is turned on. The potential of the node N4 is thereby latched by the first sense/latch circuit S/L1.

Thereafter, the over-erase-verification read operation is carried out on the memory cell connected to the bit line BLE and the word line WL7. The data read from this memory cell is latched by the first sense/latch circuit S/L1 (Step S253).

Figure 60:
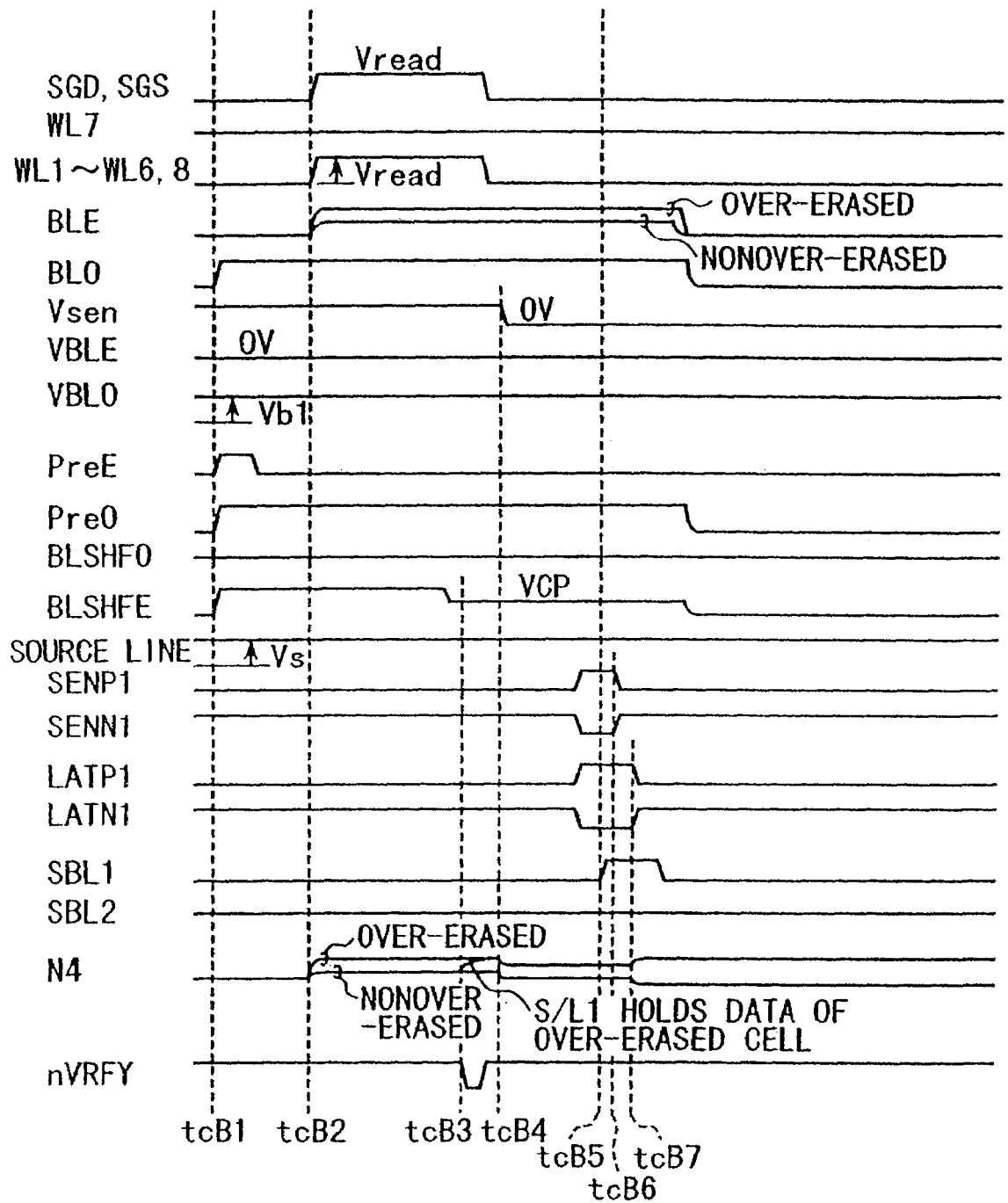
FIG. 60 is a timing chart explaining the over-erase-verification read operation for the selected memory cell by the bit line BLE and the word line WL7 in the ninth embodiment.

FIG. 60 is a timing chart explaining how over-erase-verification read operation is conducted on the memory cells connected to the word line BL8. This verification read operation differs from the verification read operation illustrated in FIG. 51, in that the signal nVRFY is set at 0V at time tcB3, activating the transistor QP2. As is shown in FIG. 59, the potential of the node N3 is at "L" level only if the memory cell from which the data latched by the first sense/latch circuit S/L1 has been read is in an over-erased state. Thus, the node N4 is charged to the power-supply voltage VCC. The potential of the node N4 is latched by the first sense/latch circuit S/L1 when the transistor QNL1 is turned on.

Then, the over-erase-verification read operation is performed on the memory cell connected to the bit line BLO and the word line WL7, on the memory cell connected to the bit line BLO and the word line WL6, and so forth. Finally, the over-erase-verification read operation is conducted on the memory cell connected to the bit line BLO and the word line WL1. The data items read from these memory cells are latched by the first sense/latch circuit S/L1 (Steps S254 to S266).

If at least one of the memory cells connected to the bit lines BLE or BLO and any one of the word lines WL1 to WL8 is found to have been over-erased, the node N1 of the first sense/latch circuit S/L1 will be set at "H" level.

Next, the data items latched by the first sense/latch circuit S/L1 are sensed by using the transistor QNL7 (step S267), thereby determining whether any memory cell has been over-erased by using the result of sensing (step S268). If YES, the soft-program operation is performed (Step S269).

Figure 61:
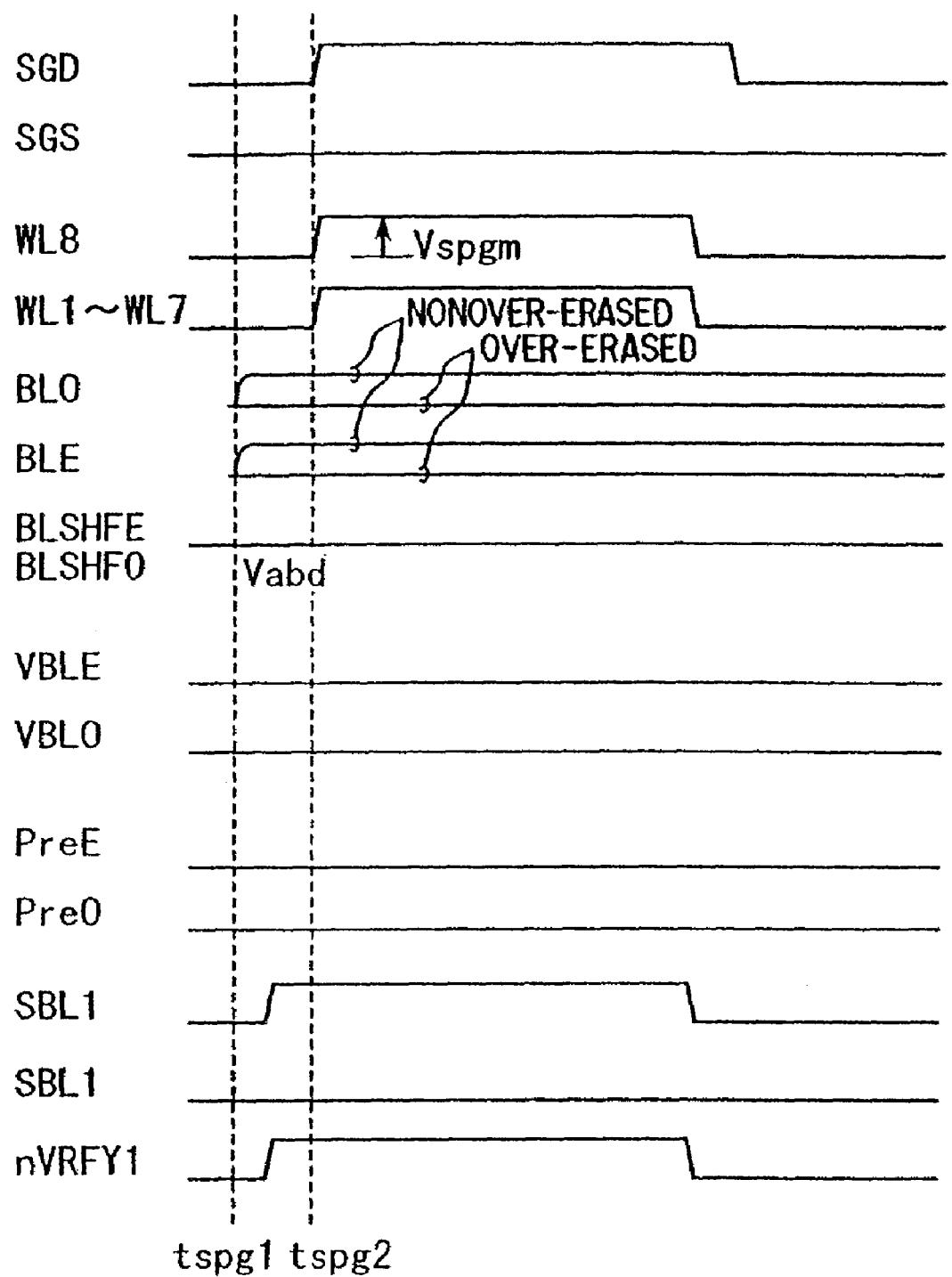
FIG. 61 is a timing chart explaining another mode of the soft-program operation in the ninth embodiment.

FIG. 61 is a timing chart explaining the soft-program operation described above with reference to FIG. 57. How the soft-program operation is carried out will be explained, with reference to FIG. 61.

At first, the potentials of the bit lines BLE and BLO are set at 0V. At time tspg1, the signal nVRFY1 is set at "H" level, and the bit lines BLE and BLO are set at a potential which depends on the data latched by the first sense/latch circuit S/L1. To be more specific, the potentials of the bit lines BLE and BLO remain at 0V if any memory cell has been over-erased. If no memory cell has been over-erased, the potentials of the bit lines BLE and BLO change from $V_{SE}$ to VCC or VCC-Vth, provided that voltage $V_{SE}$ is equal to or higher than VCC. Vth is the threshold voltage of the transistor connected between the bit lines and the source of $V_{SE}$.

At time tspg2, the potential of the word line is set at Vspgm (e.g., 8V). The threshold voltage of the over-erased memory cell is set at, for example, about −2V, since the potential of the channel is 0V and the potential of the control gate is Vspgm. If no memory cell has been over-erased, all memory cells have a channel potential of VCC. In this case, the voltage applied on the tunnel oxide film of each memory cell decreases, and no data is programmed into each memory cell.

With the ninth embodiment it is possible to perform the over-erase-verification read operation on the 16 memory cells connected to two adjacent bit lines BLE and BLO. The data items thereby read from the memory cells are latched by the first sense/latch circuit S/L1. Thereafter, it is determined only once whether any memory cell has been over-erased or not. Hence, over-erased memory cells, if any, can be detected at high speed.

In the first over-erase-verification read operation (Step S251) shown in FIG. 57, the signal nVRFY may be set at "L" level at time tcB3, thereby to activate the transistor QP2, as is illustrated in FIG. 60. In this case, however, the nodes N1 and N3 in the first sense/latch circuit S/L1 must be set at "L" level and "H" level, respectively, so as to prevent destruction of the data read to the node N4.

In the sixth to ninth embodiments described above, the lowest threshold voltage of any memory cell that can be measured is −Vs, even in view of the back-gate bias effect. Vs is a source line voltage during the first over-erase-verification read. If Vs is 3.3V, the bit line to which the memory cell is connected will have a potential of 3.3V, provided the memory cell has a threshold voltage of −3.3V or lower. Thus, if the voltage Vs is, for example, 6V which is higher than the power-supply voltage VCC, it is possible to have a threshold voltage greater than the power-supply voltage in terms of absolute value. In this case, it is desirable that two adjacent memory cells connected in series to the selected memory cell should have a gate voltage Vread of, for example, 7V. With this measure taken, a voltage of, for example, 6V can be applied to the source of the memory cell, without being lowered by the threshold voltage of the memory cell.

The potential Vs of the source lines may be set at the power-supply voltage VCC, and the power-supply voltage VCC is relatively high. Then, the threshold voltage of each memory cell can be detected even if it is relatively low. For instance, a low threshold voltage can be detected if the power-supply voltage has been set at a great value during the chip testing.

Tenth Embodiment

Figure 62:
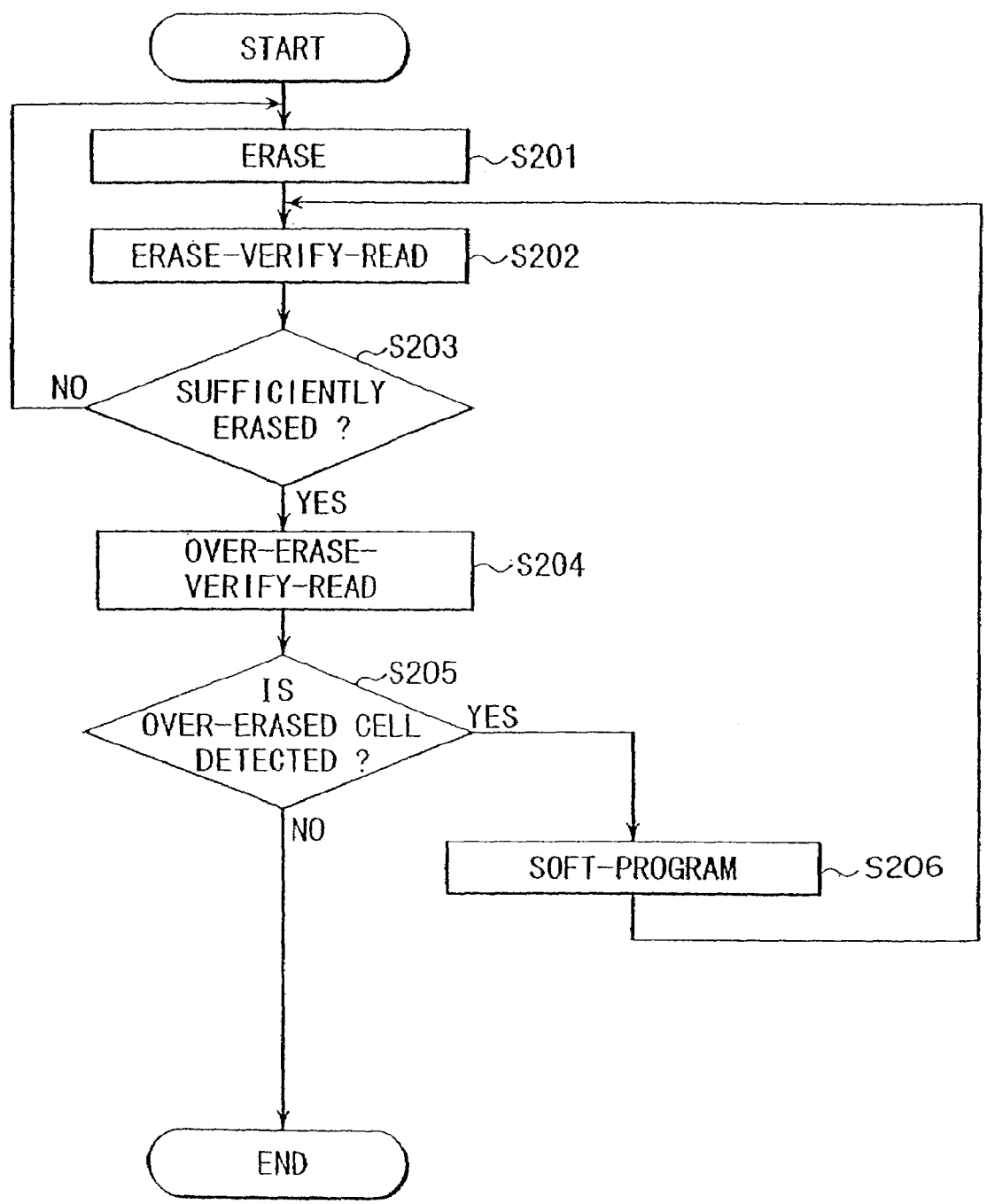
FIG. 62 is a flow chart explaining the erase operation in a tenth embodiment of the invention.

In the sixth to ninth embodiments, it is not determined how much the memory cell have been soft-programmed (that is, whether the cells have been over-programmed or not). In fact, some of the memory cells may be over-programmed by the soft-program operation. Hence, it is necessary to determine whether the cells have been over-programmed or not, after the soft-program operation has been effected on the memory cells. The tenth embodiment, wherein whether the memory cells have been over-programmed or not is determined after the soft-program operation, will be described with reference to the flow chart of FIG. 62. FIG. 62 is similar to the flow chart of FIG. 49. The steps identical to those shown in FIG. 49 are designated by the same reference numerals and will not be described in detail.

As shown in FIG. 62, the soft-program operation is performed on memory cells which are determined as over-erased cells by over-erase-verification read operation (steps S204 to S206). The erase verification read operation is effected to determine whether the threshold voltage has risen too much due to the soft-program operation (steps S202 to S203). If YES in step S203, the operation returns to Step S201. In Step S201, data is again erased from the memory cell. If NO in Step S203, the memory cell is subjected to the over-erase-verification read operation in Step S204.

In the tenth embodiment (FIG. 62), the threshold voltage of any memory cell from which data has been erased can be set between desirable upper and lower limits.

Eleventh Embodiment

In the sixth to ninth embodiments, the voltage Vsen is changed after the potential of the bit line is applied to the node N4, thereby changing the potential of the node N4. The potential of the bit line is 2.5V or higher if the threshold voltage of the selected memory cell is, for example, −2.5V or lower. If the threshold voltage of the memory cell is −2.5V or lower, the potential of the node N4 will be 1.5V or higher when the voltage Vsen is changed from 1V to 0V at time tcs2 (FIG. 51). In this case, the potential of the node N1 is set at "H" level when the data read from the memory cell is sensed. The value by which the voltage Vsen is changed at time tcs2 may be altered, thereby to change that threshold voltage of the memory cell which is sensed by the sense amplifier/latch circuit. For example, the voltage Vsen may be changed from 0.5V to 0V. In this case, the potential of the node N4 will be 1.5V or higher and the potential of the node N1 will be at "H" level at the time the data read from the cell is sensed, if the selected memory cell has a threshold voltage of −2V or lower. Alternatively, the voltage Vsen may not be changed at time tsc2. In this case, the potential of the node N4 will be 1.5V or higher and potential of the node N1 will be at "H" level at the time the data read from the cell is detected, if the selected memory cell has a threshold voltage of −1.5V or lower.

In the eleventh embodiment, the voltage Vsen is changed internally or externally. Thus, a negative threshold voltage of any memory cell can be measured.

Twelfth Embodiment

In the sixth to ninth embodiments, the voltage Vsen is changed after the potential of the bit line is applied to the node N4, thereby changing the potential of the node N4. Nonetheless, the potential of the node N4 can be read without changing the voltage Vsen. How this can be accomplished will be explained, with reference to FIG. 63.

Figure 63:
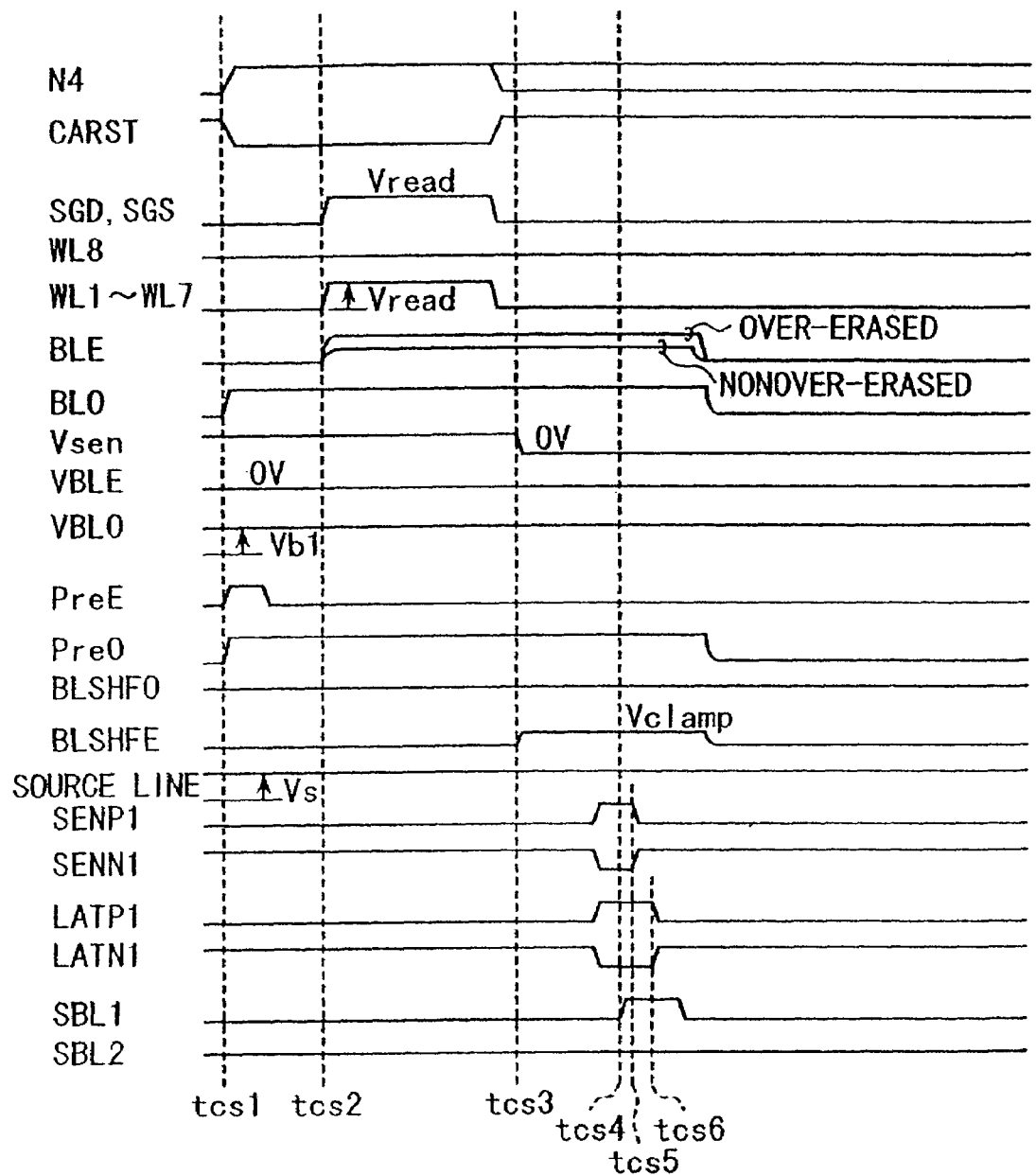
FIG. 63 is a timing chart explaining the over-erase-verification read operation in a twelfth embodiment of the invention.

FIG. 63 is a timing chart explaining how over-erase-verification read operation is performed on the memory cell MC4 connected to the bit line BLE and the word line WL8, both shown in FIG. 42. It should be noted that the sense amplifier/latch circuit used in the twelfth embodiment is of the same type illustrated in FIG. 44.

First, at time tcs1, the selected bit line BLE is set at 0V. During the over-erase-verification read operation, the non-selected bit line BLO is held at voltage Vb1 (e.g., VCC), thereby removing the coupling noise between the bit lines. At time tcs2, the selected word line WL8 is set at 0V, whereas the nonselected word lines WL7 to WL1 and the selection gates SGS and SGD are set at the read voltage Vread. The voltage Vread is not limited to the power-supply voltage VCC; it may be 4.5V or VCC. Alternatively, the voltage Vread may be as low as 2V, in which case a sufficiently large read current can be obtained since the memory cell MC4 includes a negative threshold voltage. The source lines are set at Voltage Vs (e.g., VCC).

Assume that the voltage Vs is VCC. When the voltages of the selection gates SGS and SGD are raised, the bit line BLE is set at a potential which depends on the threshold voltage of the selected memory cell MC4. To state it more precisely, the bit line BLE is set at 1.5V if the power-supply voltage VCC is 3V and if the cell MC has a threshold voltage of −1.5V because its back bias is −3V. The read voltage Vread is set at 0V. From time tcs1 to time tcs3, signal CAPRST remains at "L" level and the node N4 remains pre-charged to VCC.

At time tcs3, the signal CAPRST is set at "H" level, setting the node N4 at VCC, or into a floating state. Signal BLSHFE is set at Vclamp (e.g., 2V). If the memory cell MC has been over-erased, the potential of the bit line BLE is higher than 1V. Therefore, the transistor QNH3 is therefore turned off, and the node N4 remains at VCC.

If the memory cell MC has not been over-erased, the transistor QNH3 is turned on, and the node N4 is set to, for example, 1V from VCC. The gate of the transistor QNH3 is thereby clamped, lowering the potential of the node N4 to VCC or 1V or lower. Hence, the node N4 can have a large potential amplitude when the data read from the memory cell MC4 is detected.

At time tcs4, the potential of the node N4 is applied to the node N1. The potential of the node N1 is detected at time tcs5 and then latched at time tcs6. Whether any memory cell has been over-erased or not is determined on the basis of the potentials of the nodes N1 and N3 that have been applied to the I/O lines. Alternatively, the transistors QNL7 provided for the columns of memory cells, respectively, may be used to determine whether any memory cell has been over-erased or not. To achieve this, the transistors QNL7 are connected in parallel to one another. To determine whether any memory cell has been over-erased or not, the wiring IDET is pre-charged to, for example, VDD and is thereby set into a floating state. If any memory cell is over-erased thereafter, the node N1 is set at "H" level. The wiring IDET is therefore discharged to 0V. It is, therefore, determined that the memory cell has been over-erased.

As described above, in the sixth to twelfth embodiments, data is erased from the selected memory cell, whether or not the memory cell has been over-erased is then determined, and the soft-program operation can be performed on the memory cell if the cell is found to have been over-erased. The threshold voltage of the memory cell can therefore be controlled not to fall below a predetermined value after data has been erased from the memory cell. This prevents erroneous data-programming into the memory cell.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents. For example, the present invention is not limited to NAND-type EEPROMs. Rather, it can be applied also to various memory cell arrays such as NOR type, AND type (see A. Nozoe, ISSCC, Digest of Technical Papers, 1996), DINOR type (see S. Kobayashi, ISSCC, Digest of Technical Papers, 1995), Virtual Ground Array type (see Lee, et al., Symposium on VLSI Circuits, Digest of Technical Papers, 1994).

Moreover, the present invention can be applied not only to flash memories, but also to mask ROMs, EPROMs and the like.

The multi-value storage described herein above is not limited to four-value or three-value storage. It may be 5-value storage, and the like.

In the sixth to twelfth embodiments, the sense node N4 is set at the power-supply voltage VCC when the threshold voltage of a selected memory cell is, for example, −1V or lower. The threshold voltage of the memory cell, which is sensed by the sense amplifier/latch circuit, can be altered by changing the potential of the selection gates. For example, if the potential of the word line WL8 is set at 0.5V (see FIG. 24), the potential of the node N4 is set at VCC when the threshold voltage of the memory cell is −0.5V or lower, and the potential of the node N1 is set at "H" level when the data read from the memory cell is detected. Namely, a negative threshold voltage of any memory cell can be measured by the voltage Vsen being changed by an internal or external means of the memory chip. Thus, a negative threshold voltage of any memory cell can be measured by changing the potential of the selected word line. Thus, a negative threshold voltage of any memory cell can be measured.

The sixth to twelfth embodiments uses a circuit to measure a negative threshold voltage of each memory cell, in order to determine whether the memory cell has been over-erased. The circuit according to the invention is useful in an endurance test of nonvolatile semiconductor memories, in which it is necessary to measure the negative threshold voltages of the memory cells.

Further, the sense/latch circuits described above are three-value sense amplifier/latch circuits. Nonetheless, sense amplifier/latch circuits other than three-value ones can be used in the present invention.

The invention claimed is:

1. A semiconductor memory device comprising:
a memory cell array including NAND type cells each of which includes memory cells connected in series;
an erasing circuit configured to erase data stored in at least one memory cell;
an over-erasure detecting circuit configured to detect whether the at least one memory cell is over-erased after the erasing circuit erases the data stored in the at least one memory cell;
a first signal line connected to first ends of the NAND type cells;
a second signal line connected to second ends of the NAND type cells; and
a read circuit configured to be connected to the first signal line and to read a threshold voltage of at least one memory cell,
wherein the read circuit comprises a first switch configured to connect the first signal line to a first node, a sense amplifier configured to sense a voltage of the first node, and a capacitor connected between the first node and a second node, and the read circuit transfers a voltage of the first signal line to the first node through the first switch, turns off the first switch, changes the voltage of the first node by changing the voltage of the second node, and senses the voltage of the first node by the sense amplifier.

2. A semiconductor memory device according to claim 1, wherein the over-erasure detecting circuit detects whether the at least one memory cell is over-erased based on the voltage of the first node after the read circuit changes the voltage of the first node, and further comprising
a soft-programming circuit configured to perform a soft-programming with respect to the at least one memory cell which is detected as being over-erased by the over-erasure detecting circuit.

3. A semiconductor memory device according to claim 1, further comprising a transistor including a gate connected to an output terminal of the sense amplifier and configured to output a signal when the sense amplifier detects an over-erased memory cell.

4. A semiconductor memory device according to claim 1, wherein the read circuit changes the voltage of the second node such that the sense amplifier is able to detect an erased state of the at least one memory cell based on the voltage of the first node after being changed.

5. A semiconductor memory device according to claim 4, wherein the read circuit sets the voltage of the second signal line at a voltage higher than the voltage of the first signal line during a read operation, and a voltage obtained by subtracting the threshold voltage of the at least one memory cell from the voltage of a word line appearing on the first signal line.

6. A semiconductor memory device comprising:
memory cell portions arranged in rows and columns;
first signal lines connected to first ends of memory cell portions arranged in each row;
second signal lines connected to second ends of memory cell portions arranged in each column;
a column decoder configured to select one of the first signal lines;
a row decoder configured to select one of the second signal lines; and
a read circuit configured to be connected between one end of at least one first signal line and the column decoder and to read a threshold voltage of a memory cell portion connected to the at least one first signal line and to the one of the second signal lines selected by the row decoder,
wherein the read circuit comprises a first switch configured to connect the one end of the at least one first signal line to a first node, a sense amplifier configured to sense a voltage of the first node, and a capacitor connected between the first node and a second node, and the read circuit transfers a voltage of the first signal line to the first node through the first switch, turns off the first switch, changes the voltage of the first node by changing the voltage of the second node, and senses the voltage of the first node by the sense amplifier.

7. A semiconductor memory device according to claim 6, wherein the read circuit sets the voltage of the second signal line at a voltage higher than the voltage of the first signal line during a read operation.

8. A semiconductor memory device according to claim 6, wherein each of the memory cell portions comprises memory cells connected in series.

9. A semiconductor memory device comprising:
memory cell portions arranged in rows and columns;
first signal lines connected to first ends of memory cell portions arranged in each row;

a column decoder configured to select one of the first signal lines;

a metal oxide semiconductor (MOS) transistor including a first end configured to be connected to one end of each of the first signal lines;

a detection node configured to be connected between a second end of the MOS transistor and the column decoder;

a capacitor connected between the detection node and a second signal line;

a sense amplifier configured to sense a voltage of the detection node; and third signal lines connected to second ends of memory cell portions arranged in each column, wherein the semiconductor memory device charges the one of the first signal lines selected by the column decoder through at least one memory cell portion by applying a reference voltage to any of the third signal lines, transfers a voltage of the one of the first signal lines to the detection node through the MOS transistor, changes the voltage of the second signal line, and senses the voltage of the detection node by the sense amplifier.

10. A semiconductor memory device according to claim 9, wherein each of the memory cell portions comprises memory cells connected in series.

* * * * *